United States Patent
Aizawa et al.

(10) Patent No.: US 8,124,304 B2
(45) Date of Patent: Feb. 28, 2012

(54) DYE-CONTAINING CURABLE COMPOSITION, COLOR FILTER AND METHOD FOR PRODUCING THE SAME

(75) Inventors: Taeko Aizawa, Kanagawa (JP); Katsumi Araki, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 1123 days.

(21) Appl. No.: 11/910,269

(22) PCT Filed: Mar. 31, 2006

(86) PCT No.: PCT/JP2006/306817
§ 371 (c)(1),
(2), (4) Date: Sep. 30, 2007

(87) PCT Pub. No.: WO2006/106911
PCT Pub. Date: Oct. 12, 2006

(65) Prior Publication Data
US 2009/0049624 A1    Feb. 26, 2009

(30) Foreign Application Priority Data
Mar. 31, 2005   (JP) .................................. 2005-105115

(51) Int. Cl.
*G03F 7/00* (2006.01)
*G02B 5/20* (2006.01)

(52) U.S. Cl. ........................................ 430/7; 430/270.1

(58) Field of Classification Search .................... None
See application file for complete search history.

(56) References Cited

U.S. PATENT DOCUMENTS

| | | | |
|---|---|---|---|
| 5,750,292 A | 5/1998 | Sato et al. | |
| 5,968,688 A | 10/1999 | Masuda et al. | |
| 2004/0009414 A1 | 1/2004 | Araki | |
| 2004/0121249 A1* | 6/2004 | Machiguchi et al. | 430/7 |
| 2004/0185372 A1* | 9/2004 | Takakuwa | 430/270.1 |
| 2005/0043452 A1 | 2/2005 | Araki | |
| 2005/0214679 A1* | 9/2005 | Yamada | 430/270.1 |
| 2005/0227169 A1* | 10/2005 | Suzuki et al. | 430/270.1 |

FOREIGN PATENT DOCUMENTS

| | | |
|---|---|---|
| EP | 1 348 739 A2 | 10/2003 |
| JP | 9-25360 A | 1/1997 |
| JP | 10-171118 A | 6/1998 |
| JP | 11-323260 A | 11/1999 |
| JP | 2000-239558 A | 9/2000 |
| JP | 2002-156747 A | 5/2002 |
| JP | 2002-196480 A | 7/2002 |
| JP | 2002-278056 A | 9/2002 |

OTHER PUBLICATIONS

EP Communication, dated Dec. 2, 2009, issued in corresponding EP Application No. 06730765.2, 13 pages.

* cited by examiner

*Primary Examiner* — John A. McPherson
(74) *Attorney, Agent, or Firm* — Sughrue Mion, PLLC

(57) ABSTRACT

The invention provides a dye-containing curable composition that has the property of high sensitivity, and that even when formed into a thin film at high dye concentration, excels in patternability, and is free from dye elution and ensures high productivity; and a color filter making use of the dye-containing curable composition and a method for producing the same.

The dye-containing curable composition contains an organic-solvent-soluble dye (A) and a curing agent (C), wherein a content of the organic-solvent-soluble dye (A) is 45% by mass or more based on a total solid content and a content of the curing agent (C) is 20% by mass to 55% by mass based on the total solid content.

10 Claims, No Drawings

DYE-CONTAINING CURABLE COMPOSITION, COLOR FILTER AND METHOD FOR PRODUCING THE SAME

TECHNICAL FIELD

The invention relates to a dye-containing curable composition for a color filter suitable for forming colored images constituting color filters used for liquid crystal display elements and solid state image pick-up elements (CCD, CMOS, etc.), as well as a color filter using the dye-containing curable composition, and a method for producing the color filter.

BACKGROUND ART

As methods for producing a color filter used for liquid crystal display elements and solid state image pick-up elements, a dyeing method, a printing method, an electrodepositing method, and a pigment dispersion method are known.

In the pigment dispersion method, the color filter is produced by a photolithographic method using a colored radiation-sensitive composition prepared by dispersing a pigment in any of various types of photosensitive compositions. The color filter produced by this method is stable with respect to light, heat, and the like since the pigment is used. A high positional accuracy can be obtained in this method since patterning is performed by the photolithographic method, and accordingly, this method has widely been used as a method suitable for producing a color filter for a large-screen and high fineness color display.

In a case in which the color filter is produced by the pigment dispersion method, the radiation-sensitive composition is first coated on a glass substrate by using, for example, a spin coater or a roll coater, and then dried, to thereby form a coating film. Then, colored pixels are obtained by pattern-exposing and developing the thus-formed coating film. The color filter can be obtained by repeating such operation as described above for the number of different colors.

As for the pigment dispersion method, a method which uses a negative curable composition comprising an alkali-soluble resin together with a photopolymerizable monomer and a photopolymerization initiator is proposed in each of, for example, Japanese Patent Application Laid-Open (JP-A) Nos. 02-199403, 04-76062, 05-273411, 06-184482 and 07-140654.

On the other hand, the color filter for the solid state image pick-up element has been required to be finer in recent years. However, it has been difficult to further improve the resolution of the color filter according to the conventional pigment dispersion system. This is because the pigment dispersion method is not suitable for an application requiring fine patterning such as the solid state image pick-up element because color unevenness occurs due to coarse pigment particles.

In order to solve the aforementioned problems, a technique using a dye that is capable of being dissolved in a solvent or water is proposed in JP-A No. 2002-278056. However, a problem arises in that a dye-containing curable composition is generally inferior to a pigment in various types of properties such as light fastness and heat resistance.

Further, particularly in a case in which the dye-containing curable composition is used in forming the color filter for the solid state image pick-up element, since a film that is as thin as 1.5 μm or less is required, it is necessary to use a large amount of dye for the curable composition, which causes other problems such as insufficient adhesion with the substrate due to reduced sensitivity, insufficient curing, and discoloring due to bleaching of the dye in an exposed portion, and as a result, it becomes extremely difficult to attain good pattern forming properties.

Due to the above-mentioned problems, it is difficult to satisfy the practical requirements with respect to fine and thin-film coloring patterns for high fineness color filters.

Therefore, there remains a need to develop a dye or a curable composition that can solve the above-mentioned problems.

Patent Document 1: JP-A No. 02-199403
Patent Document 2: JP-A No. 04-76062
Patent Document 3: JP-A No. 05-273411
Patent Document 4: JP-A No. 06-184482
Patent Document 5: JP-A No. 07-140654
Patent Document 6: JP-A No. 2002-278056

DISCLOSURE OF INVENTION

Problems to be Solved by the Invention

The invention has been devised in order to address problems in the existing art and provides a dye-containing curable composition that is suitable of using dyes. Specifically, the invention provides a dye-containing curable composition that has the property of high sensitivity, and that even when formed into a thin film at high dye concentration, excels in patternability, and is free from dye solving out and ensures high productivity; and a color filter making use of the dye-containing curable composition and a method for producing the same.

Means for Solving the Problems

The following description will explain the specific means used to solve the above-mentioned problems.

<1> A first aspect of the invention is a dye-containing curable composition comprising an organic-solvent-soluble dye (A) and a curing agent (C), wherein a content of the organic-solvent-soluble dye (A) is 45% by mass or more based on a total solid content and a content of the curing agent (C) is 20% by mass or more and 55% by mass or less based on the total solid content.

<2> A second aspect of the invention is the dye-containing curable composition according to <1>, wherein the content of the organic-solvent-soluble dye (A) is 50% by mass or more based on the total solid contents of the composition.

<3> A third aspect of the invention is the dye-containing curable composition according to <1>, wherein the content of the organic-solvent-soluble dye (A) is 55% by mass or more based on the total solid contents of the composition.

<4> A forth aspect of the invention is the dye-containing curable composition according to <1>, wherein the content of the organic-solvent-soluble dye (A) is 65% by mass or more based on the total solid contents of the composition.

<5> A fifth aspect of the invention is the dye-containing curable composition according to <1> to <4>, wherein the content of the curing agent (C) is more than 25 to 55% by mass or less based on the total solid contents of the composition.

<6> A sixth aspect of the invention is the dye-containing curable composition according to <1> to <4>, wherein the content of the curing agent (C) is more than 30 to 55% by mass or less based on the total solid contents of the composition.

<7> A seventh aspect of the invention is the dye-containing curable composition according to <1> to <6>, further comprising a binder (B) at a weight ratio (C)/(B) of the binder (B) and the curing agent (C) of more than 2.0.

<8> An eighth aspect of the invention is the dye-containing curable composition according to <1> to <6>, further comprising a binder (B) at a weight ratio (C)/(B) of the binder (B) and the curing agent (C) of more than 3.0.

<9> A ninth aspect of the invention is the dye-containing curable composition according to <1> to <6>, further comprising a binder (B) at a weight ratio (C)/(B) of the binder (B) and the curing agent (C) of more than 5.0.

<10> A tenth aspect of the invention is the dye-containing curable composition according to <1> to <9>, further comprising a photosensitive compound (D) at a weight ratio (D)/(C) of the curing agent (C) and the photosensitive compound (D) of 0.1 or more and less than 0.4.

<11> An eleventh aspect of the invention is the dye-containing curable composition according to <1> to <9>, further comprising a photosensitive compound (D) at a weight ratio (D)/(C) of the curing agent (C) and the photosensitive compound (D) of 0.15 or more and less than 0.4.

<12> A twelfth aspect of the invention is the dye-containing curable composition according to <1> to <9>, further comprising a photosensitive compound (D) at a weight ratio (D)/(C) of the curing agent (C) and the photosensitive compound (D) of 0.2 or more and less than 0.4.

<13> A thirteenth aspect of the invention is the dye-containing curable composition according to <1> to <12>, wherein the organic-solvent-soluble dye (A) contains one or more acid dyes.

<14> A fourteenth aspect of the invention is the dye-containing curable composition according to <1> to <13>, wherein the organic-solvent-soluble dye (A) is selected from triallylmethane series, anthraquinone series, azomethine series, azo series, benzylidene series, oxonol series, cyanine series, phenothiazine series, xanthene series, phthalocyanine series, benzopyran series, indigo series, methine series, azine series, oxazine sereis, thiazine series, and anthrapyridone series.

<15> A fifteenth aspect of the invention is the dye-containing curable composition according to <1> to <14>, wherein the organic-solvent-soluble dye (A) contains a dye represented by the following formula (I).

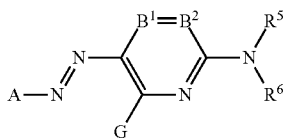

Formula (I)

wherein A is an aryl group or a residual group of 5- or 6-membered aromatic heterocyclic diazo component A-NH$_2$. B$^1$ and B$^2$ are each independently —CR$^1$=, —CR$^2$=, or a nitrogen atom, with a proviso that B$^1$ and B$^2$ are not the nitrogen atom at the same time. R$^5$ and R$^6$ are each independently a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group, or a sulfamoyl group, with a proviso that R$^5$ and R$^6$ are not the hydrogen atom at the same time. G, R$^1$, and R$^2$ are each independently a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclic oxy group, an alkoxycarbonyloxy group, an aryloxycarbonyloxy group, an alkyl group, a substituted amino group that is substituted with an aryl group or a heterocyclic group, an acylamino group, an ureide group, a sulfamoylamino group, an alkoxycarbonylamino group, an aryloxycarbonylamino group, an alkylsulfonylamino group, an arylsulfonylamino group, a nitro group, an alkylthio group, an arylthio group, an alkylsulfonyl group, an arylsulfonyl group, an alkylsulfinyl group, an arylsulfinyl group, a sulfamoyl group, a monoalkylsulfamoyl group, a monoarylsulfamoyl group, a sulfo group, a mercapto group, a heterocyclic thio group, or an amide group. R$^1$ and R$^5$, and/or R$^5$ and R$^6$ may be bonded to each other to form a 5- or 6-membered ring.

<16> A sixteenth aspect of the invention is the dye-containing curable composition according to <1> to <15>, wherein the organic-solvent-soluble dye (A) contains a dye represented by the following formula (II).

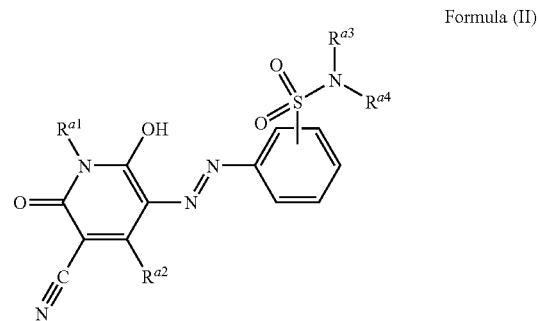

Formula (II)

wherein R$^{a1}$, R$^{a3}$, and R$^{a4}$ are each independently a substituent group having a hetero atom, a hydrogen atom, an alkyl group having 1 to 21 carbon atoms, an alkenyl group having 2 to 21 carbon atoms, an aryl group having 6 to 21 carbon atoms, or an aralkyl group having 7 to 21 carbon atoms. R$^{a3}$ and R$^{a4}$ may be formed into a heterocycle together with a jointly bonded nitrogen atom. R$^{a2}$ is an alkyl group having 1 to 10 carbon atoms, a methoxymethyl group, or a trifluoromethyl group.

<17> A seventeenth aspect of the invention is the dye-containing curable composition according to <1> to <16>, wherein the organic-solvent-soluble dye (A) contains a dye represented by the following formula (III).

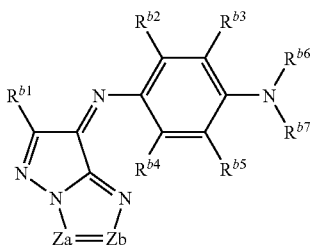

Formula (III)

wherein R$^{b1}$ is a hydrogen atom or a substituent group; R$^{b2}$ to R$^{b5}$ are each independently a hydrogen atom or a substituent group; R$^{b6}$ and R$^{b7}$ are each independently an alkyl group, an alkenyl group, an aryl group or a heterocyclic group; Za and Zb are each independently —N= or —C(R$^{b8}$)=; R$^{b8}$ is a hydrogen atom or a substituent group; and R$^{b2}$ and R$^{b3}$, R$^{b3}$ and $R^{b6}$, $R^{b4}$ and $R^{b5}$, $R^{b5}$ and $R^{b7}$, and/or $R^{b6}$ and $R^{b7}$ each may independently be bonded to each other to form a 5-, 6-, or 7-membered ring.

<18> An eighteenth aspect of the invention is the dye-containing curable composition according to <1> to <17>, wherein the organic-solvent-soluble dye (A) contains at least one dye selected from the group consisting of the dyes represented by the following formulae (I) to (III) and a phthalocyanine series dye.

<19> A nineteenth aspect of the invention is the dye-containing curable composition according to <1> to <18>, wherein the organic-solvent-soluble dye (A) contains the dye represented by the formula (I) and the dye represented by the formula (II).

<20> A twentieth aspect of the invention is the dye-containing curable composition according to <1> to <19>, wherein the organic-solvent-soluble dye has a color value of more than 55.

<21> A twenty-first aspect of the invention is the dye-containing curable composition according to <20>, wherein the organic-solvent-soluble dye (A) having the color value of more than 55 contains at least one dye selected from the group consisting of the dyes represented by the formulae (I) to (III).

<22> A twenty-second aspect of the invention is the dye-containing curable composition according to <1> to <19>, wherein the organic-solvent-soluble dye (A) has a color value of more than 60.

<23> A twenty-third aspect of the invention is the dye-containing curable composition according to <22>, wherein the organic-solvent-soluble dye having the color value of more than 60 contains at least one dye selected from the group consisting of the dyes represented by the formulae (I) to (III).

<24> A twenty-fourth aspect of the invention is the dye-containing curable composition according to <1> to <19>, wherein the organic-solvent-soluble dye (A) has a color value of more than 70.

<25> A twenty-fifth aspect of the invention is the dye-containing curable composition according to <24>, wherein the organic-solvent-soluble dye having the color value of more than 70 contains at least one dye selected from the group consisting of the dyes represented by the formulae (I) to (III).

<26> A twenty-sixth aspect of the invention is the dye-containing curable composition according to <1> to A <19>, wherein the organic-solvent-soluble dye (A) has a color value of more than 80.

<27> A twenty-seventh aspect of the invention is the dye-containing curable composition according to <26>, wherein the organic-solvent-soluble dye having the color value of more than 80 contains at least one dye selected from the group consisting of the dyes represented by the formulae (I) to (III).

<28> A twenty-eighth aspect of the invention is the dye-containing curable composition according to <1> to <27>, wherein a curing process is a negative type.

<29> A twenty-ninth aspect of the invention is the dye-containing curable composition according to <10> to <28>, wherein the photosensitive compound (D) is a photopolymerization initiator.

<30> A thirtieth aspect of the invention is the dye-containing curable composition according to <29>, wherein the photopolymerization initiator contains at least one compound selected from the group consisting of a trihalomethyltriazine compound, a benzyldimethylketal compound, a α-hydroxyketone compound, a α-aminoketone compound, a phosphin oxide compound, a metallocene compound, an oxime compound, a triarylimidazole dimer, a benzothiazole compound, a benzophenone compound, an acetophenone compound and a derivative thereof, a cyclopentadiene-benzene-iron complex and a salt thereof, a halomethyloxadiazole compound, and a 3-aryl-substituted cumarine compound.

<31> A thirty-first aspect of the invention is the dye-containing curable composition according to <29>, wherein the photopolymerization initiator contains at least one compound selected from the group consisting of the α-aminoketone compound, the phosphin oxide compound, the metallocene compound, the oxime compound, and the triarylimidazole dimer.

<32> A thirty-second aspect of the invention is the dye-containing curable composition according to <29>, wherein the photopolymerization initiator is the oxime compound.

<33> A thirty-third aspect of the invention is the dye-containing curable composition according to <7> to <32>, wherein the binder contains an alkali-soluble (meth)acrylic resin having a polymerizable side chain.

<34> A thirty-fourth aspect of the invention is the dye-containing curable composition according to <1> to <33>, wherein the curing agent (C) contains a tetra- or more-functional (meth)acrylic ester-based monomer.

<35> A thirty-fifth aspect of the invention is a method for producing a color filter, which includes applying the dye-containing curable composition according to <1> to <34> on a support, exposing the composition via a mask, and performing development to form a pattern.

The method for producing the color filter may further include a process of curing the pattern by using heating and/or exposing, and the process may be repeated several times. Additionally, the dye may be changed to form a plurality of color filters.

<36> A thirty-sixth aspect of the invention is a color filter that is produced by means of the method according to <35> using the dye-containing curable composition according to <1> to <34>.

<37> A thirty-seventh aspect of the invention is the color filter according to <36> aspect, wherein a film thickness is 1.2 μm or less.

<38> A thirty-eighth aspect of the invention is the color filter according to <36>, wherein a film thickness is 1.0 μm or less.

<39> A thirty-ninth aspect of the invention is the color filter according to the thirty-sixth aspect, wherein a film thickness is 0.8 μm or less.

Effects of the Invention

The invention provides a dye-containing curable composition that has the property of high sensitivity, and that even when formed into a thin film at high dye concentration, excels in patternability, and is free from dye solving out and ensures high productivity; a thin film color filter using the dye-containing curable composition and having excellent solvent resistance; and a method for producing the color filter having high cost performance by using a simple process.

BEST MODE FOR CARRYING OUT THE INVENTION

Hereinafter, a dye-containing curable composition, a color filter, and a method for producing the same according to the invention will be described in detail.

<<Dye-Containing Curable Composition>>

A dye-containing curable composition (hereinafter, sometimes referred to as "composition of the invention") containing an organic-solvent-soluble dye (A) and a curing agent (C) is characterized in that the content of organic-solvent-soluble dye (A) based on total solid content is 45% by mass or more and the content of curing agent (C) based on total solid content is in the range of 20 to 55% by mass.

The composition of the invention contains at least the organic-solvent-soluble dye (A) and the curing agent (C), and the contents of the organic-solvent-soluble dye (A) and the curing agent (C) based on the total solid content are set to be in the above-mentioned range. Thus, it is possible to form a thin film color filter that has excellent color concentration, sensitivity, patternability, and solvent resistance.

In the composition of the invention, since the content of dye is as high as 45% or more based on the total solid content, it is possible to reduce the film thickness of the color filter while excellent color concentration is maintained. Furthermore, in the composition of the invention, since the curing agent (C) has the high content range of 20 to 55% by mass in the solid component, even when the concentration of the dye is high, curability of the pattern portion is high, the remaining film ratio is improved, the developmenting ability of a portion other than the pattern portion is improved. Accordingly, it is possible to ensure acceptable patternability. In the composition of the invention, in terms of production process, since various types of performances do not deteriorate, the productivity is high. It is preferable that the composition of the invention further contain a binder (B), a photosensitive compound (D), and a solvent (E). The composition of the invention may further contain various types of additives if necessary.

<Organic Solvent-Soluble Dye (A)>

The organic solvent-soluble dye that is capable of being used in the invention is not particularly limited, so long as it is soluble in an organic solvent so that a conventionally known dye for color filter may be used. Specific examples of such organic solvent-soluble dyes include dyes as described in JP-A Nos. 64-90403, 64-91102, 01-94301 and 06-11614; Japanese Patent No. 2592207; U.S. Pat. Nos. 4,808,501, 5,667,920 and 5,059,500; and JP-A Nos. 05-333207, 06-35183, 06-51115 and 06-194828. Preferred examples of the organic solvent-soluble dye include, from the viewpoint of chemical structure, dyes of a triallylmethane series, an anthraquinone series, an azomethine series, an azo series, a benzylidene series, an oxonol series, a cyanine series, a phenothiazine series, a xanthene series, a phthalocyanine series, a benzopyran series, an indigo series, a methine series, an azine series, an oxazine sereis, a thiazine series, and an anthrapyridone series. In respects to a triallylmethane series, a xanthene series, a phthalocyanine series, a pyridone azo series, and a pyrazole azo series, dyes that are disclosed in JP-A Nos. 2002-14220, 2002-14221, 2002-14222, 2002-14223, and the like may be used.

Among them, it is preferable select the organic-solvent-soluble dye of the invention from the group consisting of the triallylmethane series, the azomethine series, the xanthene series, the phthalocyanine series, and the azo series. In particular, it is preferable to use the dyes represented by the following formulae (I), (II), and (III) as the organic-solvent-soluble dye.

wherein A is an aryl group or a residual group of 5- or 6-membered aromatic heterocyclic diazo component A-NH$_2$. B$^1$ and B$^2$ are each independently —CR$^1$=, —CR$^2$=, or a nitrogen atom, with a proviso that B$^1$ and B$^2$ are not the nitrogen atom at the same time. R$^5$ and R$^6$ are each independently a hydrogen atom, an aliphatic group, an aromatic group, heterocyclic group, an acyl group, an alkoxycarbonyl group, an aryloxycarbonyl group, a carbamoyl group, an alkylsulfonyl group, an arylsulfonyl group, or a sulfamoyl group, with a proviso that R$^5$ and R$^6$ are not the hydrogen atom at the same time. G, R$^1$, and R$^2$ are each independently a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclic oxy group, an alkoxycarbonyloxy group, an aryloxycarbonyloxy group, an alkyl group, a substituted amino group that is substituted with an aryl group or a heterocyclic group, an acylamino group, an ureide group, a sulfamoylamino group, an alkoxycarbonylamino group, an aryloxycarbonylamino group, an alkylsulfonylamino group, an arylsulfonylamino group, a nitro group, an alkylthio group, an arylthio group, an alkylsulfonyl group, an arylsulfonyl group, an alkylsulfinyl group, an arylsulfinyl group, a sulfamoyl group, a monoalkylsulfamoyl group, a monoarylsulfamoyl group, a sulfo group, a mercapto group, a heterocyclic thio group, or an amide group. R$^1$ and R$^5$, and/or R$^5$ and R$^6$ may be bonded to each other to form a 5- or 6-membered ring.

In the above formula (I), A is an aryl group or a residual group of 5- or 6-membered aromatic heterocyclic diazo component A-NH$_2$. The aryl group is preferably an aryl group having 6 to 20 carbon atoms, and more preferably an aryl group having 6 to 16 carbon atoms. Examples of the aryl group may include a phenyl group and a naphthyl group. In a case where the aryl group has a substituent group, the aryl group may have the same substituent group as G, R$^1$, and R$^2$ as described below.

Examples of the hetero atom of the 5- or 6-membered heterocycle that constitutes A of A-NH$_2$ may include N, O, and S. Preferable examples of the hetero atom include the 5-membered heterocycle containing nitrogen, and the heterocycle may be condensed with an aliphatic ring, an aromatic ring, or other heterocycles.

Preferable examples of the heterocycle of A may include a pyridine ring, a pyrimidine ring, a triazole ring, a pyrazole ring, an imidazole ring, a thiazole ring, an isothiazole ring, a thiadiazole ring, a benzothiazole ring, a benzoxazole ring, and a benzoisothiazole ring. Each of the heterocycles may further have a substituent group. Among them, preferable examples of the heterocycle include a pyrazole ring, an imidazole ring, an isothiazole ring, a thiadiazole ring, and a benzothiazole ring that are represented by the following formulae (a) to (g).

Formula (I)

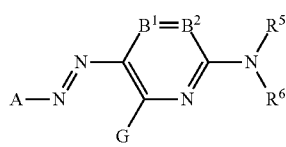

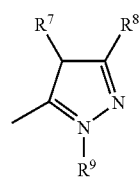

(a)

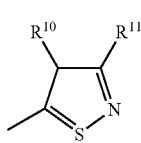
(b)

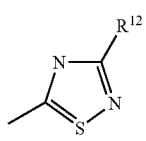
(c)

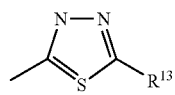
(d)

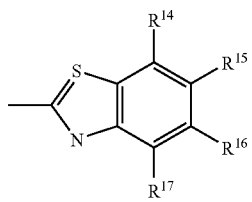
(e)

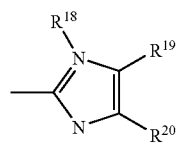
(f)

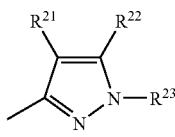
(g)

$R^7$ to $R^{23}$ of the above formulae (a) to (g) and preferable aspects thereof are the same as G, $R^1$, and $R^2$ as described below. Among the above formulae (a) to (g), it is preferable to use the pyrazole ring or the isothiazole ring represented by the formula (a) and the formula (g) or (b), and it is most preferable to use the pyrazole ring represented by the formula (a) or (g).

$B^1$ and $B^2$ are each independently —$CR^1$=, —$CR^2$=, or a nitrogen atom, with a proviso that $B^1$ and $B^2$ are not the nitrogen atom at the same time. That is, $B^1$ and $B^2$ are —$CR^1$= or —$CR^2$= at the same time, or any one of $B^1$ and $B^2$ is the nitrogen atom and another is —$CR^1$= or —$CR^2$=. In particular, it is more preferable that $B^1$ and $B^2$ are —$CR^1$= and —$CR^2$=, respectively.

$R^5$ and $R^6$ are each independently a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group, a sulfamoyl group, a monoalkylsulfamoyl group, or a monoarylsulfamoyl group, and each of the groups may further have a substituent group. Preferable examples of the groups represented by $R^5$ and $R^6$ may include a hydrogen atom, an aliphatic group, an aromatic group, a heterocyclic group, an acyl group, an alkylsulfonyl group, and an arylsulfonyl group. More preferable examples of the groups include a hydrogen atom, an aromatic group, a heterocyclic group, an acyl group, an alkyl or arylsulfonyl group. Most preferable examples of the groups include a hydrogen atom, an aryl group, and a heterocyclic group. According to a preferable aspect, each of the groups further has a substituent group. However, $R^5$ and $R^6$ are not the hydrogen atom at the same time.

G, $R^1$, and $R^2$ are each independently a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclic oxy group, an alkoxycarbonyloxy group, an aryloxycarbonyloxy group, "an alkyl group, a substituted amino group that is substituted with an aryl group or a heterocyclic group", an acylamino group, an ureide group, a sulfamoylamino group, an alkoxycarbonylamino group, an aryloxycarbonylamino group, an alkylsulfonylamino group, an arylsulfonylamino group, a nitro group, an alkylthio group, an arylthio group, an alkylsulfonyl group, an arylsulfonyl group, an alkylsulfinyl group, an arylsulfinyl group, a sulfamoyl group, a monoalkylsulfamoyl group, a monoarylsulfamoyl group, a sulfo group, a mercapto group, a heterocyclic thio group, or an amide group. Each of the groups may be additionally substituted.

Preferable examples of the group represented by G may include a hydrogen atom, a halogen atom, an aliphatic group, an aromatic group, a hydroxy group, an alkoxy group, an aryloxy group, an acyloxy group, a heterocyclicoxy group, "a substituted amino group that is substituted with an alkyl group, an aryl group, or a heterocyclic group", an acylamino group, a ureide group, a sulfamoylamino group, an alkoxycarbonylamino group, an aryloxycarbonylamino group, an alkyl and arylthio group, or a heterocyclic thio group. More preferable examples of the group include a hydrogen atom, a halogen atom, an alkyl group, a hydroxy group, an alkoxy group, an aryloxy group, an acyloxy group, "a substituted amino group that is substituted with an alkyl group, an aryl group, or a heterocyclic group", an acylamino group, and an amide group. Among them, most preferable examples of the group include a hydrogen atom, "a substituted amino group that is substituted with an alkyl group, an aryl group, or a heterocyclic group", and an amide group. Each of the groups may further have a substituent group.

Preferable examples of the groups represented by $R^1$ and $R^2$ may include a hydrogen atom, a halogen atom, an alkyl group, a cyano group, an alkoxycarbonyl group, a carboxyl group, a carbamoyl group, a hydroxy group, and an alkoxy group. Each of the groups may further have a substituent group. $R^1$ and $R^5$, and/or $R^5$ and $R^6$ may be bonded to each other to form a 5- or 6-membered ring.

In a case where each of the groups represented by A, $R^1$, $R^2$, $R^5$, $R^6$, and G further has a substituent group, the substituent group may be the same as those of G, $R^1$, and $R^2$.

In respects to a preferable combination of the substituent groups of the compound represented by the above formula (I), preferably, the compound has at least one preferable substituent group of the substituent groups. It is more preferable that the compound have several preferable substituent groups of the substituent groups, and it is most preferable that all of the substituent groups of the compound be the preferable substituent groups.

Hereinafter, the dye represented by the formula (II) will be described in detail.

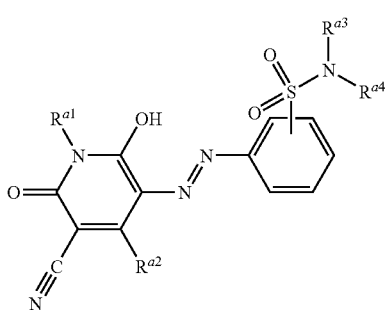

Formula (II)

wherein $R^{a1}$, $R^{a3}$, and $R^{a4}$ are each independently a substituent group having a hetero atom, a hydrogen atom, an alkyl group having 1 to 21 carbon atoms, an alkenyl group having 2 to 21 carbon atoms, an aryl group having 6 to 21 carbon atoms, or an aralkyl group having 7 to 21 carbon atoms. $R^{a3}$ and $R^{a4}$ may be formed into a heterocycle together with a jointly bonded nitrogen atom. $R^{a2}$ is an alkyl group having 1 to 10 carbon atoms, a methoxymethyl group, or a trifluoromethyl group.

In the above formula (II), the substituent group that is represented by $R^{a1}$ and has a hetero atom is not particularly limited as long as it is derived from an amine having a hetero atom, which can be used for synthesizing a pyridone ring. $R^{a1}$ may be unsubstituted or may have a substituent group. The substituent group that is represented by $R^{a1}$ and has a hetero atom, is preferably a substituent group having 3 to 50 atoms, more preferably a substituent group having 3 to 40 atoms, and further a substituent group having 3 to 30 atoms in view of a color value. The substituent group that is represented by $R^{a1}$ and has a hetero atom is particularly preferably a substituent group having a hetero atom of at least one selected from the group consisting of a nitrogen atom, a sulfur atom, and/or an oxygen atom, and has 3 to 30 atoms.

The substituent group that is represented by $R^{a1}$ can be introduced into the pyridone ring by a ring-closure reaction of an amide compound, which is obtained by a reaction of a cyanoacetic acid ester and a primary amine. Accordingly, examples of the substituent group that is represented by $R^{a1}$ and has a hetero atom include groups which are derived from primary amines containing hetero atoms which are described in "Aldrich Structure Index".

Specific examples of the substituent group include a 2-methoxyethyl group, a 3-methoxypropyl group, a 3-ethoxypropyl group, a 3-butoxypropyl group, a 2-methoxy-1-methyl-ethyl group, a tetrahydrofurfuryl group, a hydroxyethyl group, a hydroxypropyl group, a 4-hydroxybutyl group, a 2-hydroxy-1-methyl-ethyl group, a hydroxyethoxyethyl group, a 3-N-morpholinopropyl group, a 2-N-morpholinoethyl group, a 3-N-pyrrolidinonylpropyl group, a 2-dimethylaminoethyl group, a 3-dimethylaminopropyl group, a 3-diethylaminopropyl group, a 2-N-pyrrolidinylethyl group, a 2-(N-methyl-2-pyrrolidinyl)ethyl group, a 2-N-piperidinylethyl group, a 3-(2-methyl-N-piperidinyl)propyl group, a 3-isopropoxypropyl group.

Among these, preferable examples of the substituent group include a 3-methoxypropyl group, a 3-ethoxypropyl group, a 2-methoxy-1-methyl-ethyl group, a tetrahydrofurfuryl group, a hydroxyethyl group, a hydroxypropyl group, a 4-hydroxybutyl group, a 2-hydroxy-1-methyl-ethyl group, a hydroxyethoxyethyl group, a 3-N-morpholinopropyl group, a 2-N-morpholinoethyl group, a 3-N-pyrrolidinonylpropyl group, a 2-dimethylaminoethyl group, a 3-dimethylaminopropyl group, a 3-diethylaminopropyl group, a 2-N-pyrrolidinylethyl group, a 2-(N-methyl-2-pyrrolidinyl)ethyl group, a 2-N-piperidinylethyl group, a 3-(2-methyl-N-piperidinyl)propyl group, a 3-isopropoxypropyl group.

Among these, more preferable examples of the substituent group include a 3-methoxypropyl group, a 2-methoxy-1-methyl-ethyl group, a tetrahydrofurfuryl group, a hydroxyethyl group, a hydroxypropyl group, a 4-hydroxybutyl group, a hydroxyethoxyethyl group, a 3-N-morpholinopropyl group, a 2-N-morpholinoethyl group, a 3-N-pyrrolidinonylpropyl group, a 3-dimethylaminopropyl group, a 3-diethylaminopropyl group, a 2-(N-methyl-2-pyrrolidinyl)ethyl group, a 2-N-piperidinylethyl group, a 3-(2-methyl-N-piperidinyl)propyl group, a 3-isopropoxypropyl group.

Among these, particularly preferable examples of the substituent group include a 3-methoxypropyl group, a tetrahydrofurfuryl group, a hydroxypropyl group, a 4-hydroxybutyl group, a hydroxyethoxyethyl group, a 3-N-morpholinopropyl group, a 2-N-morpholinoethyl group, a 3-N-pyrrolidinonylpropyl group, a 3-dimethylaminopropyl group, a 2-(N-methyl-2-pyrrolidinyl)ethyl group, a 2-N-piperidinylethyl group, a 3-(2-methyl-N-piperidinyl)propyl group, a 3-isopropoxypropyl group.

When $R^{a3}$ and/or $R^{a4}$ is a substituent group having a hetero atom, $R^{a3}$ and/or $R^{a4}$ is not particularly limited as long as it is derived from an amine having a hetero atom, which can be used for synthesizing a corresponding sulfonamide.

$R^{a3}$ and/or $R^{a4}$ may be unsubstituted or may have a substituent group. The substituent group is preferably a substituent group having about 3 to 50 atoms, more preferably a substituent group having 3 to 40 atoms, and particularly preferably a substituent group having 3 to 30 atoms in view of a color value. The substituent group is further preferably a substituent group having a hetero atom of at least one selected from the group consisting of a nitrogen atom, a sulfur atom, and/or an oxygen atom, and has about 3 to 30 atoms.

The substituent group that is represented by $R^{a3}$ and/or $R^{a4}$ can be introduced by a reaction of a nitrobenzenesulfonyl chloride and one of a primary amine or a secondary amine. Examples of the substituent group that is represented by $R^{a3}$ and/or $R^{a4}$ and has a hetero atom include groups which are derived from primary amines or secondary amines having hetero atoms which are described in Aldrich Structure Index and derivatives thereof.

Specific examples of the substituent group include a 2-methoxyethyl group, 3-methoxypropyl group, 3-ethoxypropyl group, a 3-butoxypropyl group, a 2-methoxy-1-methyl-ethyl group, a tetrahydrofurfuryl group, a 2-hydroxyethyl group, a 2-hydroxypropyl group, a 4-hydroxybutyl group, a 2-hydroxy-1-methyl-ethyl group, a hydroxyethoxyethyl group, a 3-N-morpholinopropyl group, a 2-N-morpholinoethyl group, a 3-N-pyrrolidinonylpropyl group, a 2-dimethylaminoethyl group, a 3-dimethylaminopropyl group, a 3-diethylaminopropyl group, a 2-N-pyrrolidinylethyl group, a 2-(N-methyl-2-pyrrolidinyl)ethyl group, a 2-N-piperidinylethyl group, a 3-(2-methyl-N-piperidinyl)propyl group, a 3-isopropoxypropyl group, a diethylaminoethyl group, a 2,2-dimethoxyethyl group, a 1,3-dioxolane-2-yl-methyl group, a 3-hydroxypropyl group, a 2-mercaptoethyl group.

Among these, preferable examples of the substituent group include a 3-methoxypropyl group, a 3-ethoxypropyl group, a 2-methoxy-1-methyl-ethyl group, a tetrahydrofurfuryl group, a hydroxyethyl group, a hydroxypropyl group, a 4-hydroxybutyl group, a 2-hydroxy-1-methyl-ethyl group, a hydroxyethoxyethyl group, a 3-N-morpholinopropyl group, a 2-N-morpholinoethyl group, a 3-N-pyrrolidinonylpropyl group, a 2-dimethylaminoethyl group, a 3-dimethylaminopropyl group, a 3-diethylaminopropyl group, a 2-N-pyrrolidinylethyl group, a 2-(N-methyl-2-pyrrolidinyl)ethyl group, a 2-N-piperidinylethyl group, a 3-(2-methyl-N-piperidinyl) propyl group, a 3-isopropoxypropyl group, a diethylaminoethyl group, a 2,2-dimethoxyethyl group, a 1,3-dioxolane-2-yl-methyl group, a 3-hydroxypropyl group, a 2-mercaptoethyl group.

Among these, more preferable examples of the substituent group include a 3-methoxypropyl group, a 2-methoxy-1-methyl-ethyl group, a tetrahydrofurfuryl group, a hydroxyethyl group, a hydroxypropyl group, a 4-hydroxybutyl group, a hydroxyethoxyethyl group, a 3-N-morpholinopropyl group, a 2-N-morpholinoethyl group, a 3-N-pyrrolidinonylpropyl group, a 3-dimethylaminopropyl group, a 3-diethylaminopropyl group, a 2-(N-methyl-2-pyrrolidinyl)ethyl group, a 2-N-piperidinylethyl group, a 3-(2-methyl-N-piperidinyl) propyl group, a 3-isopropoxypropyl group, a diethylaminoethyl group, a 2,2-dimethoxyethyl group, a 1,3-dioxolane-2-yl-methyl group, a 3-hydroxypropyl group, a 2-mercaptoethyl group.

Among these, particularly preferable examples of the substituent group include a 3-methoxypropyl group, a tetrahydrofurfuryl group, a hydroxypropyl group, a 4-hydroxybutyl group, a hydroxyethoxyethyl group, a 3-N-morpholinopropyl group, a 2-N-morpholinoethyl group, a 3-N-pyrrolidinonylpropyl group, a 3-dimethylaminopropyl group, a 2-(N-methyl-2-pyrrolidinyl)ethyl group, a 2-N-piperidinylethyl group, a 3-(2-methyl-N-piperidinyl)propyl group, a 3-isopropoxypropyl group, a diethylaminoethyl group, a 2,2-dimethoxyethyl group, a 1,3-dioxolane-2-yl-methyl group, a 3-hydroxypropyl group, a 2-mercaptoethyl group.

When of $R^{a1}$, $R^{a3}$, and $R^{a4}$ is a substituent group that does not have a hetero atom, $R^{a1}$, $R^{a3}$, and $R^{a4}$ are each independently a hydrogen atom, an alkyl group having 1 to 21 carbon atoms, an alkenyl group having 2 to 21 carbon atoms, an aryl group having 6 to 21 carbon atoms, and an aralkyl group having 7 to 21 carbon atoms. $R^{a3}$ and $R^{a4}$ may be formed into a heterocycle together with a jointly bonded nitrogen atom. $R^{a1}$, $R^{a3}$, or $R^{a4}$ may further have a substituent group.

The alkyl group having 1 to 21 carbon atoms that is represented by $R^{a1}$, $R^{a3}$, or $R^{a4}$ may be unsubstituted or may have a substituent group. The alkyl group preferably is an alkyl group having 1 to 15 carbon atoms, and more preferably is an alkyl group having 1 to 10 carbon atoms.

The alkyl group that has 1 to 21 carbon atoms and is represented by $R^{a1}$, $R^{a3}$, or $R^{a4}$ may be a straight- or branched-chained group, or otherwise a cyclic alkyl group. Preferable examples of the alkyl group may include a methyl group, an ethyl group, an n-propyl group, an n-butyl group, an n-amyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosanyl group, an i-propyl group, a sec-butyl group, an i-butyl group, a t-butyl group, a 1-methylbutyl group, a 1-ethylpropyl group, a 2-methylbutyl group, an i-amyl group, a neopentyl group, a 1,2-dimethylpropyl group, a 1,1-dimethylpropyl group, a t-amyl group, a 1,3-dimethylbutyl group, a 3,3-dimethylbutyl group, a 2-ethylbutyl group, a 2-ethyl-2-methylpropyl group, a straight- or branched-chained heptyl group, a 1-methylheptyl group, a 2-ethylhexyl group, a 1,5-dimethylhexyl group, a t-octyl group, a branched nonyl group, a branched decyl group, a branched undecyl group, a branched dodecyl group, a branched tridecyl group, a branched tetradecyl group, a branched pentadecyl group, a branched hexadecyl group, a branched heptadecyl group, a branched octadecyl group, a straight- or branched-chained nonadecyl group, a straight- or branched-chained eicosanyl group, a cyclopropyl group, a cyclopropylmethyl group, a cyclobutyl group, a cyclobutylmethyl group, a cyclopentyl group, a cyclohexyl group, a cyclohexylmethyl group, a cycloheptyl group, a cyclooctyl group, a cyclohexylpropyl group, a cyclododecyl group, a norbornyl group, a bornyl group, a cis-myrtanyl group, an isopinocamphenyl group, a noradamantyl group, an adamantyl group, an adamantylmethyl group, a 1-(1-adamantyl)ethyl group, a 3,5-dimethyladamantyl group, a quinuclidinyl group, a cyclopentylethyl group, and a bicyclooctyl group.

Among the above-mentioned alkyl groups, in view of improvement in heat resistance, the ethyl group, the n-propyl group, the n-butyl group, the n-amyl group, the n-hexyl group, the n-heptyl group, the n-octyl group, the n-nonyl group, the n-decyl group, the i-propyl group, the sec-butyl group, the i-butyl group, the t-butyl group, the 1-methylbutyl group, the 1-ethylpropyl group, the 2-methylbutyl group, the i-amyl group, the neopentyl group, the 1,2-dimethylpropyl group, the 1,1-dimethylpropyl group, the t-amyl group, the 1,3-dimethylbutyl group, the 3,3-dimethylbutyl group, the 2-ethylbutyl group, the 2-ethyl-2-methylpropyl group, the branched heptyl group, the 1-methylheptyl group, the 2-ethylhexyl group, the 1,5-dimethylhexyl group, the t-octyl group, the branched nonyl group, the branched decyl group, the cyclopropyl group, the cyclopropylmethyl group, the cyclobutyl group, the cyclobutylmethyl group, the cyclopentyl group, the cyclohexyl group, the cyclohexylmethyl group, the cycloheptyl group, the cyclooctyl group, the cyclohexylpropyl group, the cyclododecyl group, the norbornyl group, the bornyl group, the noradamantyl group, the adamantyl group, the adamantylmethyl group, the 1-(1-adamantyl)ethyl group, the 3,5-dimethyladamantyl group, the cyclopentylethyl group, the alkyl group branched with a bicyclooctyl group, and the cyclic alkyl group are particularly preferable.

As the alkyl group represented by $R^{a1}$, $R^{a3}$, or $R^{a4}$ in Formula (I), an alkyl group which is substituted with fluorine may be preferably used. Preferable examples of the alkyl group that is substituted with fluorine include a trifluoromethyl group, a trifluoroethyl group, a pentafluoroethyl group, a heptafluoropropyl group, a nonafluorobutyl group, a tridecafluorohexyl group, a pentadecafluoroheptyl group, a heptadecafluorooctyl group, a tridecafluorooctyl group, a nonadecafluorononyl group, a heptadecafluorodecyl group, and a perfluorodecyl group. Among these, more preferable examples of the alkyl include the trifluoromethyl group, the pentafluoroethyl group, the heptafluoropropyl group, the nonafluorobutyl group, the tridecafluorohexyl group, and the pentadecafluoroheptyl group. Particularly preferable examples of the alkyl group include the trifluoromethyl group, the pentafluoroethyl group, the heptafluoropropyl group, the nonafluorobutyl group, and the tridecafluorohexyl group.

The alkenyl group that has 2 to 21 carbon atoms and that is represented by $R^{a1}$, $R^{a3}$, or $R^{a4}$ may be unsubstituted or may have a substituent group. The alkenyl group is preferably an alkenyl group having 2 to 15 carbon atoms, and more preferably an alkenyl group having 2 to 10 carbon atoms.

Preferable examples of the alkenyl group having 2 to 21 carbon atoms and that is represented by $R^{a1}$, $R^{a3}$, or $R^{a4}$ may include a vinyl group, an isopropenyl group, a 2-propenyl group, a 2-methyl-propenyl group, a 1-methyl-1-propenyl group, a 1-butenyl group, a 3-butenyl group, a 1-methyl-1-butenyl group, a 1,1-dimethyl-3-butenyl group, a 1-pentenyl group, a 2-pentenyl group, a 1-ethyl-1-pentenyl group, a 1-hexenyl group, a 1-heptenyl group, a 2,6-dimethyl-5-heptenyl group, a 9-decenyl group, a 1-cyclopentenyl group, a 2-cyclopentenylmethyl group, a cyclohexenyl group, a 1-methyl-2-cyclohexenyl group, a 1,4-dihydro-2-methylphenyl group, an octenyl group, a citronelyl group, an oleyl group, a gelanyl group, a farnesyl group, and a 2-(1-cyclohexenyl) ethyl group.

The aryl group that has 6 to 21 carbon atoms and that is represented by $R^{a1}$, $R^{a3}$, or $R^{a4}$ may be unsubstituted or may have a substituent group. The aryl group is preferably an aryl group having 6 to 15 carbon atoms, and more preferably an aryl group having 6 to 10 carbon atoms.

Preferable examples of the aryl group that has 6 to 21 carbon atoms and that is represented by $R^{a1}$, $R^{a3}$, or $R^{a4}$ include a phenyl group, a naphthyl group, biphenylenyl group, an acenaphtenyl group, a fluorenyl group, an anthracenyl group, an anthraquinonyl group, and a pirenyl group. Among these, more preferable examples of the aryl group include the phenyl group, the naphthyl group, the biphenylenyl group, the acenaphtenyl group, the fluorenyl group, and the anthracenyl group. Particularly preferable examples of the aryl group include the phenyl group, the naphthyl group, the biphenylenyl group, and the fluorenyl group.

The aralkyl group that has 7 to 21 carbon atoms and that is represented by $R^{a1}$, $R^{a3}$ or $R^{a4}$ may be unsubstituted or may have a substituent group. The aralkyl group is preferably an aralkyl group having 7 to 15 carbon atoms, and more preferably an aralkyl group having 7 to 10 carbon atoms.

Preferable examples of the aralkyl group that has 7 to 21 carbon atoms and that is represented by $R^{a1}$, $R^{a3}$ or $R^{a4}$ include a benzyl group, a diphenylmethyl group, a 1,2-diphenylethyl group, a phenyl-cyclopentylmethyl group, an α-methylbenzyl group, a phenylethyl group, an α-methyl-phenylethyl group, a β-methyl-phenylethyl group, a 3-phenylpropyl group, a 3,3-diphenylpropyl group, a 4-phenylbutyl group, a naphthylmethyl group, a styryl group, a cinnamyl group, a fluorenyl group, a 1-benzocyclobutenyl group, a 1,2,3,4-tetrahydronaphthyl group, an indanyl group, a piperonyl group, and a pyrenemethyl group.

The group that is represented by $R^{a1}$, $R^{a3}$ or $R^{a4}$ may include an ether group. Preferable examples of the group that is represented by $R^{a1}$, $R^{a3}$ or $R^{a4}$ may include a tetrahydrofurfuryl group and a 2,5-dihydro-2,5-dimethoxyfurfuryl group.

As is described above, $R^{a3}$ and $R^{a4}$ may form a heterocycle together with a jointly bonded nitrogen atom. Preferable examples of the heterocycle include a 2-methylaziridine ring, an azetidine ring, a pyrrolidine ring, a 3-pyrroline ring, a piperidine ring, a 1,2,3,6-tetrahydropyridine ring, a hexamethyleneimine ring, a piperazine ring, a 1,3,3-trimethyl-6-azabicyclo[3,2,1]octane ring, a decahydroquinoline ring, an oxazolidine ring, a morpholine ring, a thiazolidine ring, a thiomorpholine ring, an indoline ring, an isoindoline ring, a 1,2,3,4-tetrahydrocarbazole ring, a 1,2,3,4-tetrahydroquinoline ring, a 1,2,3,4-tetrahydroisoquinoline ring, an iminodibenzyl ring, a phenoxazine ring, a phenothiazine ring, and a phenazine ring.

Among these, more preferable examples of the heterocycle include the pyrrolidine ring, the 3-pyrroline ring, the piperidine ring, the 1,2,3,6-tetrahydropyridine ring, the hexamethyleneimine ring, the piperazine ring, the decahydroquinoline ring, an oxazolidine ring, the morpholine ring, the thiazolidine ring, and the thiomorpholine ring. Particularly preferable examples of the heterocycle include the pyrrolidine ring, the 3-pyrroline ring, the piperidine ring, the 1,2,3,6-tetrahydropyridine ring, the piperazine ring, the decahydroquinoline ring, an oxazolidine ring, the morpholine ring, the thiazolidine ring, and the thiomorpholine ring.

When the group represented by $R^{a1}$, $R^{a3}$ or $R^{a4}$ or the heterocycle which is formed by $R^{a3}$ and $R^{a4}$ together with a jointly bonded nitrogen atom further has a substituent group, preferable examples of the substituent group may include an acyl group, an acylamino group, an acylaminocarbonylamino group, an aralkylaminocarbonylamino group, an arylaminocarbonylamino group, a methacryloylaminocarbonylamino group, an alkoxycarbonyl group, a trifluoromethyl group, a fluoro group, a chloro group, a bromo group, an iodo group, a hydroxy group, a nitro group, a methyl group, an ethyl group, an n-propyl group, an i-propyl group, an n-butyl group, an i-butyl group, a sec-butyl group, a t-butyl group, a pentyl group, a hexyl group, a heptyl group, an octyl group, a vinyl group, a methoxy group, an ethoxy group, a butoxy group, an isopropoxy group, a t-butoxy group, a cyclohexyloxy group, a vinyloxy group, a methylthio group, an ethylthio group, a pyrrolidinyl group, a piperidinyl group, a piperadinyl group, an amino group, a dimethylamino group, a diethylamino group, a phenyl group, a —$SO_3M$ group, and a —COOM group (in which M is a hydrogen atom or a cation consisting of a metallic atom or a nitrogen-containing compound).

These substituent groups may be further substituted with similar substituent groups.

In addition, when the substituent group is a group having an active hydrogen, such as a hydroxy group or an amino group, they may be reacted with various acid chlorides, acid anhydrides, halides, or various isocyanates so that they may be substituted with an acetyl group, an acyl group, a (meth) acryloyl group, an alkylaminocarbonyl group, an arylaminocarbonyl group (for example, a butylaminocarbonyl group, a phenylaminocarbonyl group, and the like), an alkyl group, an aralkyl group.

In addition, the alkyl group, the alkenyl group, the aryl group, and the aralkyl group represented by $R^{a1}$, $R^{a3}$ or $R^{a4}$, as well as the heterocycle which is formed by $R^{a3}$ and $R^{a4}$ together with a jointly bonded nitrogen atom, may be substituted with a group which is similar to that represented by each of the groups represented by $R^{a1}$, $R^{a3}$ or $R^{a4}$.

When the group represented by $R^{a1}$, $R^{a3}$ or $R^{a4}$ and the heterocycle which is formed by $R^{a3}$ and $R^{a4}$ together with a jointly bonded nitrogen atom has a substituent group, among the substituent groups may have, "M" in the $SO_3M$ group and the COOM group is a hydrogen atom, a cation consisting of a metallic atom, or a cation consisting of a nitrogen-containing compound. The nitrogen-containing compound is the same as a nitrogen-containing compound that forms a salt or an amide bond in conjunction with an acidic dye like the preferred aspects thereof. Preferable examples of the "M" include cations of H, Li, Na, K, Rb, Cs, Ag, Mg, Ca, Sr, Ba, Zn, Al, Ni, Cu, Co or Fe, or a cation consisting of a nitrogen-containing compound. More preferable examples thereof include cations of H, Na, K, Rb, Cs, Ag, Mg, Ca, Sr, Ba, Zn, Al, Ni, Cu, or Fe, or a cation consisting of a nitrogen-containing compound. Preferable examples thereof include cations of H, Na, K, Mg, Ca, Ba, Sr, Zn, Al, Cu, or Fe and a cation consisting of a nitrogen-containing compound described below.

$R^{a2}$ is an alkyl group having 1 to 10 carbon atoms, a methoxymethyl group, or a trifluoromethyl group. $R^{a2}$ may have a substituent group.

Preferable examples of the group represented by $R^{a2}$ include a methyl group, an ethyl group, an n-propyl group, an isopropyl group, a t-butyl group, a methoxymethyl group, and a trifluoromethyl group. Among these, more preferable examples of the group represented by $R^{a2}$ include the methyl group, the ethyl group, the isopropyl group, the t-butyl group, the methoxymethyl group, and the trifluoromethyl group.

Particularly preferable examples of the group represented by $R^{a2}$ include the methyl group, the isopropyl group, the methoxymethyl group, and the trifluoromethyl group.

Preferable examples of the substituent group of $R^{a2}$ includes a halogen atom, an alkyl group, and an alkenyl group. Among these, more preferable examples of the substituent group include a chlorine atom, a fluorine atom, a methyl group, an ethyl group, a propyl group, a butyl group, and a 2-butenyl group. Particularly preferable examples of the substituent group include the chlorine atom, the methyl group, the ethyl group, the propyl group, the butyl group, and the 2-butenyl group.

Hereinafter, the dye that is represented by the formula (III) will be described in detail.

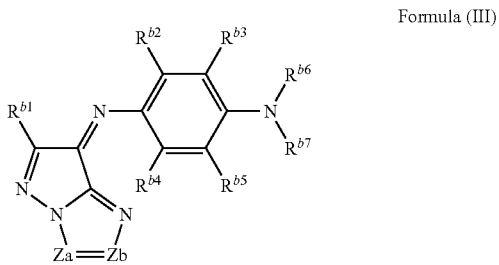

Formula (III)

wherein $R^{b1}$ is a hydrogen atom or a substituent group; $R^{b2}$ to $R^{b5}$ are each independently a hydrogen atom or a substituent group; $R^{b6}$ and $R^{b7}$ are each independently an alkyl group, an alkenyl group, an aryl group or a heterocyclic group; Za and Zb are each independently —N= or —C($R^{b8}$)=; $R^{a8}$ is a hydrogen atom or a substituent group; and $R^{b2}$ and $R^{b3}$, $R^{b3}$ and $R^{b6}$, $R^{b4}$ and $R^{b5}$, $R^{b5}$ and $R^{b7}$, and/or $R^{b6}$ and $R^{b7}$ may each independently be bonded to each other to form a 5-, 6-, or 7-membered ring.

In the formula (III), $R^{b1}$ is a hydrogen atom or a substituent group. Examples of the substituent group represented by $R^{b1}$ include a halogen atom (for example, a fluorine atom, a chlorine atom, a bromine atom), an alkyl group (preferably a straight- or branched-chained, or cyclic alkyl group having 1 to 48 carbon atoms, such as methyl, ethyl, propyl, isopropyl, butyl, t-butyl, pentyl, hexyl, heptyl, octyl, 2-ethylhexyl, dodecyl, hexadecyl, cyclopropyl, cyclopentyl, cyclohexyl, 1-norbornyl, and 1-adamantyl), an alkenyl group (preferably an alkenyl group having 2 to 48 carbon atoms, such as vinyl, allyl, and 3-buten-1-yl), an aryl group (preferably the aryl group having 6 to 48 carbon atoms, such as phenyl and naphthyl), a heterocyclic group (preferably a heterocyclic group having 1 to 32 carbon atoms, such as 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), a silyl group (preferably the silyl group having 3 to 38 carbon atoms, such as trimethylsilyl, triethylsilyl, tributylsilyl, t-butyldimethylsilyl, and t-hexyldimethylsilyl), a hydroxyl group, a cyano group, a nitro group, an alkoxy group (preferably an alkoxy group having 1 to 48 carbon atoms, such as methoxy, ethoxy, 1-butoxy, 2-butoxy, isopropoxy, t-butoxy, dodecyloxy, and a cycloalkyloxy group such as cyclopentyloxy and cyclohexyloxy), an aryloxy group (preferably an aryloxy group having 6 to 48 carbon atoms, such as a phenoxy group and 1-naphthoxy), a heterocyclic oxy group (preferably a heterocyclic oxy group having 1 to 32 carbon atoms, such as 1-phenyltetrazol-5-oxy and 2-tetrahydropyranyloxy), a silyloxy group (preferably a silyloxy group having 1 to 32 carbon atoms, such as trimethylsilyloxy, t-butyldimethylsilyloxy, and diphenylmethylsilyloxy), an acyloxy group (preferably an acyloxy group having 2 to 48 carbon atoms, such as acetoxy, pivaloyloxy, benzoyloxy, and dodecanoyloxy), an alkoxycarbonyloxy group (preferably an alkoxycarbonyloxy group having 2 to 48 carbon atoms, such as ethoxycarbonyloxy, t-butoxycarbonyloxy, and a cycloalkyloxycarbonyloxy group such as cyclohexyloxycarbonyloxy), an aryloxycarbonyloxy group (preferably an aryloxycarbonyloxy group having 7 to 32 carbon atoms, such as phenoxycarbonyloxy), a carbamoyloxy group (preferably a carbamoyloxy group having 1 to 48 carbon atoms, such as N,N-dimethylcarbamoyloxy, N-butylcarbamoyloxy, N-phenylcarbamoyloxy, and N-ethyl-N-phenylcarbamoyloxy), a sulfamoyloxy group (preferably a sulfamoyloxy group having 1 to 32 carbon atoms, such as N,N-diethylsulfamoyloxy and N-propylsulfamoyloxy), an alkylsulfonyloxy group (preferably an alkylsulfonyloxy group having 1 to 38 carbon atoms, such as methylsulfonyloxy, hexadecylsulfonyloxy, and cyclohexylsulfonyloxy), an arylsulfonyloxy group (preferably an arylsulfonyloxy group having 6 to 32 carbon atoms, such as phenylsulfonyloxy), an acyl group (preferably an acyl group having 1 to 48 carbon atoms, such as formyl, acetyl, pivaloyl, benzoyl, tetradecanoyl, and cyclohexanoyl), an alkoxycarbonyl group (preferably an alkoxycarbonyl group having 2 to 48 carbon atoms, such as methoxycarbonyl, ethoxycarbonyl, octadecyloxycarbonyl, and cyclohexyloxycarbonyl), an aryloxycarbonyl group (preferably an aryloxycarbonyl group having 7 to 32 carbon atoms, such as phenoxycarbonyl), a carbamoyl group (preferably a carbamoyl group having 1 to 48 carbon atoms, such as carbamoyl, N,N-diethylcarbamoyl, N-ethyl-N-octylcarbamoyl, N,N-dibutylcarbamoyl, N-propylcarbamoyl, N-phenylcarbamoyl, N-methyl-N phenylcarbamoyl, and N,N-dicyclohexylcarbamoyl), an amino group (preferably an amino group having 32 carbon atoms or less, such as amino, methylamino, N,N-dibutylamino, tetradecylamino, 2-ethylhexylamino, and cyclohexylamino), an anilino group (preferably an anilino group having 6 to 32 carbon atoms, such as anilino and N-methylanilino), a heterocyclic amino group (preferably a heterocyclic amino group having 1 to 32 carbon atoms, such as 4-pyridylamino), a carbonamide group (preferably a carbonamide group having 1 to 32 carbon atoms, such as acetamide, benzamide, pivaloylamide, cyclohexanamide, adamantylamino, 2-ethylhexaneamide, however a perfluoroalkylcarbonylamino group is excluded), an ureido group (preferably a ureido group having 1 to 32 carbon atoms, such as ureido, N,N-dimethylureido, and N-phenylureido), an imide group (preferably an imide group having 10 carbon atoms or less, such as N-succinimide and N-phthalimide), an alkoxycarbonylamino group (preferably an alkoxycarbonylamino group having 2 to 48 carbon atoms, such as methoxycarbonylamino, ethoxycarbonylamino, t-butoxycarbonylamino, octadecyloxycarbonylamino, and cyclohexyloxycarbonylamino), an aryloxycarbonylamino group (preferably an aryloxycarbonylamino group having 7 to 32 carbon atoms, such as phenoxycarbonylamino), an azo group (preferably an azo group having 1 to 32 carbon atoms, such as phenylazo and 3-pyrazolylazo), an alkylthio group (preferably an alkylthio group having 1 to 48 carbon atoms, such as methylthio, ethylthio, octylthio, and cyclohexylthio), an arylthio group (preferably an arylthio group having 6 to 48 carbon atoms, such as phenylthio), a heterocyclic thio group (preferably a heterocyclic thio group having 1 to 32 carbon atoms, such as 2-benzothiazolylthio, 2-pyridylthio, and 1-phenyltetrazolylthio), an alkylsulfinyl group (preferably an alkylsulfinyl group having 1 to 32 carbon atoms, such as dodecanesulfinyl), an arylsulfinyl group (preferably an arylsulfinyl group having 6 to 32 carbon atoms, such as phenylsulfinyl), an alkylsulfonyl group (preferably an alkylsulfonyl group having 1 to 48 carbon atoms, such as methylsulfonyl, ethylsulfonyl, propylsulfonyl, butylsulfonyl, isopropylsulfonyl, 2-ethylhexylsulfonyl, hexadecylsulfonyl, octylsulfonyl, and cyclohexylsulfonyl), an arylsulfonyl group (preferably an arylsulfonyl group having 6 to 48 carbon atoms, such as phenylsulfonyl and 1-naphthylsulfonyl), a sulfamoyl group (preferably a sulfamoyl group having 32 carbon atoms or less, such as sulfamoyl, N,N-dipropylsulfamoyl, N-ethyl-N-dodecylsulfamoyl, N-ethyl-N-phenylsulfamoyl, and N-cyclohexylsulfamoyl), a sulfo group, a phosphonyl group (preferably a phosphonyl group having 1 to 32 carbon atoms, such as phenoxyphosphonyl, octyloxyphosphonyl, and phenylphosphonyl), a phosphinoylamino group (preferably a phosphinoylamino group having 1 to 32 carbon atoms, such as diethoxyphosphinoylamino and dioctyloxyphosphinoylamino).

When the aforementioned $R^{b1}$ is a substitutable group, the group represented by $R^{b1}$ may have a substituent group represented by $R^{b1}$, a sulfonamide group, or a sulfamoylamino group. In a case where the group represented by $R^{b1}$ has two or more substituent groups, the substituent groups may be the same as or different from each other.

In the formula (III), $R^{b2}$ to $R^{b5}$ are each independently a hydrogen atom or a substituent group, and examples of the substituent groups of $R^{b2}$ to $R^{b5}$ include the substituent groups described in $R^{b1}$, a perfluoroalkylcarbonylamino group, a sulfonamide group (preferably a sulfonamide group having 1 to 48 carbon atoms, such as methanesulfonamide, butanesulfonamide, benzenesulfonamide, hexadecanesulfonamide, and cyclohexanesulfonamide), or a sulfamoylamino group (preferably a sulfamoylamino group having 1 to 48 carbon atoms, such as N,N-dipropylsulfamoylamino and N-ethyl-N-dodecylsulfamoylamino).

When $R^{b2}$ to $R^{b5}$ of the formula (III) are substitutable groups, they may have the above-mentioned substituent groups of $R^{b2}$ to $R^{b5}$. In a case where $R^{b2}$ to $R^{b5}$ have two or more substituent groups, the substituent groups may be the same as or different from each other.

In the formula (III), $R^{b6}$ and $R^{b7}$ are each independently an alkyl group, an alkenyl group, an aryl group, or a heterocyclic group. Preferable ranges of the alkyl group, the alkenyl group, the aryl group, and the heterocyclic group of $R^{b6}$ and $R^{b7}$ have the same meaning as the alkyl group, the alkenyl group, the aryl group, and the heterocyclic group of $R^{b1}$.

When $R^{b6}$ and $R^{b7}$ of the formula (III) are substitutable groups, they may be substituted with the above-mentioned substituent groups of $R^{b2}$ to $R^{b5}$. In a case where $R^{b6}$ and $R^{b7}$ are substituted with two or more substituent groups, the substituent groups may be the same as or different from each other.

In the formula (III), $R^{b2}$ and $R^{b3}$, $R^{b3}$ and $R^{b6}$, $R^{b4}$ and $R^{b5}$, $R^{b5}$ and $R^{b7}$, and/or $R^{b6}$ and $R^{b7}$ may be bonded to each other to form a 5-, 6-, or 7-membered ring. The 5-, 6-, or 7-membered ring that is formed by bonding $R^{b}$ and $R^{b3}$, $R^{b3}$ and $R^{b6}$, $R^{b4}$ and $R^{b5}$, $R^{b5}$ and $R^{b7}$, and $R^{b6}$ and $R^{b7}$ to each other may have the substituent groups of $R^{b2}$ to $R^{b5}$, and in a case where they are substituted with two or more substituent groups, the substituent groups may be the same as or different from each other. In respects to the above-mentioned 5-, 6-, or 7-membered ring, examples of the 5-membered ring may include a cyclopentene ring, a pyrrole ring, a pyrazole ring, a pyrrolidine ring, a pyrazolidine ring, an imidazolidine ring, an isoxazolidine ring, and an isothiazolidine ring. Examples of the 6-membered ring may include a benzene ring, a pyridine ring, a pyrimidine ring, a piperidine ring, a piperazine ring, a morpholine ring, and a cyclohexene ring. Examples of the 7-membered ring may include a heptamethyleneimine ring, a homopiperazine ring, and a cycloheptene ring. Particularly preferable examples of the ring include the benzene ring, the pyridine ring, the piperidine ring, and the pyrrolidine ring.

In the formula (III), Za and Zb are each independently =N— or =C($R^{a8}$)—, and $R^{b8}$ is a hydrogen atom or a substituent group.

The substituent group of $R^{b8}$ has the same meaning as the substituent groups of $R^{b2}$ to $R^{b5}$, and when the substituent group of $R^{b8}$ is further a substitutable group, $R^{b8}$ may be substituted with the above-mentioned substituent groups of $R^{b2}$ to $R^{b5}$. In a case where $R^{b8}$ is substituted with two or more substituent groups, the substituent groups may be the same as or different from each other.

The color value of the organic-solvent-soluble dye that is represented by the formula (III) is preferably 55 or more, more preferably 60 or more, particularly preferably 70 or more, and most preferably 80 or more.

Hereinafter, each group according to the formulae will be described in detail. In respects to moieties shown in the formulae, the description will be preferentially applied thereto.

In the specification, examples of a "halogen atom" may include a fluorine atom, a chlorine atom, and a bromine atom. Preferable examples of the halogen atom may include the chlorine atom and the bromine atom. Particularly preferable examples of the halogen atom may include the chlorine atom.

In the specification, the term "aliphatic group" means an alkyl group, a substituted alkyl group, an alkenyl group, a substituted alkenyl group, an alkynyl group, a substituted alkynyl group, an aralkyl group, and a substituted aralkyl group. The aliphatic group may have a branch or may form a ring. The aliphatic group has preferably 1 to 20 carbon atoms and more preferably 1 to 16 carbon atoms. An aryl moiety of the aralkyl group and the substituted aralkyl group is preferably phenyl or naphthyl, and particularly preferably phenyl. Examples of the aliphatic group may include a methyl group, an ethyl group, a butyl group, an isopropyl group, an n-butyl group, a t-butyl group, an n-octyl group, a hydroxyethyl group, a methoxyethyl group, a cyanoethyl group, a trifluoromethyl group, a 3-sulfopropyl group, a 4-sulfobutyl group, a cyclohexyl group, a benzyl group, a 2-phenethyl group, a vinyl group, and an allyl group. Preferable examples of the aliphatic group may include the methyl group, the ethyl group, the isopropyl group, the n-butyl group, the t-butyl group, and the hydroxyethyl group. Particularly preferable examples of the aliphatic group may include the methyl group, the ethyl group, and the t-butyl group.

In the specification, the term "aromatic group" means an aryl group and a substituted aryl group. The aryl group is preferably a phenyl group or a naphthyl group, and particularly preferably the phenyl group. The aromatic group has preferably 6 to 20 carbon atoms and more preferably 6 to 16 carbon atoms. Examples of the aromatic group include a phenyl group, a p-tolyl group, a 1,3,5-trimethylphenyl group, a p-methoxyphenyl group, an o-chlorophenyl group, an m-nitrophenyl group, a p-nitrophenyl group, a p-carboxyl-o-nitrophenyl group, a 2,4-dicarboxylphenyl group, and an m-(3-sulfopropylamino)phenyl group. Preferable examples of the aromatic group may include the phenyl group, the p-tolyl group, the 1,3,5-trimethylphenyl group, the p-methoxyphenyl group, the m-nitrophenyl group, the p-nitrophenyl group, the p-carboxyl-o-nitrophenyl group, and the 2,4-dicarboxylphenyl group. Particularly preferable examples of the aromatic group may include the phenyl group, the 1,3,5-trimethylphenyl group, the p-carboxyl-o-nitrophenyl group, and the 2,4-dicarboxylphenyl group.

In the specification, the term "heterocyclic group" includes a heterocyclic group having a substituent group and an unsubstituted heterocyclic group. The heterocycle may be condensed with the aliphatic ring, the aromatic ring, or the other heterocycles. Preferable examples of the heterocyclic group include 5- and 6-membered heterocyclic groups. Examples of the substituent group include an aliphatic group, a halogen atom, an alkyl and arylsulfonyl groups, an acyl group, an acylamino group, a sulfamoyl group, an N-alkylsulfamoyl group, an N-arylsulfamoyl group, a carbamoyl group, and an ionic hydrophilic group. Preferable examples of the substituent group may include the acyl group, the acylamino group, the sulfamoyl group, the monoalkylsulfamoyl group, and the monoarylsulfamoyl group. Particularly preferable examples of the substituent group may include the sulfamoyl group, the monoalkylsulfamoyl group, and the monoarylsulfamoyl group. Examples of the unsubstituted heterocyclic group include a 2-pyridyl group, a 2-thienyl group, a 2-thiazolyl group, a 2-benzothiazolyl group, a 2-benzoxazolyl group, a 2-thiadiazolyl group, and a 2-furyl group. Preferable examples of the heterocyclic group may include the 2-thiazolyl group, the 2-benzothiazolyl group, and the 2-thiadiazolyl group. Particularly preferable examples of the heterocyclic group may include the 2-benzothiazolyl group and the 2-thiadiazolyl group. Preferably, they have the substituent groups.

The term "carbamoyl group" includes a carbamoyl group having a substituent group and the unsubstituted carbamoyl group. Examples of the substituent group include an alkyl group, and specific examples thereof are the same as those of the aliphatic group. Examples of the carbamoyl group include a methylcarbamoyl group, an ethylcarbamoyl group, and a dimethylcarbamoyl group. Preferable examples of the carbamoyl group may include the methylcarbamoyl group and the ethylcarbamoyl group. Particularly preferable examples of the carbamoyl group may include the methylcarbamoyl group.

The term "alkoxycarbonyl group" includes an alkoxycarbonyl group having a substituent group and the unsubstituted alkoxycarbonyl group. Preferable examples of the alkoxycarbonyl group include an alkoxycarbonyl group having 2 to 12 carbon atoms. Examples of the substituent group include an ionic hydrophilic group. Examples of the alkoxycarbonyl group include a methoxycarbonyl group, an ethoxycarbonyl group, and a butoxycarbonyl group. Preferable examples of the alkoxycarbonyl group may include the methoxycarbonyl group and the ethoxycarbonyl group. Particularly preferable examples of the alkoxycarbonyl group may include the methoxycarbonyl group.

The term "aryloxycarbonyl group" includes an aryloxycarbonyl group having a substituent group and the unsubstituted aryloxycarbonyl group. Preferable examples of the aryloxycarbonyl group include an aryloxycarbonyl group having 7 to 12 carbon atoms. Examples of the substituent group include an ionic hydrophilic group. Examples of the aryloxycarbonyl group include a phenoxycarbonyl group, a p-methoxyphenoxycarbonyl group, and a p-methylphenoxycarbonyl group. Preferable examples of the aryloxycarbonyl group may include the phenoxycarbonyl group and the p-methylphenoxycarbonyl group. Particularly preferable examples of the aryloxycarbonyl group may include the phenoxycarbonyl group.

The term "acyl group" includes an acyl group having a substituent group and the unsubstituted acyl group. Preferable examples of the acyl group include an acyl group having 1 to 12 carbon atoms. Examples of the substituent group include an ionic hydrophilic group. Examples of the acyl group include an acetyl group, a benzoyl group, and an o-hydroxybenzoyl group. Preferable examples of the acyl group may include the acetyl group and the benzoyl group. Particularly preferable examples of the acyl group may include the acetyl group.

The term "alkoxy group" includes an alkoxy group having a substituent group and the unsubstituted alkoxy group. Preferable examples of the alkoxy group include an alkoxy group having 1 to 12 carbon atoms. Examples of the substituent group include an alkoxy group, a hydroxy group, and an ionic hydrophilic group. Examples of the alkoxy group include a methoxy group, an ethoxy group, an isopropoxy group, a methoxyethoxy group, a 2-hydroxyethoxy group, and a 3-carboxypropoxy group. Preferable examples of the alkoxy group may include the methoxy group, the methoxyethoxy group, the 2-hydroxyethoxy group, and the 3-carboxypropoxy group. Particularly preferable examples of the alkoxy group may include the 2-hydroxyethoxy group and the 3-carboxypropoxy group.

The term "aryloxy group" includes an aryloxy group having a substituent group and the unsubstituted aryloxy group. Preferable examples of the aryloxy group include an aryloxy group having 6 to 12 carbon atoms. Examples of the substituent group include an alkoxy group and an ionic hydrophilic group. Examples of the aryloxy group include a phenoxy group, a p-methoxyphenoxy group, and an o-methoxyphenoxy group. Preferable examples of the aryloxy group may include the phenoxy group and the p-methoxyphenoxy group. Particularly preferable examples of the aryloxy group may include the phenoxy group.

The term "acyloxy group" includes an acyloxy group having a substituent group and the unsubstituted acyloxy group. Preferable examples of the acyloxy group include an acyloxy group having 1 to 12 carbon atoms. Examples of the substituent group include an ionic hydrophilic group. Examples of the acyloxy group include an acetoxy group, a benzoyloxy group, and an o-hydroxybenzoyl group. Preferable examples of the acyloxy group may include the acetoxy group and the benzoyloxy group. Particularly preferable examples of the acyloxy group may include the acetoxy group.

The term "carbamoyloxy group" includes a carbamoyloxy group having a substituent group and the unsubstituted carbamoyloxy group. Preferable examples of the carbamoyloxy group include a carbamoyloxy group having 1 to 6 carbon atoms. Examples of the substituent group include an alkyl group. Examples of the carbamoyloxy group include an N-methylcarbamoyloxy group, an N-ethylcarbamoyloxy group, and an N-n-butylcarbamoyloxy group. Preferable examples of the carbamoyloxy group may include the N-methylcarbamoyloxy group and the N-ethylcarbamoyloxy group. Particularly preferable examples of the carbamoyloxy group may include the N-methylcarbamoyloxy group.

In the specification, the term "heterocyclicoxy group" includes a heterocyclicoxy group having a substituent group and an unsubstituted heterocyclicoxy group. The heterocycle is preferably a 5- or 6-membered heterocycle. The heterocycle may be condensed with an aliphatic ring, an aromatic ring, or the other heterocycles. Examples of the substituent group are the same as those of the above-mentioned heterocyclic group like the preferred aspects thereof. Examples of the unsubstituted heterocyclicoxy group include a 3-isoxazolyloxy group, a 2-benzothiazolyloxy group, and a 2-pyridyloxy group.

In the specification, the term "alkoxycarbonyloxy group" includes an alkoxycarbonyloxy group having a substituent group and a unsubstituted alkoxycarbonyloxy group. Preferable examples of the alkoxycarbonyloxy group include an alkoxycarbonyloxy group having 1 to 5 carbon atoms. Examples of the substituent group include an ionic hydrophilic group. Examples of the alkoxycarbonyloxy group include a methoxycarbonyloxy group, an ethoxycarbonyloxy group, and a propoxycarbonyloxy group. Particularly preferable examples of the alkoxycarbonyloxy group may include the methoxycarbonyloxy group.

In the specification, the term "aryloxycarbonyloxy group" includes an aryloxycarbonyloxy group having a substituent group and an unsubstituted aryloxycarbonyloxy group. Preferable examples of the aryloxycarbonyloxy group include an aryloxycarbonyloxy group having 6 to 15 carbon atoms. Examples of the substituent group include an ionic hydrophilic group. Examples of the aryloxycarbonyloxy group include a phenoxycarbonyloxy group, a p-methoxyphenoxycarbonyloxy group, and a p-tolylphenoxycarbonyloxy group. Particularly preferable examples of the aryloxycarbonyloxy group may include the phenoxycarbonyloxy group.

A substituted group of the "substituted amino group substituted with an alkyl group, an aryl group, or a heterocyclic group" may further have a substituent group. The unsubstituted amino group is not included. Preferable examples of the alkylamino group include an alkylamino group having 1 to 6 carbon atoms. In a case where the alkylamino group further has the substituent group, examples of the substituent group include an ionic hydrophilic group. Examples of the alkylamino group include a methylamino group, a diethylamino group, a bis(2-hydroxyethyl)amino group, a bis(carboxymethyl)amino group, a 2-(1,3-dihydroxypropyl)amino group, a 2-(1,3-dihydroxy-2-methylpropyl)amino group, a 2-(hydroxypropyl-2-methyl)amino group, a 2,3-dihydroxypropylamino group, and a 2-hydroxypropylamino group. Preferable examples of the alkylamino group may include the methylamino group, the bis(2-hydroxyethyl)amino group, the bis(carboxymethyl)amino group, the 2-(1,3-dihydroxypropyl)amino group, the 2,3-dihydroxypropylamino group, and the 2-hydroxypropylamino group. Particularly preferable examples of the alkylamino group may include the bis(carboxymethyl)amino group, the 2-(1,3-dihydroxypropyl) amino group, and the 2-hydroxypropylamino group.

The term arylamino group includes an arylamino group having a substituent group and an unsubstituted arylamino group. Preferable examples of the arylamino group include an arylamino group having 6 to 12 carbon atoms. In a case where the alkylamino group has the substituent group, examples of the substituent group include a halogen atom and an ionic hydrophilic group. Examples of the arylamino group include an anilino group, a 1,3,5-trimethylanilino group, a p-methoxyanilino group, a 2-chloroanilino group, an m-carboxylanilino group, and a 2,4-dicarboxylanilino group. Preferable examples of the arylamino group may include the anilino group, the 1,3,5-trimethylanilino group, the m-carboxylanilino group, and the 2,4-dicarboxylanilino group. Particularly preferable examples of the arylamino group may include the 1,3,5-trimethylanilino group and the 2,4-dicarboxylanilino group.

In the specification, the term "acylamino group" includes an acylamino group having a substituent group. Preferable examples of the acylamino group include an acylamino group having 2 to 12 carbon atoms. Examples of the substituent group include an ionic hydrophilic group. Examples of the acylamino group include an acetylamino group, a propionylamino group, a benzoylamino group, an N-phenylacetylamino group, and a 3,5-disulfobenzoylamino group. Preferable examples of the acylamino group may include the acetylamino group, the propionylamino group, the benzoylamino group, and the N-phenylacetylamino group. Particularly preferable examples of the acylamino group may include the acetylamino group and the benzoylamino group.

In the specification, the term "ureide group" includes a ureide group having a substituent group and an unsubstituted ureide group. Preferable examples of the ureide group include a ureide group having 1 to 12 carbon atoms. Examples of the substituent group include an alkyl group and an aryl group. Examples of the ureide group include a 3-methylureide group, a 3,3-dimethylureide group, and a 3-phenylureide group. Preferable examples of the ureide group may include the 3-methylureide group and the 3-phenylureide group. Particularly preferable examples of the ureide group may include the 3-methylureide group.

In the specification, the term "sulfamoylamino group" includes a sulfamoylamino group having a substituent group and an unsubstituted sulfamoylamino group. Examples of the substituent group include an alkyl group. Examples of the sulfamoylamino group include a sulfamoylamino group, an N,N-dipropylsulfamoylamino group, and an N,N-dipropionic acid sulfamoylamino group. Preferable examples of the sulfamoylamino group may include the sulfamoylamino group, the 1,3-dihydroxypropylsulfamoylamino group, and the N,N-dipropionic acid sulfamoylamino group. Particularly preferable examples of the sulfamoylamino group may include the 1,3-dihydroxypropylsulfamoylamino group and the N,N-dipropionic acid sulfamoylamino group.

In the specification, the term "alkoxycarbonylamino group" includes an alkoxycarbonylamino group having a substituent group and an unsubstituted alkoxycarbonylamino group. Preferable examples of the alkoxycarbonylamino group include an alkoxycarbonylamino group having 2 to 12 carbon atoms. Examples of the substituent group include an ionic hydrophilic group. Examples of the alkoxycarbonylamino group include an ethoxycarbonylamino group, a propoxycarbonylamino group, and a butyloxycarbonylamino group. Preferable examples of the alkoxycarbonylamino group may include the ethoxycarbonylamino group and the propoxycarbonylamino group. Particularly preferable examples of the alkoxycarbonylamino group may include the ethoxycarbonylamino group.

In the specification, the term "aryloxycarbonylamino group" includes an aryloxycarbonylamino group having a substituent group and an unsubstituted aryloxycarbonylamino group. Preferable examples of the aryloxycarbonylamino group include an aryloxycarbonylamino group having 7 to 12 carbon atoms. Examples of the substituent group include an ionic hydrophilic group. Examples of the aryloxycarbonylamino group include a phenoxycarbonylamino group, a p-methylphenoxycarbonylamino group, and an o-hydroxyphenoxycarbonylamino group. Preferable examples of the aryloxycarbonylamino group may include the phenoxycarbonylamino group and the o-hydroxyphenoxycarbonylamino group. Particularly preferable examples of the aryloxycarbonylamino group may include the o-hydroxyphenoxycarbonylamino group.

In the specification, the terms "alkylsulfonylamino group" and "arylsulfonylamino group" include an alkylsulfonylamino group and an arylsulfonylamino group each having a substituent group and unsubstituted alkylsulfonylamino and arylsulfonylamino groups. Preferable examples of the alkylsulfonylamino and arylsulfonylamino groups include alkylsulfonylamino and arylsulfonylamino groups each having 1 to 12 carbon atoms. Examples of the substituent group include an ionic hydrophilic group. Examples of the alkylsulfonylamino and arylsulfonylamino groups include a methanesulfonylamino group, an N-phenylmethanesulfonylamino group, a benzenesulfonylamino group, and a 3-carboxybenzenesulfonylamino group. Preferable examples of the alkylsulfonylamino and arylsulfonylamino groups may include the methanesulfonylamino group and the 3-carboxybenzenesulfonylamino group. Particularly preferable examples of the alkylsulfonylamino and arylsulfonylamino groups may include the 3-carboxybenzenesulfonylamino group.

In the specification, the terms "alkylthio group", "arylthio group", and "heterocyclic thio group" include an alkylthio group, an arylthio group, and a heterocyclic thio group each having a substituent group, and unsubstituted alkylthio, arylthio, and heterocyclic thio groups. Preferable examples of the alkylthio, arylthio, and heterocyclic thio groups include alkylthio, arylthio, and heterocyclic thio groups each having 1 to 12 carbon atoms. Examples of the substituent group include an ionic hydrophilic group. Examples of the alkylthio, arylthio, or heterocyclic thio groups include a methylthio group, a phenylthio group, and a 2-pyridylthio group.

In the specification, examples of the "alkylsulfonyl group" and the "arylsulfonyl group" may include a methanesulfonyl group and a phenylsulfonyl group, respectively.

In the specification, examples of the "alkylsulfinyl group" and the "arylsulfinyl group" may include a methanesulfinyl group and a phenylsulfinyl group, respectively.

In the specification, the term "sulfamoyl group" includes a sulfamoyl group having a substituent group and an unsubstituted sulfamoyl group. Examples of the substituent group include an alkyl group and an aryl group. Examples of the sulfamoyl group include an unsubstituted sulfamoyl group, a dimethylsulfamoyl group, a bis-(carboxylmethyl)sulfamoyl group, a di-(2-hydroxyethyl)sulfamoyl group, a 2,4-dicarboxylphenylsulfamoyl group, a 2-(1,3-dihydroxypropyl)-sulfamoyl group, a 2-(hydroxypropyl)sulfamoyl group, a 2-(hydroxy-2-methylpropyl)sulfamoyl group, a 2-(1,3-dihydroxy-2-methyl-propyl)sulfamoyl group, and a dipropionic acid sulfamoyl group. Preferable examples of the sulfamoyl group may include the unsubstituted sulfamoyl group, the bis-(carboxylmethyl)sulfamoyl group, the di-(2-hydroxyethyl)sulfamoyl group, the 2,4-dicarboxylphenylsulfamoyl group, the 2-(1,3-dihydroxypropyl)-sulfamoyl group, and the dipropionic acid sulfamoyl group. Particularly preferable examples of the sulfamoyl group may include the bis-(carboxylmethyl)sulfamoylamino group, the di-(2-hydroxyethyl)sulfamoyl group, and the 2-(1,3-dihydroxypropyl)-sulfamoyl group.

Hereinafter, specific examples (compounds of the formulae I to 31) of the dye (azo dye) that is represented by formula (I) will be shown. However, in the invention, the examples of the dye are not limited thereto.

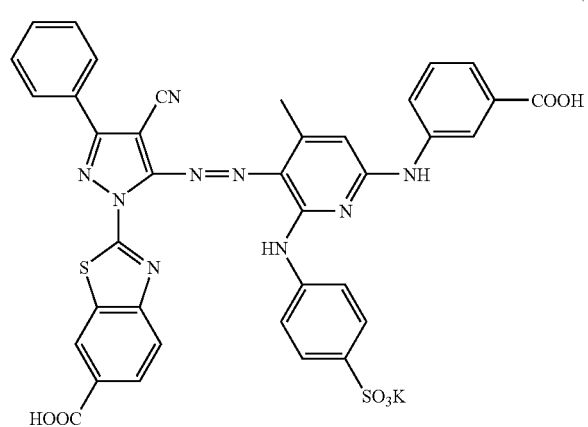

(1)

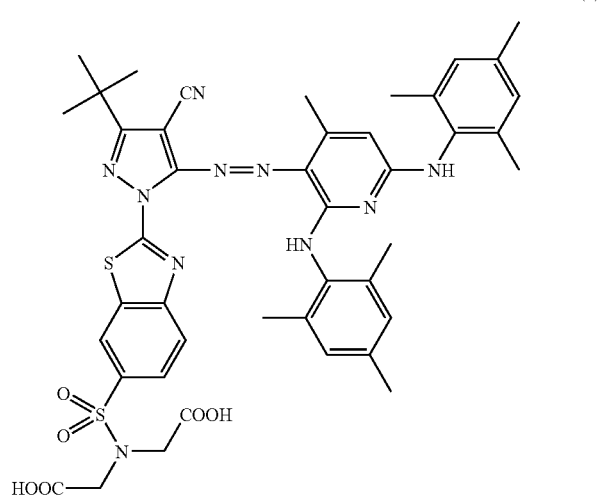

(2)

(3)
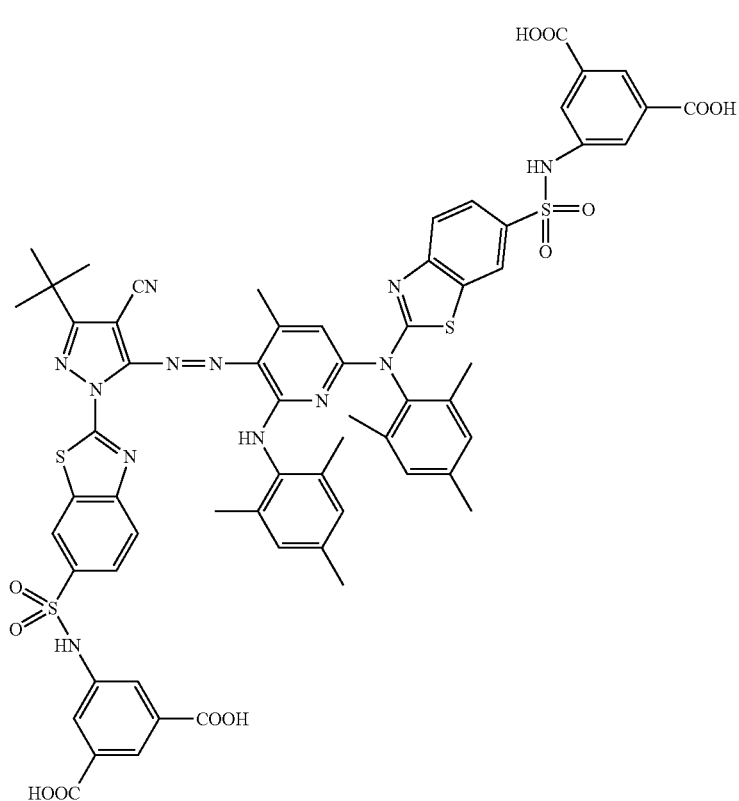
(4)
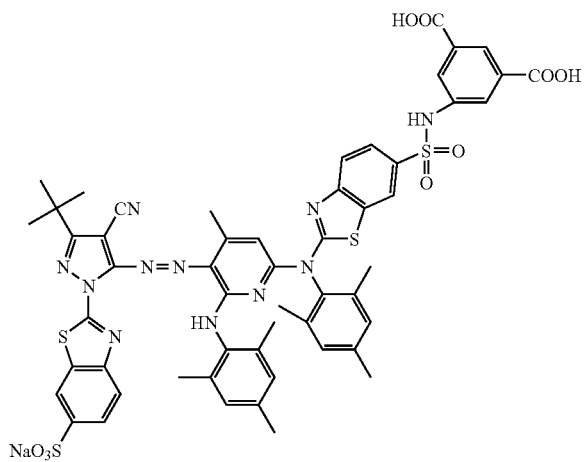
(5)
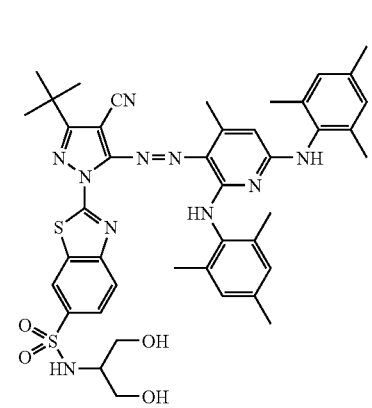

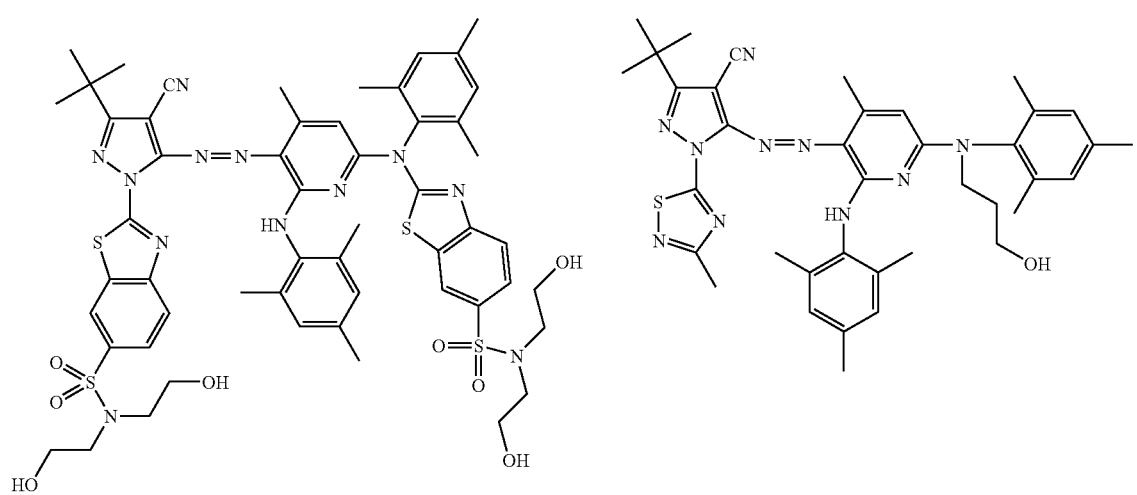
(6)
(7)
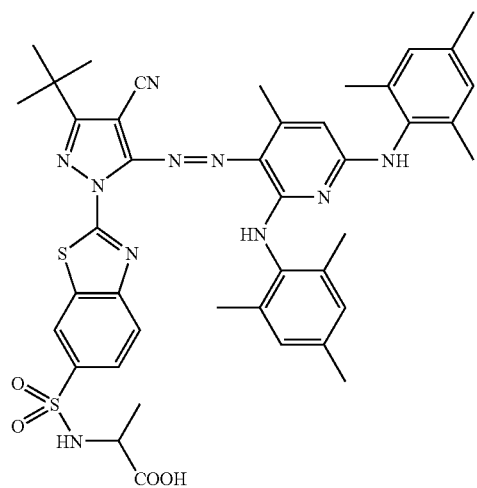
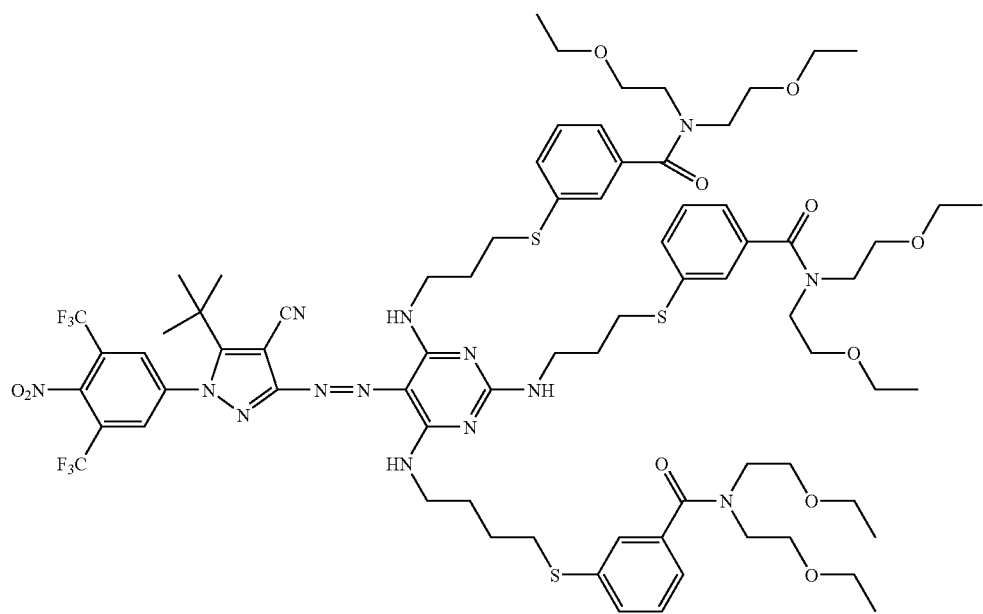
(8)
(9)

-continued
(10)
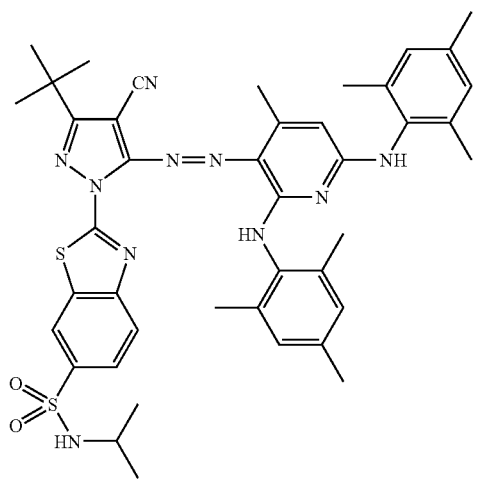
(11)
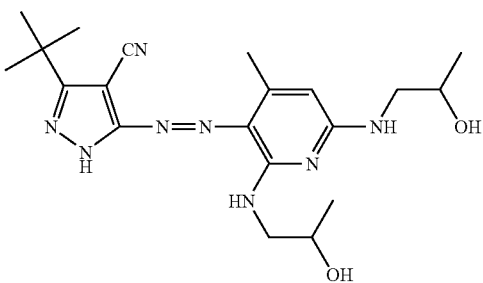
(12)
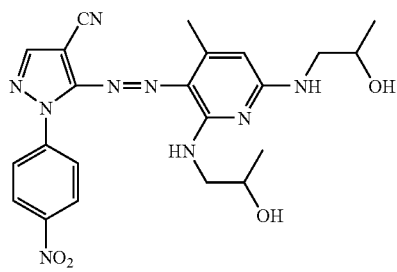
(13)
(14)
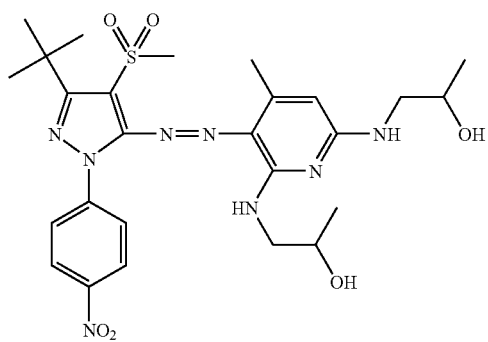
(15)
(16)
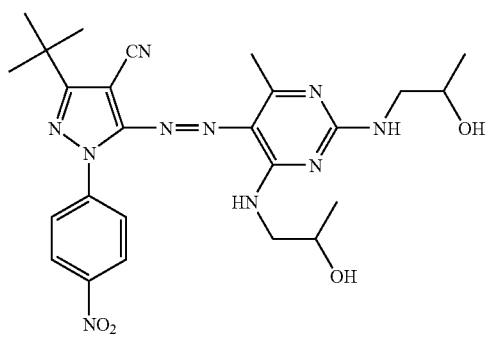
(17)
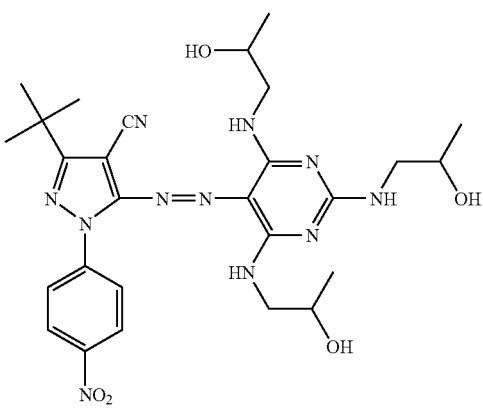

-continued
(18)
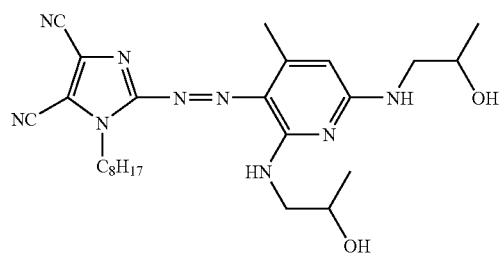
(19)
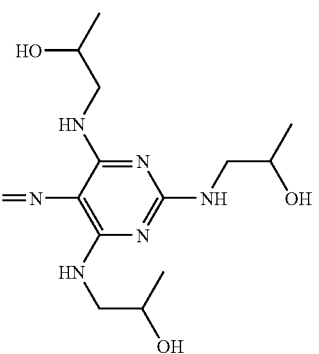
(20)
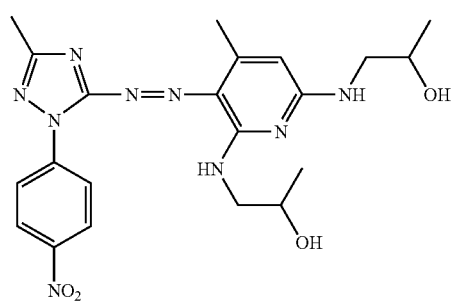
(21)
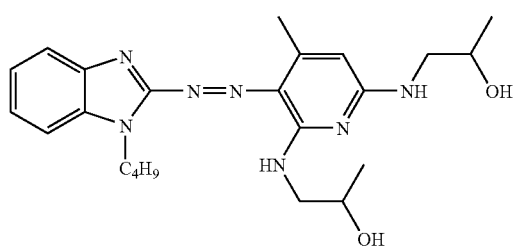
(22)
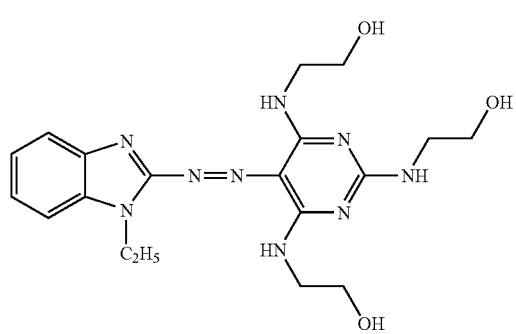
(23)
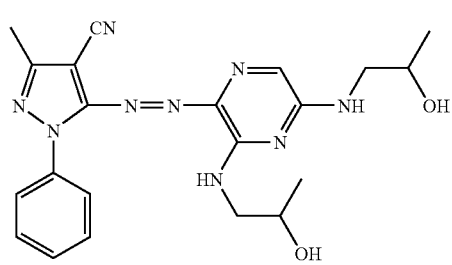
(24)
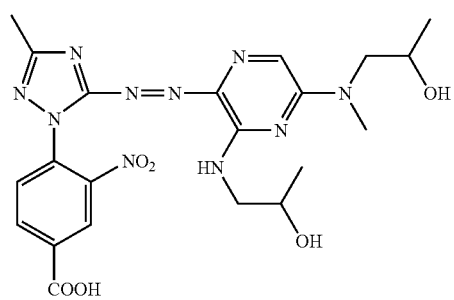
(25)
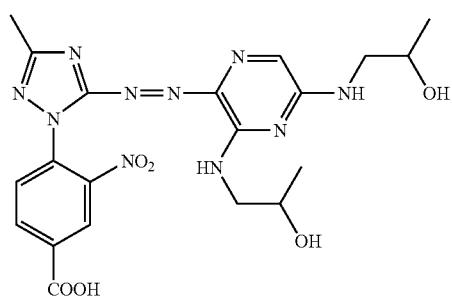
(26)
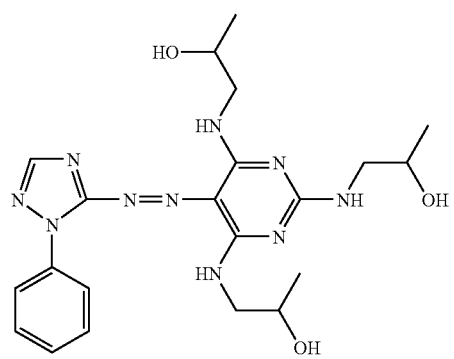
(27)
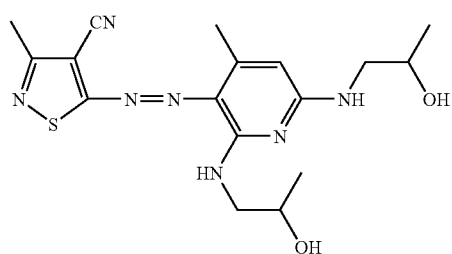

-continued
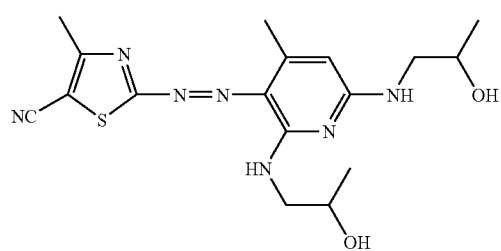
(28)
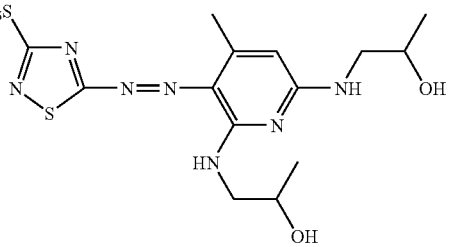
(29)
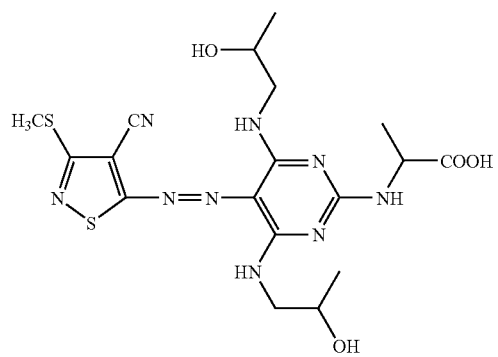
(30)
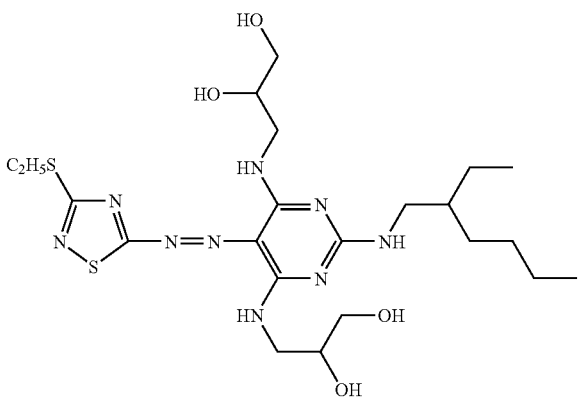
(31)
Hereinafter, specific examples (compounds of the formulae 32 to 63) of the dye (pyridone azo dye) that is represented by formula (II) will be shown. However, in the invention, the examples of the dye are not limited thereto.
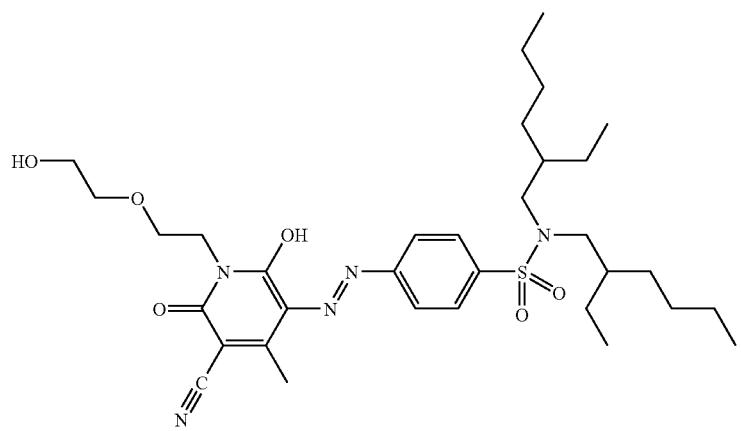
(32)
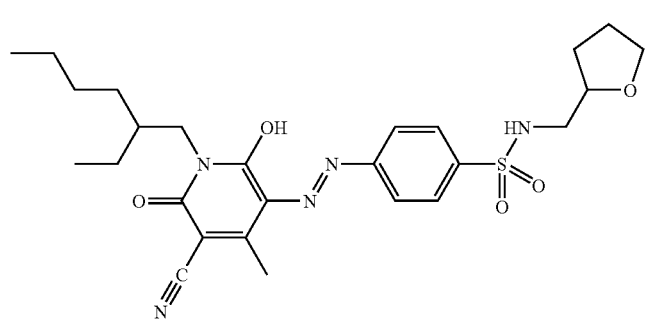
(33)

-continued
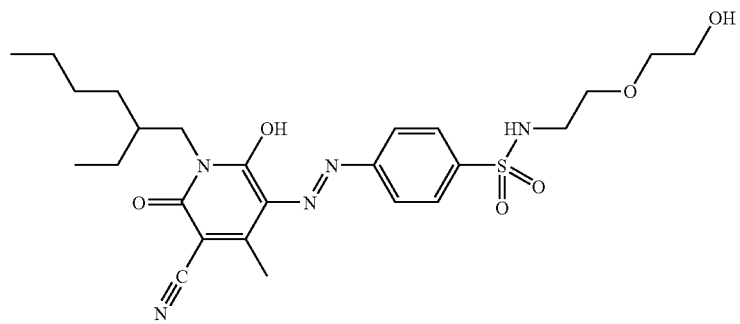
(34)
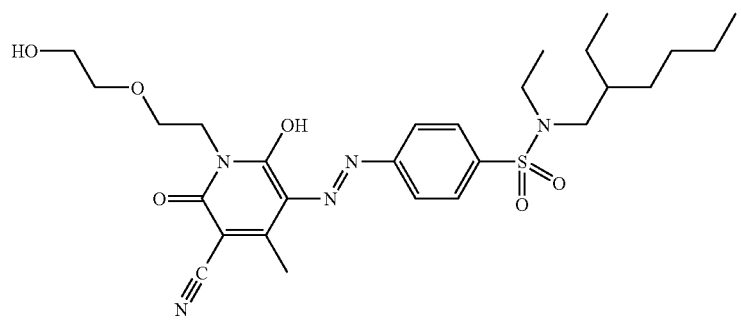
(35)
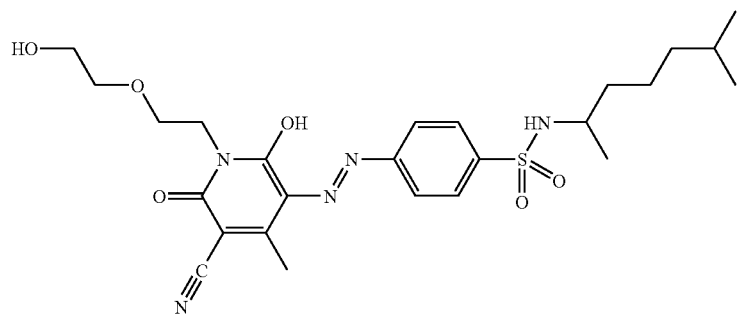
(36)
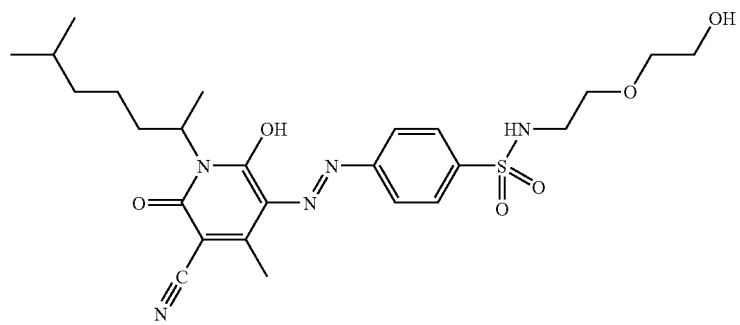
(37)
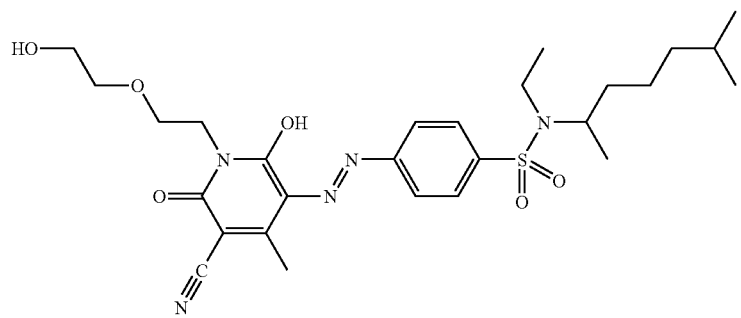
(38)

(39)
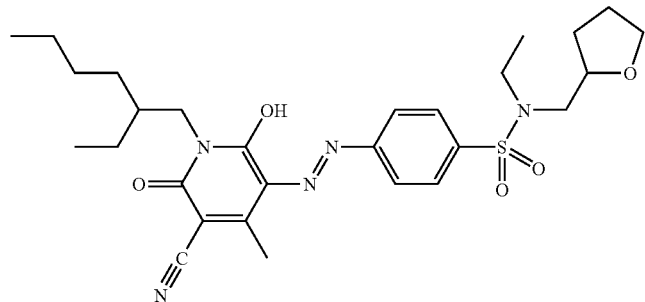
(40)
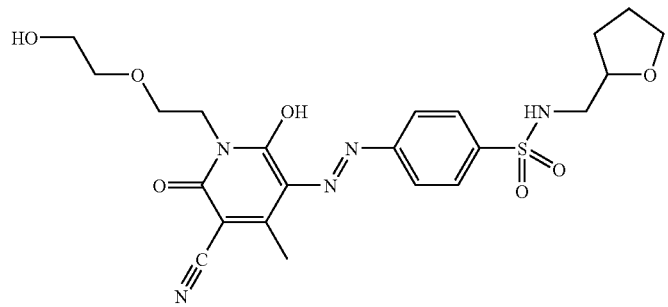
(41)
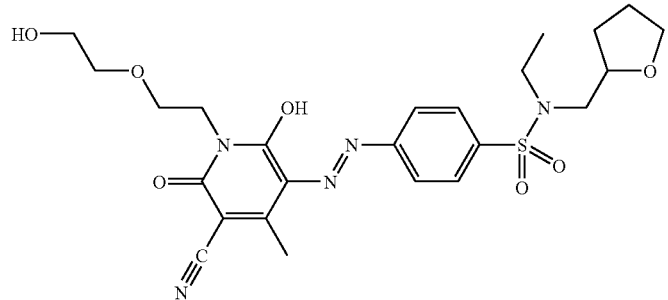
(42)
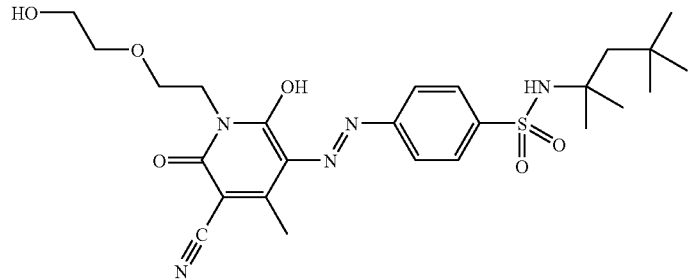
(43)
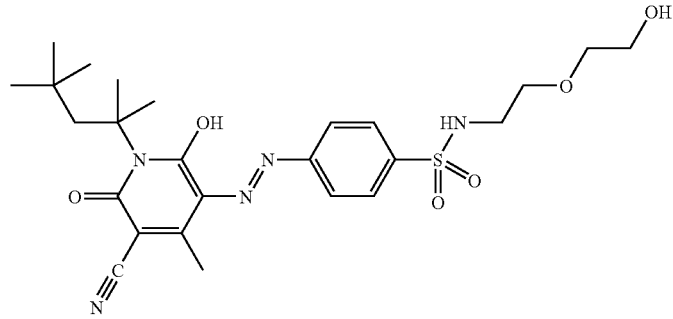

(44)
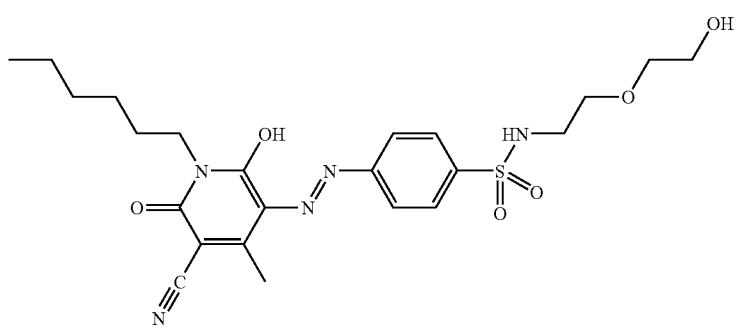
(45)
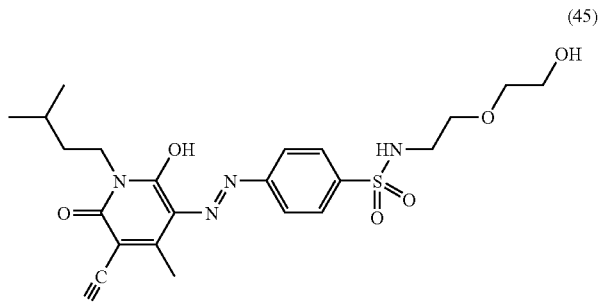
(46)
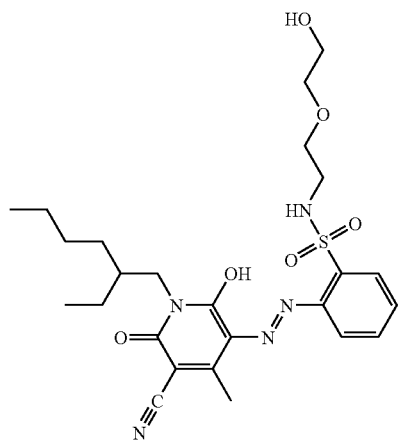
(47)
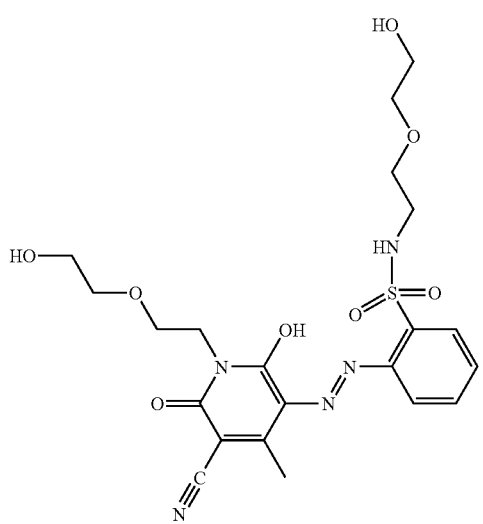
(48)
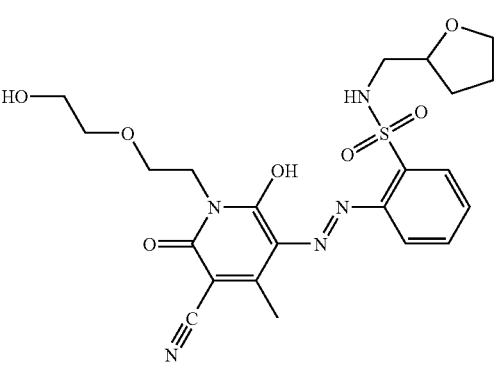

-continued
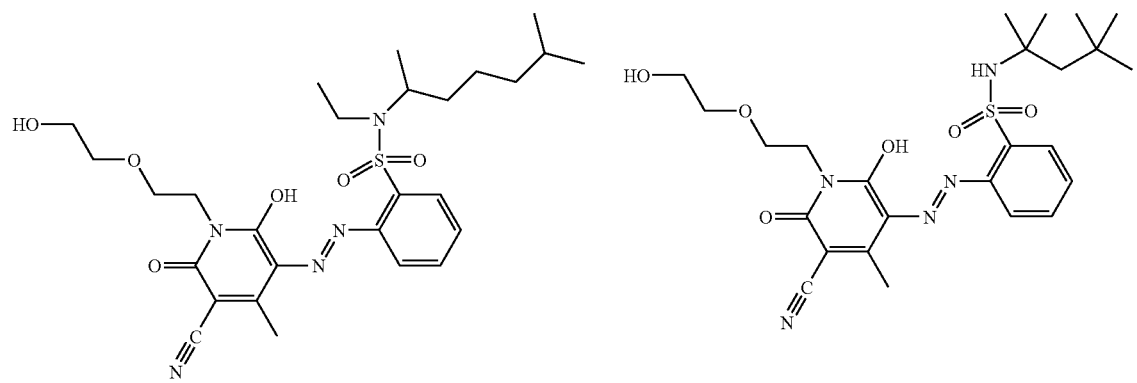
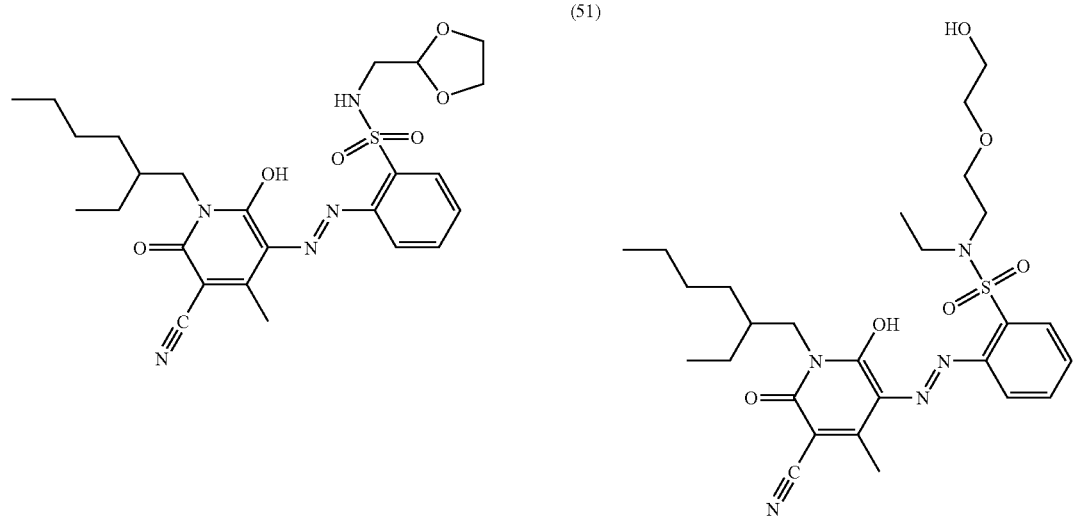
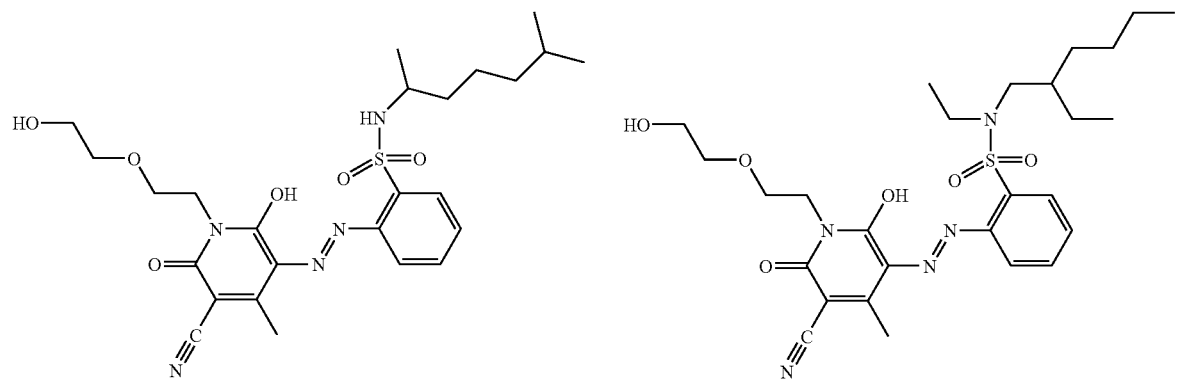

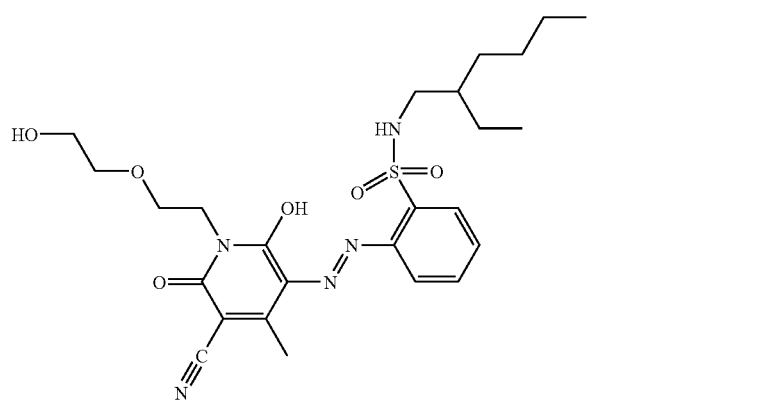
(55)
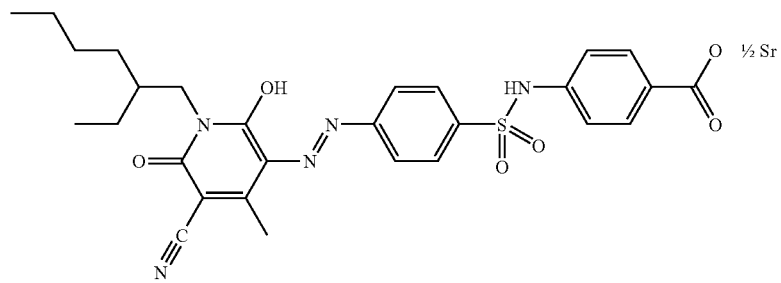
(56)
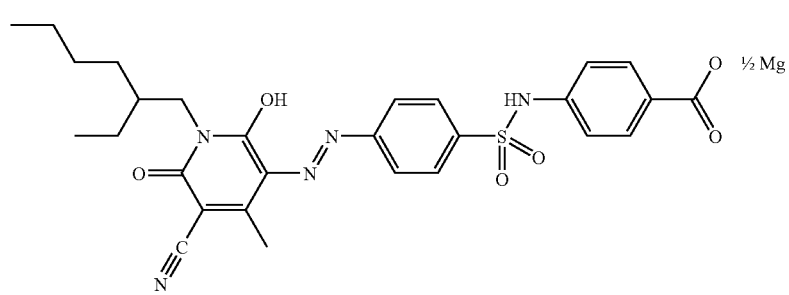
(57)
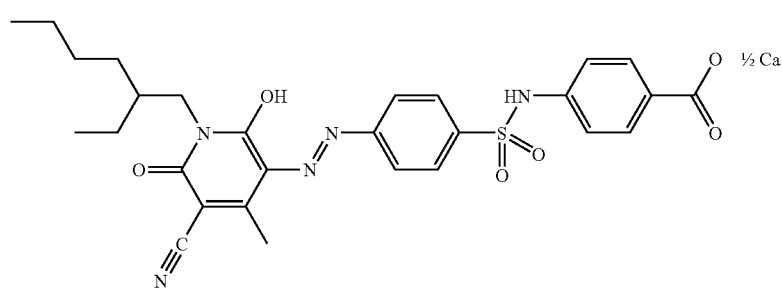
(58)
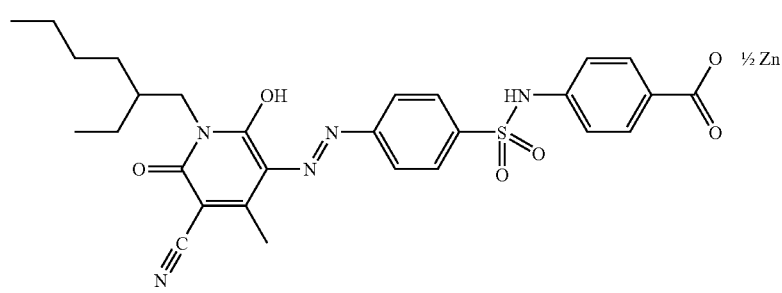
(59)

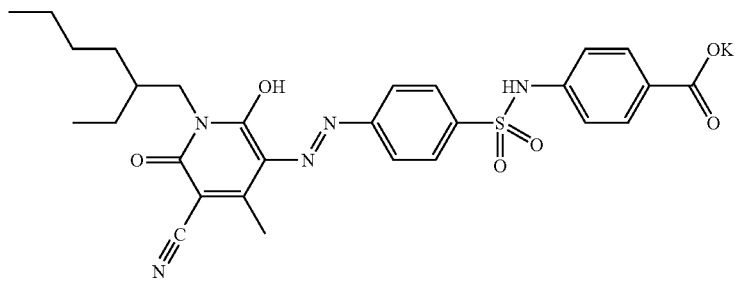
(60)
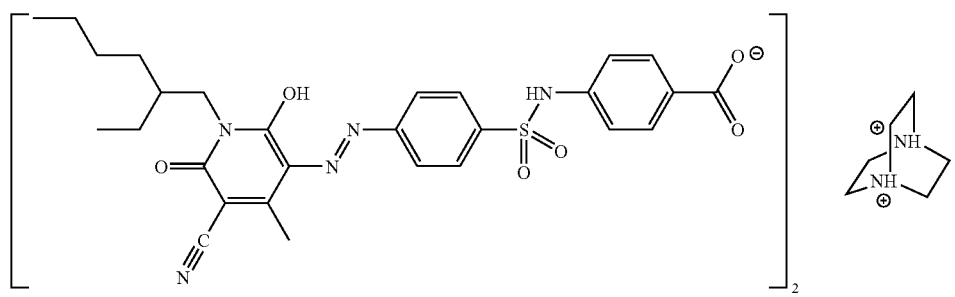
(61)
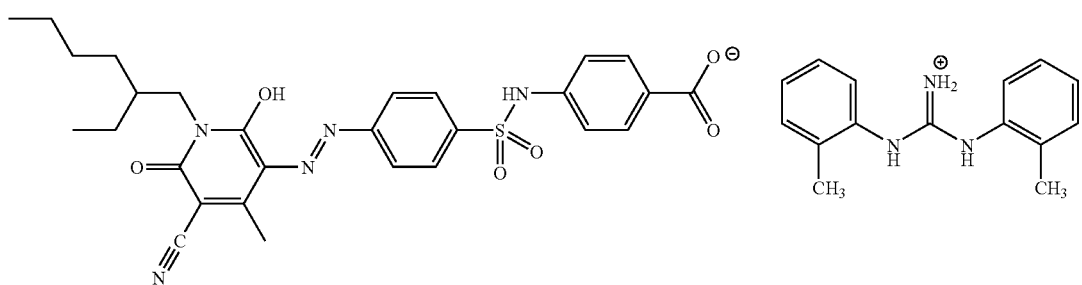
(62)
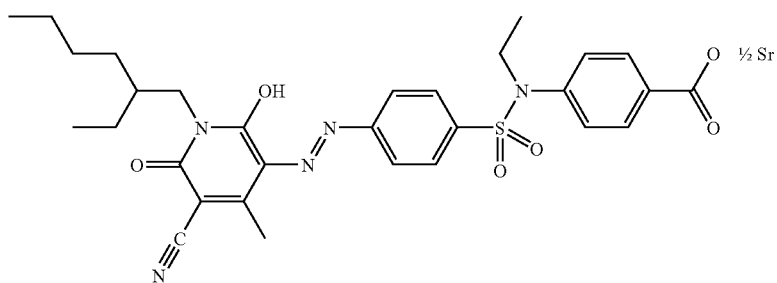
(63)
Hereinafter, specific examples (compounds of the formulae 64 to 74) of the dye (azomethine dye) that is represented by formula (III) will be shown. However, in the invention, the examples of the dye are not limited thereto.

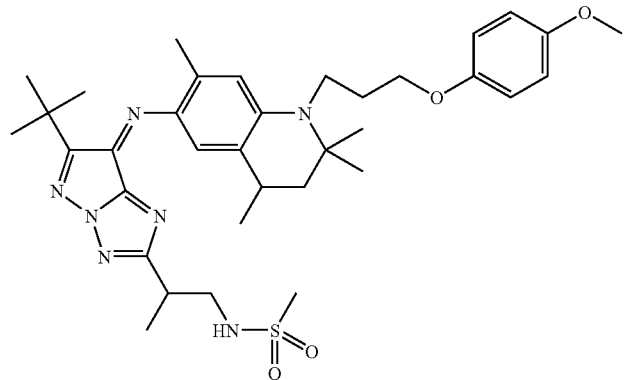
(64)
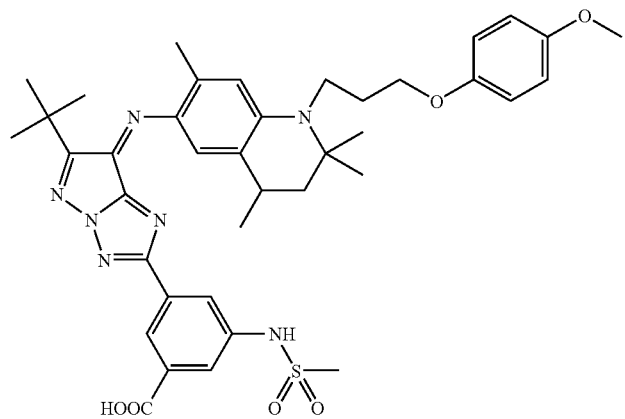
(65)
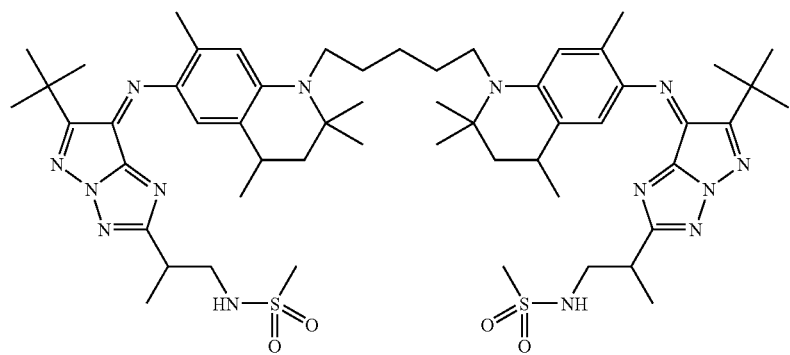
(66)
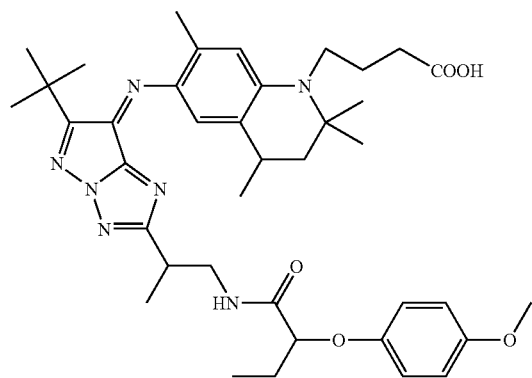
(67)

(68)
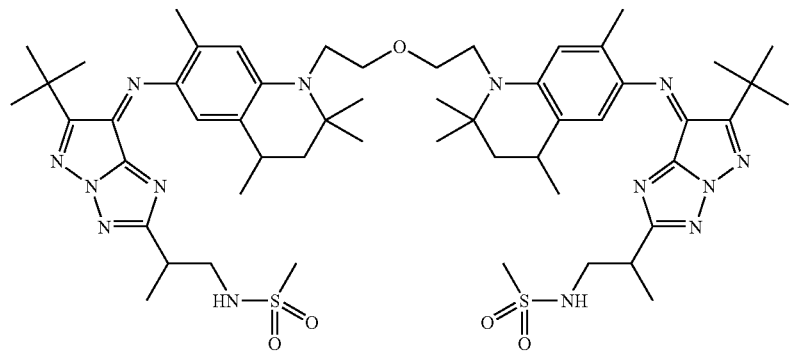
(69)
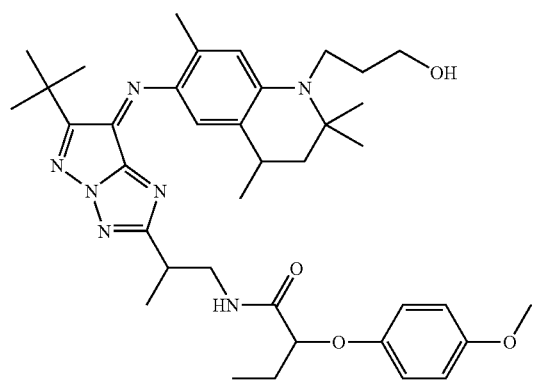
(70)
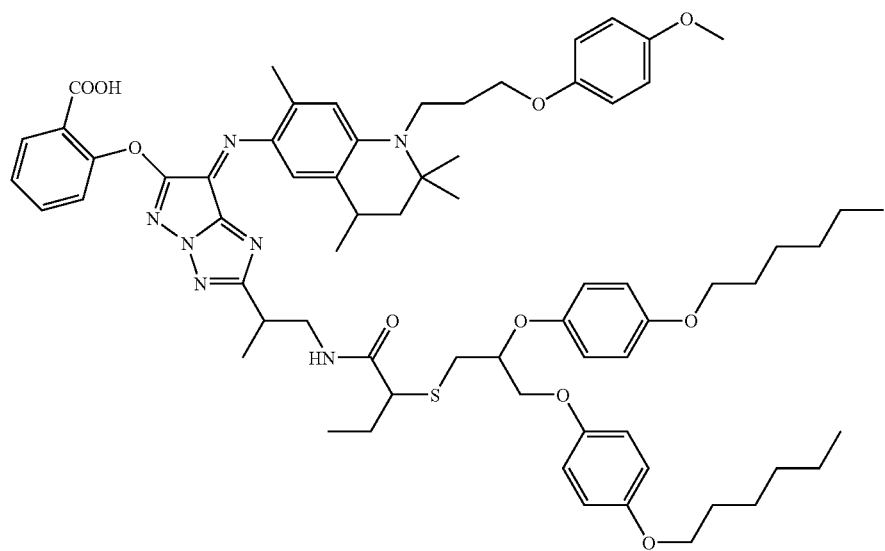

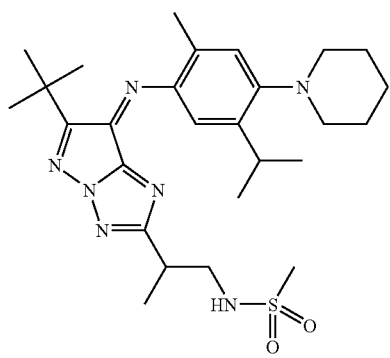
(71)

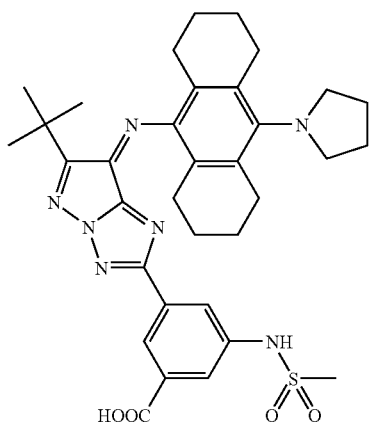
(72)

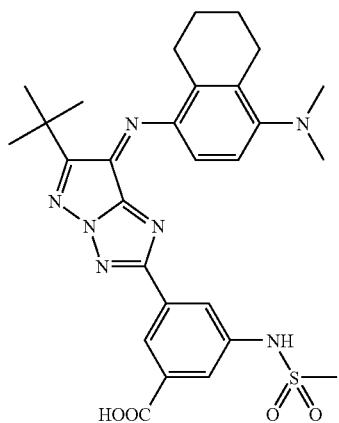
(73)

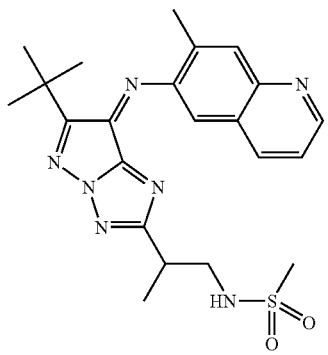
(74)

In respect to the composition of the invention, in a case of a resist system in which development is performed in water or an alkaline solution, an acid dye and/or a derivative thereof may preferably be used from the viewpoint of completely removing the binder and/or the dye by the development.

A direct dye, a basic dye, a mordant dye, an acid mordant dye, an azoic dye, a disperse dye, an oil-soluble dye, a dye for food, and/or derivatives thereof may also be usefully used.

—Acid Dye—

The acid dye will be described below. The acid dye is not particularly limited so long as it is a dye having an acidic group such as a sulfonic acid, a carboxylic acid, or a phenolic hydroxyl group. However, it is preferable to select the acid dye by taking into consideration all of required properties such as solubility in respects to an organic solvent or a developer, formability of a salt with a basic compound, light absorbance, an interaction with any one of other components in the curable composition, light fastness, and heat resistance.

Specific examples of such acid dyes are described below, however the invention is not restricted to these examples. The examples include:

Acid Alzarin violet N;
Acid Black 1, 2, 24, 48;
Acid Blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340;
Acid Chrome violet K;
Acid Fuchsin;
acid Green 1, 3, 5, 9, 16, 25, 27, 50, 58, 63, 65, 80, 104, 105, 106, 109;
Acid Orange 6, 7, 8, 10, 12, 26, 50, 51, 52, 56, 62, 63, 64, 74, 75, 94, 95, 107, 108, 169, 173;
Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, 426;
Acid Violet 6B, 7, 9, 17, 19;
Acid Yellow 1, 3, 7, 9, 11, 17, 23, 25, 29, 34, 36, 38, 40, 42, 54, 65, 72, 73, 76, 79, 98, 99; 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251;
Direct Yellow 2, 33, 34, 35, 38, 39, 43, 47, 50, 54, 58, 68, 69, 70, 71, 86, 93, 94, 95, 98, 102, 108, 109, 129, 136, 138, 141;
Direct Orange 34, 39, 41, 46, 50, 52, 56, 57, 61, 64, 65, 68, 70, 96, 97, 106, 107;
Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250;
Direct Violet 47, 52, 54, 59, 60, 65, 66, 79, 80, 81, 82, 84, 89, 90, 93, 95, 96, 103, 104;
Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293;

Direct Green 25, 27, 31, 32, 34, 37, 63, 65, 66, 67, 68, 69, 72, 77, 79, 82;

Mordant Yellow 5, 8, 10, 16, 20, 26, 30, 31, 33, 42, 43, 45, 56, 50, 61, 62, 65;

Mordant Orange 3, 4, 5, 8, 12, 13, 14, 20, 21, 23, 24, 28, 29, 32, 34, 35, 36, 37, 42, 43, 47, 48;

Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95;

Mordant Violet 2, 4, 5, 7, 14, 22, 24, 30, 31, 32, 37, 40, 41, 44, 45, 47, 48, 53, 58;

Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84;

Mordant Green 1, 3, 4, 5, 10, 15, 19, 26, 29, 33, 34, 35, 41, 43, 53;

Food Yellow 3;

and derivatives of the dyes.

Preferable examples of the acid dye include dyes such as:
Acid Black 24;
Acid Blue 23, 25, 29, 62, 80, 86, 87, 92, 138, 158, 182, 243, 324:1;
Acid Orange 8, 51, 56, 74, 63, 74;
Acid Red 1, 4, 8, 34, 37, 42, 52, 57, 80, 97, 114, 143, 145, 151, 183, 217, 249;
Acid Violet 7;
Acid Yellow 17, 25, 29, 34, 42, 72, 76, 99, 111, 112, 114, 116, 134, 155, 169, 172, 184, 220, 228, 230, 232, 243;
Acid Green 25;
and derivatives of the dyes.

In addition to the above dyes, acid dyes such as an azo series, a xanthene series, a phthalocyanine series are preferable, and acid dyes such as C.I. Solvent Blue 44, 38; C.I. Solvent Orange 45; Rhodamine B; Rhodamine 110; 3-[(5-chloro-2-phenoxyphenyl)hydrazono]-3,4-dihydro-4-oxo-5-[(phenylsulfonyl)amino]-2,7-Naphthalenedisulfonic acid; and derivatives of these dyes are preferably used.

As for the derivatives of acid dyes, an inorganic salt of the acid dye having an acidic group such as a sulfonic acid or a carboxylic acid, a salt of the acid dye with a nitrogen-containing compound, and sulfonamide body of the acid dye and the like may be used. The derivatives are not particularly limited so long as they are soluble in a solution of the curable composition. However, the acid dye is selected by taking into consideration all of the required properties such as solubility in respects to an organic solvent or a developer, light absorbance, an interaction with any other components in the curable composition, light fastness, and heat resistance.

The salt of the acid dye along with the cation containing the nitrogen-containing compound will be described below. A method of forming a salt of the acid dye and the cation containing the nitrogen-containing compound may be effective for improving solubility (provision of solubility in an organic solvent), heat resistance, and light fastness of the acid dye.

The cation containing the nitrogen-containing compound that forms a salt along with the acid dye, and the nitrogen-containing compound that forms an amide bond along with the acid dye will be described below. The nitrogen-containing compound is selected in consideration of the required properties such as solubility of the salt or the amide compound in the organic solvent or the developer, salt forming ability, light absorbance and a color value of the dye, an interaction between the nitrogen-containing compound and any other components in the curable composition, and heat resistance and light fastness required as a coloring agent. A molecular weight of the nitrogen-containing compound is preferably as small as possible when the compound is selected in consideration of only the light absorbance and color value. Among these, the molecular weight is preferably 300 or less, more preferably 280 or less, and particularly preferably 250 or less.

Specific examples of the nitrogen-containing compound will be shown below, however are not limited thereto. The term "cation containing the nitrogen-containing compound" means cations that are formed by protonating the nitrogen-containing compound (among the following compounds, the compound having no —NH— group is not the nitrogen-containing compound used to form the amide bond).

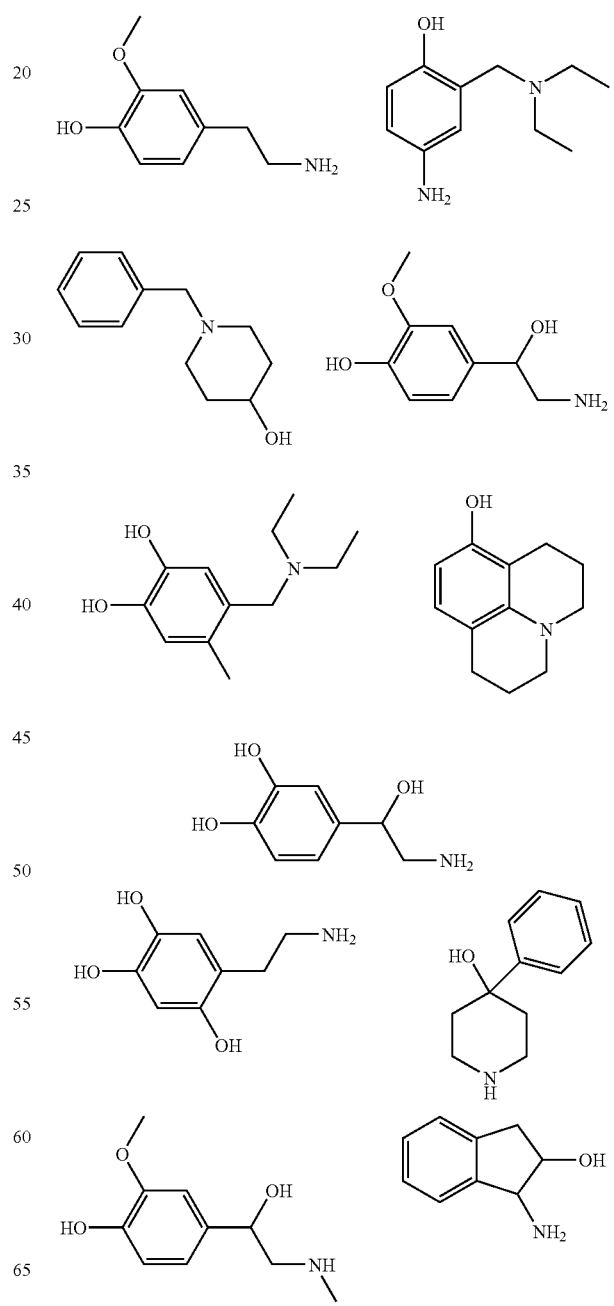

-continued
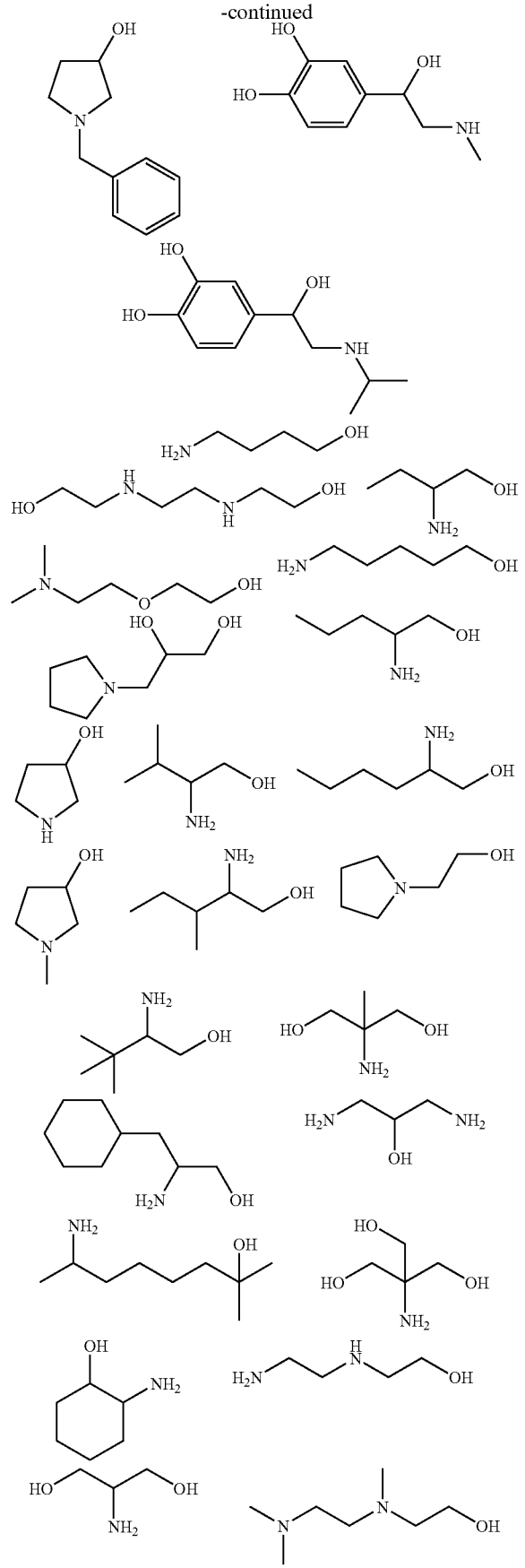
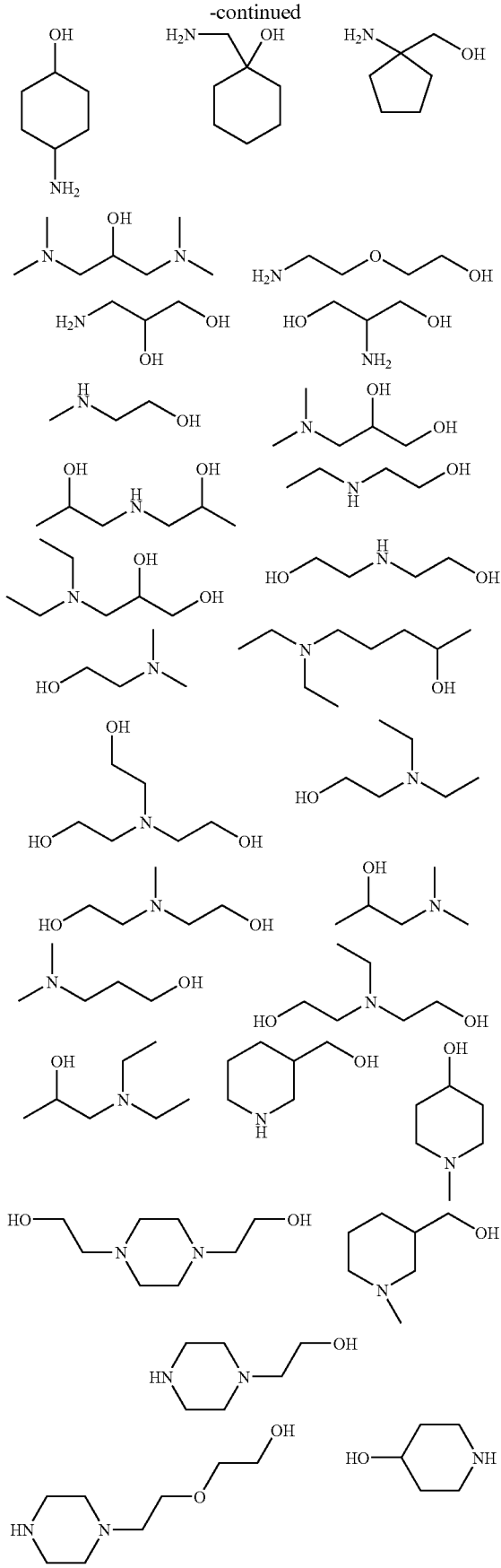

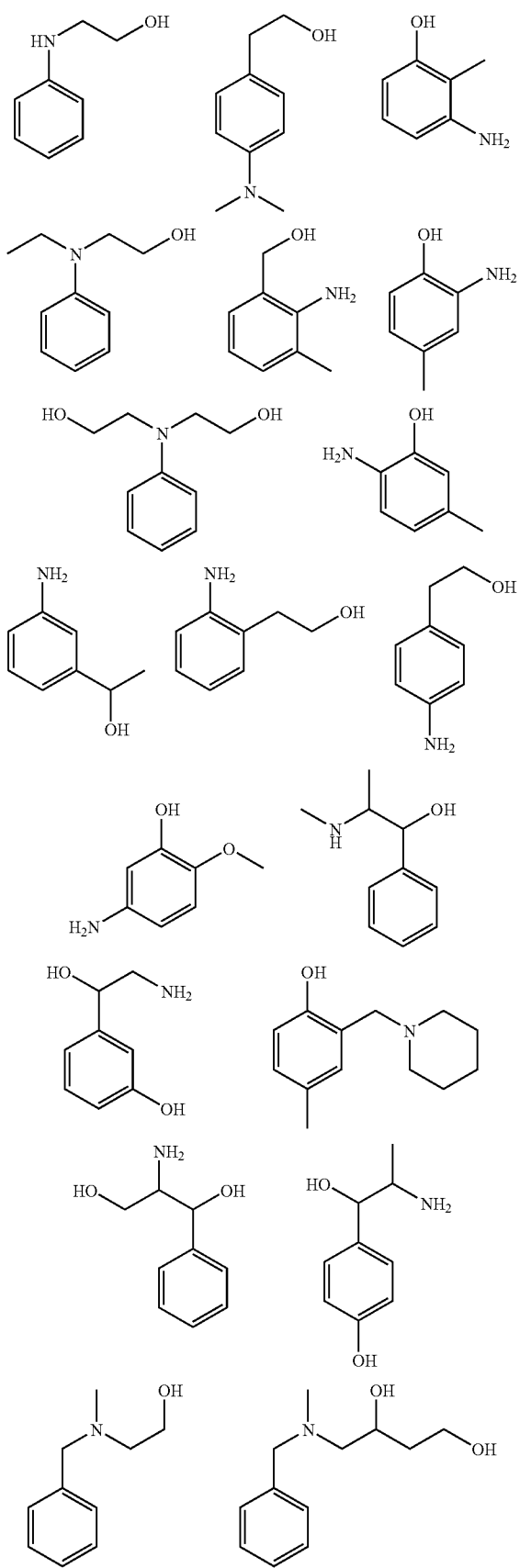
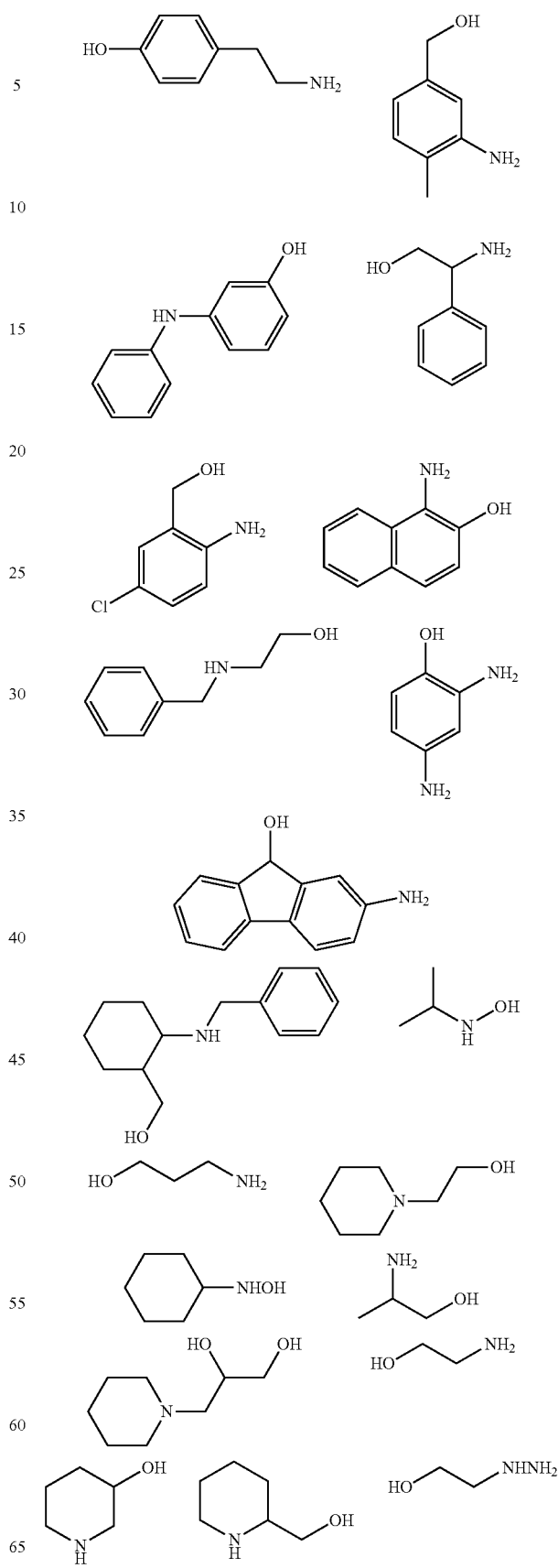

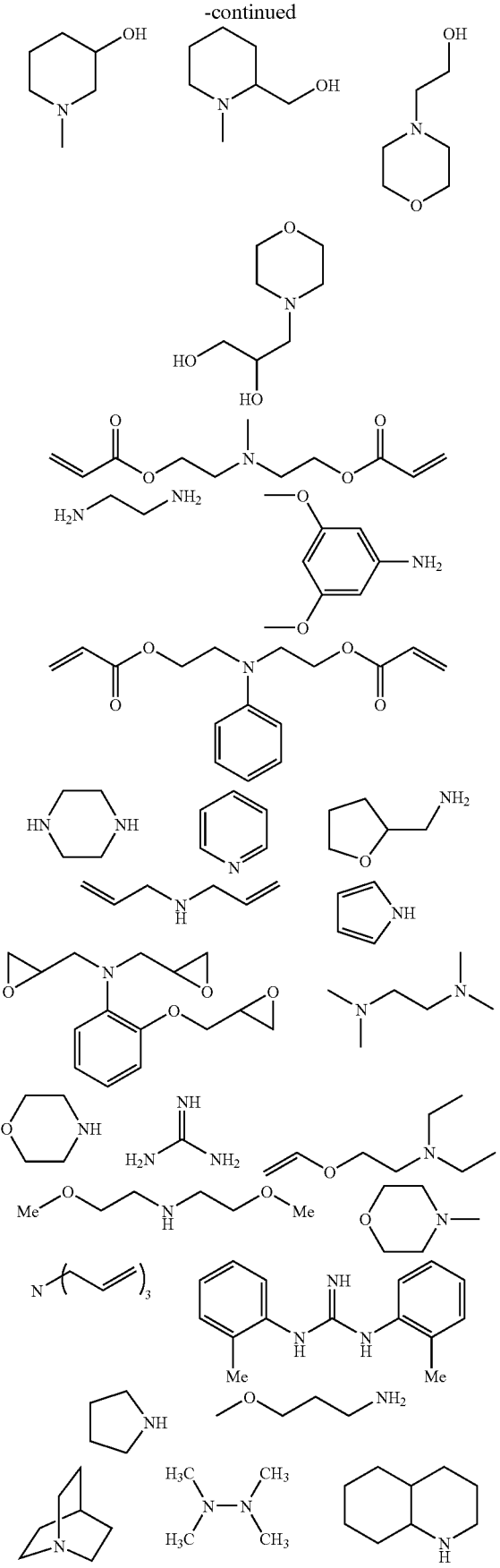

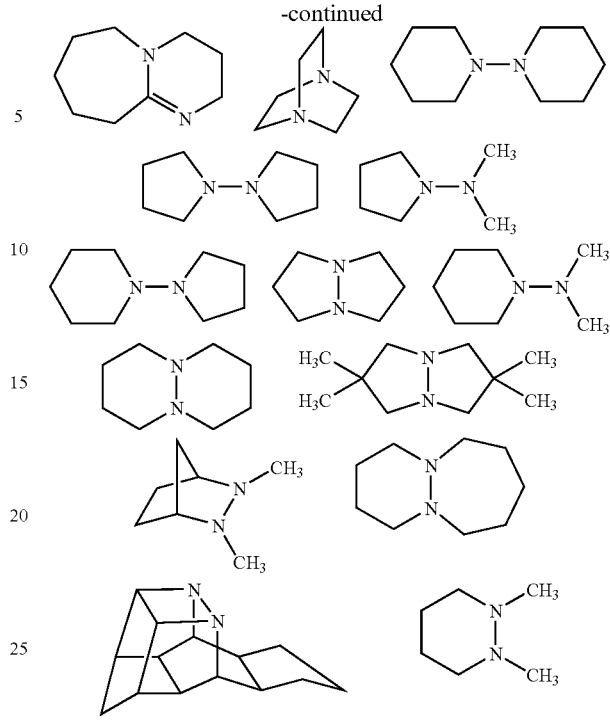

A molar ratio (hereinafter, referred to as "n") of the nitrogen-containing compound to the acid dye in the salt of the acid dye and the cation containing the nitrogen-containing compound will be described below. The molar ratio n denotes a molar ratio of an acid dye molecule to the nitrogen-containing compound as a counter ion. The molar ratio n may be freely selected depending on a salt forming conditions of the acid dye and the amine compound. Specifically, n is a value satisfying the relation of $0<n\leq 5$ of the number of the functional groups in the acid of the acid dye in most practical cases, and may be selected in consideration of all the required properties such as solubility in the organic solvent or the developer, salt forming ability, light absorbance, an interaction with any other components in the curable composition, light fastness, and heat resistance. When n is selected from the viewpoint of only the light absorbance, n satisfies the relation of preferably $0<n\leq 4.5$, more preferably $0<n\leq 4$, and particularly preferably $0<n\leq 3.5$.

Hereinafter, the concentration of the used organic-solvent-soluble dye will be described. In the composition of the invention, the content of the organic-solvent-soluble dye to the total solid content is set to 45% by mass or more in order to obtain both the color concentration enough to achieve slimness and required curability. That is, in a case where the content of the organic-solvent-soluble dye is less than 45% by mass, it is impossible to obtain both the required color concentration and curability. The upper limit of the content of the organic-solvent-soluble dye is not restricted. However, in consideration of the content of the curing agent (C) as described below, it is preferable that the content of the organic-solvent-soluble dye be less than 80.0% by mass. The content of the organic-solvent-soluble dye is preferably 50% by mass or more, more preferably 55% by mass or more, and particularly preferably 65% by mass or more. Specifically, the content of the organic-solvent-soluble dye is more preferably 50.0% by mass or more and less than 75.0% by mass, and particularly preferably 55.0% by mass or more and less than 75.0% by mass.

The composition of the invention is the organic-solvent-soluble dye and preferably contains at least one dye selected from the group consisting of the dyes represented by the formulae (I) to (III) mentioned above and a phthalocyanine-based dye. The organic-solvent-soluble dyes may be combined with each other to form a green or blue composition having a desirable color concentration and hue.

Furthermore, the composition of the invention is the organic-solvent-soluble dye and preferably contains one dye represented by the above formula (I) and one dye represented by the above formula (II). The organic-solvent-soluble dyes may be combined with each other to form a red composition having a desirable color concentration and hue.

The color value of the organic-solvent-soluble dye will be described hereinafter. The term "color value" means a value $\epsilon$/Mw that is obtained by dividing the light absorption coefficient $\epsilon$ of the organic-solvent-soluble dye in ethyl acetate by the molecular weight M of the organic-solvent-soluble dye. When the value is increased, it is possible to ensure high color concentration even when using a small amount of dye.

The composition of the invention is the organic-solvent-soluble dye and preferably contains the dye having the high color value. The color value of the dye is preferably more than 55, more preferably more than 60, particularly preferably more than 70, and most preferably more than 80. In the invention, it is preferable to use at least one dye selected from the group consisting of the above-mentioned dyes that each have the high color value and are represented by the formulae (I) to (III) mentioned above.

The composition of the invention may be a positive type curable composition that is obtained by using a positive type curing method or a negative type curable composition that is obtained by using a negative type curing method. Hereinafter, the composition of the invention that is the negative type curable composition, a binder (B), a curing agent (C), a photosensitive compound (D), a solvent (E), and an additive will be described in detail.

<Negative Type Dye-Containing Curable Composition>
(Binder B)

Hereinafter, the binder that is to be added to the negative type composition of the invention will be described. The binder according to the invention is not particularly restricted so long as it is soluble in an alkali. However, it is preferable that the binder be selected from the viewpoint of heat resistance, development ability, availability and the like.

The alkali-soluble binder is preferably a linear organic high molecular weight polymer that is soluble in an organic solvent and developable with a weak alkali aqueous solution. Examples of the linear organic high molecular weight polymer include a polymer having a carboxylic acid on a side chain, such as a methacrylic acid copolymer, an acrylic acid copolymer, an itaconic acid copolymer, a crotonic acid copolymer, a maleic acid copolymer, and a partially esterified maleic acid copolymer, described, for example, in JP-A No. 59-44615, Japanese Patent Application Publication (JP-B) Nos. 54-34327, 58-12577 and 54-25957, and JP-A Nos. 59-53836 and 59-71048, and an acidic cellulose derivative having a carboxylic acid on a side chain is useful. In addition to the above, a polymer obtained by reacting an acid anhydride with a polymer having a hydroxyl group, a polyhydroxystyrene resin, a polysiloxane resin, poly(2-hydroxyethyl(meth)acrylate), polyvinylpyrrolidone, polyethyleneoxide, and polyvinyl alcohol are also useful.

The alkali-soluble binder may be produced by copolymerizing monomers having hydrophilic groups. Examples of the alkali-soluble binder include alkoxyalkyl(meth)acrylate, hydroxyalkyl(meth)acrylate, glycerol(meth)acrylate, (meth)acrylamide, N-methylolacrylamide, secondary or tertiary alkylacrylamide, dialkylaminoalkyl(meth)acrylate, morpholine(meth)acrylate, N-vinylpyrrolidone, N-vinylcaprolactam, vinylimidazole, vinyltriazole, methyl(meth)acrylate, ethyl(meth)acrylate, branched or straight chain propyl(meth)acrylate, branched or straight chain butyl(meth)acrylate, and phenoxyhydroxypropyl(meth)acrylate.

Furthermore, a monomer having a tetrahydrofurfuryl group, a phosphoric acid, phosphate ester, a quaternary ammonium salt, an ethyleneoxy chain, a propyleneoxy chain, a sulfonic acid or a salt thereof, or a morpholinoethyl group is also useful as the monomer having a hydrophilic group.

Further, in view of improving a crosslinking efficiency, a polymerizable group is preferably included in the side chain of the binder of the invention, and polymers and the like which contain an allyl group, a (meth)acryl group, an allyloxyalkyl group, or the like in the side chain thereof are also useful. Examples of the polymers containing these polymerizable groups are given below, however not limited to these, provided that an alkali soluble group, such as a COOH group, an OH group, and an ammonium group, and a carbon-carbon unsaturated bond, are included therein.

As the above-mentioned polymer, a compound which is obtained by reacting a compound having an epoxy ring, which has a predetermined reactivity to an OH group, and a compound having a carbon-carbon unsaturated bond group, such as glycidyl acrylate, along with a copolymer which is composed of a monomer having an OH group, such as 2-hydroxyethylacrylate, a monomer having a COOH group, such as methacrylic acid, and a monomer which is copolymerizable with the monomer having an OH group and the monomer having a COOH group, such as an acryl compound, a vinyl compound or the like, may be used. For the reaction to the OH group, a compound having an acid anhydride, an isocyanate group, and an acryloyl group may be used in place of the epoxy ring. Further, a reaction product which is obtained by reacting a saturated- or unsaturated-polybasic acid anhydride in conjunction with a compound obtained by reacting a compound having an epoxy ring and an unsaturated carboxylic acid, such as an acrylic acid, as disclosed in JP-A Nos. 6-102669 and 6-1938 may also be used.

Examples of a compound which has both an alkali soluble group such as a COOH group and a carbon-to-carbon unsaturated group include DIANAL NR series (manufactured by Mitsubishi Rayon Co., Ltd.), a COOH group containing polyurethane acrylic oligomer (trade name: PHOTOMER 6173, manufactured by Diamond Shamrock Co., Ltd.), VISCOAT R-264 and KS RESIST 106 (manufactured by Osaka Organic Chemical Industry Ltd.), CYCLOMER P series and PRAXEL CF200 series (manufactured by Daicel Chemical Industries, Ltd.), EBECRYL 3800 (manufactured by Daicel-UCB Co., Ltd.).

Among these various kinds of binders, preferable examples of the alkali soluble binder, which is capable of being used in the invention and is preferable from the viewpoint of heat resistance, include a polyhydroxystyrene resin, a polysiloxane resin, an acrylic resin, an acrylamide resin, and an acryl/acrylamide copolymer resin, and more preferable examples thereof include the acrylic resin, the polyhydroxystyrene resin, and the polysiloxane resin. In addition, from the viewpoint of control of developability, an acryl resin, an acrylamide resin, and an acryl/acrylamide copolymer resin are preferable. Preferable examples of the acrylic resin include a copolymer consisting of monomers selected from a benzyl(meth)acrylate, a (meth)acryl acid, hydroxyethyl (meth)acrylate, (meth)acrylamide, and the like, and a (meth)acrylic resin having a polymerizable side-chain, such as CYCLOMER P series, PRAXEL CF200 series (manufactured by Daicel Chemical Industries, Ltd.), EBECRYL 3800 (manufactured by Daicel-UCB Co., Ltd.), DIANAL NR series (manufactured by Mitsubishi Rayon Co., Ltd.), VISCOAT R264 and KS RESIST 106 (manufactured by Osaka Organic Chemical Industry Ltd.).

Particularly preferable examples of the binder in the invention include the (meth)acrylic resin having the alkali-soluble polymerizable side-chain.

In addition, in view of enhancing a strength of a cured film, alcohol-soluble nylon, polyether formed from 2,2-bis-(4-hydroxyphenyl)-propane and epichlorhydrine, and the like are also useful as the binder.

In addition, examples of the binder to be used in the invention include an alkali soluble phenolic resin. The alkali soluble phenolic resin may be preferably used when the composition of the invention is formed of a positive type composition. Examples of the alkali soluble phenolic resin include a novolak resin, a vinyl polymer.

Examples of the novolak resin include a novolak resin which is obtained by condensing phenols and aldehydes in the presence of an acidic catalyst. Examples of the phenols include phenol, crezol, ethyl phenol, butyl phenol, xylenol, phenyl phenol, catechol, rezorcinol, pyrogallol, naphthol, bisphenol A. The phenols may be used alone or in combination of two or more of them.

Examples of the aldehydes include formaldehyde, paraformaldehyde, acetaldehyde, propyonic aldehyde, benzaldehyde.

Specific examples of the novolak resin include a condensation product of metacrezol, paracrezol, or a mixture of these and formalin. A molecular weight distribution of the novolak resin may be adjusted by means such as fractionation. In addition, a low-molecular weight component having a phenolic hydroxyl group, such as bisphenol C or bisphenol A, may be mixed with the above-mentioned novolak resin.

The weight-average molecular weight, measured by a GPC method using polystyrene standard, of the binder is preferably 1,000 to $2 \times 10^5$ polymers, more preferably 2,000 to $1 \times 10^5$ polymers, and particularly preferably 3,000 to $5 \times 10^4$ polymers.

The content of the binder in respects to the total solid content in the composition of the invention is preferably determined by using a relation to a curing agent (C) as described below.

(Cross-Linking Agent)

Hereinafter, a cross-linking agent will be described. The composition of the invention contains at least the organic-solvent-soluble dye (A) and the curing agent (C), and the contents of the organic-solvent-soluble dye and the curing agent in respects to the total solid content are set. The film is highly cured while the color concentration is high even though thinness is achieved. Accordingly, it is possible to obtain the film having acceptable curability. In respects to this, it is possible to obtain the still more highly cured film by using the cross-linking agent. The cross-linking agent usable in the invention is not limited as long as the curing of the film is capable of being performed by using a cross-linking reaction. Examples thereof include (i) epoxy resins, (ii) melamine compounds, guanamine compounds, glycoluryl compounds, or urea compounds that are substituted with at least one substituent group selected from a methylol group, an alkoxymethyl group, and an acyloxymethyl group; and (iii) phenol compounds, naphthol compounds, or hydroxyanthracene compounds that are substituted with at least one substituent group selected from a methylol group, an alkoxymethyl group, and an acyloxymethyl group. Particularly preferable examples of the cross-linking agent include a polyfunctional epoxy resin.

The epoxy resin of the component (i) in the invention is not limited as long as it has an epoxy group and a cross-linking property. Examples thereof include divalent glycidyl group-containing low molecular compounds, such as bisphenol-A-diglycidyl ether, ethylene glycol diglycidyl ether, butanediol diglycidyl ether, hexanediol diglycidyl ether, dihydroxybiphenyl diglycidyl ether, diglycidyl ether phthalate, and N,N-diglycidylaniline; trivalent glycidyl group-containing low molecular compounds, such as trimethylolpropane triglycidyl ether, trimethylolphenol triglycidyl ether, and Tris P-PA triglycidyl ether; tetravalent glycidyl group-containing low molecular compounds, such as pentaerythritol tetraglycidyl ether, and tetramethylolbisphenol-A-tetraglycidyl ether; polyvalent glycidyl group-containing low molecular compounds, such as dipentaerythritol pentaglycidyl ether and dipentaerythritol hexaglycidyl ether; and glycidyl group-containing polymer compounds, such as polyglycidyl(meth)acrylate and an adduct obtained by adding 1,2-epoxy-4-(2-oxyranyl)cyclohexane to 2,2-bis(hydroxymethyl)-1-butanol.

The number of methylol groups, alkoxymethyl groups and acyloxymethyl groups contained in the component (ii) is 2 to 6 in the case of a melamine compound, and 2 to 4 in the case of a glycoluryl compound, a guanamine compound or an urea compound. Preferably, the number is 5 to 6 in the case of a melamine compound, and 3 to 4 in the case of a glycoluryl compound, a guanamine compound or an urea compound.

A methylol group-containing compound may be obtained by heating the alkoxymethyl group-containing compound in alcohol in the presence of an acidic catalyst such as hydrochloric acid, sulfuric acid, nitric acid, or methanesulfonic acid. An acyloxymethyl group-containing compound may be obtained by mixing the methylol group-containing compound with acyl chloride in the presence of a basic catalyst.

Specific examples of the compound having the substituent group that is contained in the component (ii) will be described hereinafter.

Examples of the melamine compound include hexamethylolmelamine, hexamethoxymelamine, compounds obtained by methoxy-methylating 1 to 5 methylol groups of hexamethylolmelamine and mixtures thereof, hexamethoxyethylmelamine, hexaacyloxymethylmelamine, and compounds obtained by acyloxy-methylating 1 to 5 methylol groups of hexamethylolmelamine and mixtures thereof.

Examples of the guanamine compound include tetramethylolguanamine, tetramethoxymethylguanamine, compounds obtained by methoxy-methylating 1 to 3 methylol groups of tetramethylolguanamine and mixtures thereof, tetramethoxyethylguanamine, tetraacyloxymethylguanamine, and compounds obtained by acyloxy-methylating 1 to 3 methylol groups of tetramethylolguanamine and mixtures thereof.

Examples of the glycoluryl compound include tetramethylolglycoluryl, tetramethoxymethylglycoluryl, compounds obtained by methoxy-methylating 1 to 3 methylol groups of tetramethylolglycoluryl and mixtures thereof, and compounds obtained by acyloxy-methylating 1 to 3 methylol groups of tetramethylolglycoluryl and mixtures thereof.

Examples of the urea compound include tetramethylolurea, tetramethoxymethylurea, compounds obtained by methoxy-methylating 1 to 3 methylol groups of tetramethylolurea and mixtures thereof, and tetramethoxyethylurea. One of these may be used alone, or two or more of them may be used together.

When a phenol compound, a naphthol compound or a hydroxyanthracene compound is substituted with at least one group selected from a methylol group, an alkoxymethyl group and an acyloxymethyl group contained as the component (iii), it is possible to prevent inter-mixing in respects to an uppercoat photoresist due to thermal cross-linking, and to further improve a film strength, as in the component (ii).

It is preferable that the component (iii) contain at least two substituent groups selected from methylol, acyloxymethyl, and alkoxymethyl groups in one molecule. From the viewpoints of thermal cross-linking property and storage stability, the phenol compound preferably has the substituent groups at 2- and 4-positions.

Moreover, the naphthol and hydroxyanthracene compounds that constitute a skeletal structure preferably have the substituent groups at all ortho- and para-positions with respect to the OH group.

The phenol compound that constitutes the skeletal structure may or may not have a substituent group at 3- or 5-position. The naphthol compound that constitutes the skeletal structure may or may not have a substituent group or substituent groups at positions other than the ortho positions with respect to the OH group.

A methylol group-containing compound may be obtained by reacting a compound having a hydrogen atom at an ortho- or para-position (2- or 4-position) with respect to a phenolic OH group and serving as a raw material and formalin in the presence of a basic catalyst, such as sodium hydroxide, potassium hydroxide, ammonia, or tetraalkyl ammonium hydroxide.

An alkoxymethyl group-containing compound may be obtained by heating the methylol group-containing compound in alcohol in the presence of an acidic catalyst such as hydrochloric acid, sulfuric acid, nitric acid, or methanesulfonic acid.

An acyloxymethyl group-containing compound may be obtained by reacting the methylol group-containing compound and acyl chloride in the presence of a basic catalyst.

Examples of the skeleton compound include a phenol compound, a naphthol compound, and a hydroxyanthracene compound each having no substituent group at the ortho- or para-position with respect to the phenolic OH group. Specific examples thereof include phenol, isomers of cresol, 2,3-xylenol, 2,5-xylenol, 3,4-xylenol, 3,5-xylenol, bisphenols such as bisphenol A, 4,4'-bishydroxybiphenyl, Tris P-PA (manufactured by Honshu Chemical Industry Co., Ltd.), naphthol, dihydroxynaphthalene and 2,7-dihydroxyanthracene.

Specific examples of the component (iii) include trimethylolphenol, tri(methoxymethyl)phenol, compounds obtained by methoxy-methylating 1 to 2 methylol groups of trimethylolphenol, trimethylol-3-cresol, tri(methoxymethyl)-3-cresol, compounds obtained by methoxy-methylating 1 to 2 methylol groups of trimethylol-3-cresol, dimethylol cresol such as 2,6-dimethylol-4-cresol, tetramethylolbisphenol-A, tetramethoxymethylbisphenol-A, compounds obtained by methoxy-methylating 1 to 3 methylol groups of tetramethylolbisphenol-A, tetramethylol-4,4'-bishydroxybiphenyl, tetramethoxymethyl-4,4'-bishydroxybiphenyl, a hexamethylol compound of Tris P-PA, a hexamethoxymethyl compound of Tris P-PA, compounds obtained by methoxy-methylating 1 to 5 methylol groups of the hexamethylol compound of Tris P-PA, and bishydroxymethylnaphthalenediol.

Examples of the hydroxyanthracene compound include 1,6-dihydroxymethyl-2,7-dihydroxyanthracene.

Examples of the acyloxymethyl group-containing compound include compounds obtained by acyloxy-methylating a part or all of the methylol groups of the aforementioned methylol group-containing compounds.

Among those compounds, preferable examples thereof include trimethylolphenol, bishydroxymethyl-p-cresol, tetramethylolbisphenol A, a hexamethylol compound of Tris P-PA (manufactured by Honshu Chemical Industry Co., Ltd.), or a phenol compound obtained by changing the methylol groups of these compounds to alkoxymethyl groups. One of these may be used alone, or two or more of them may be used together.

Contents of the components (i) to (iii) of the dye-containing curable composition of the invention depend on the type of material. However, the content is preferably 0.01 to 10% by mass, more preferably 0.1 to 8% by mass, and particularly preferably 1 to 7% by mass based on the total solid content.

(Curing Agent (C))

Next, the curing agent that is contained in the composition of the invention (hereinafter, referred to as "monomer") will be described. Preferable examples of the monomer include a compound that has a boiling point of 100° C. or more at a normal pressure state where at least one addition polymerizable ethylene group is provided. Examples thereof include monofunctional acrylates and methacrylates such as polyethylene glycol mono(meth)acrylate, polypropylene glycol mono(meth)acrylate, and phenoxyethyl (meth)acrylate;

polyfunctional acrylates and methacrylates such as polyethylene glycol di(meth)acrylate, trimethylolethane tri(meth)acrylate, neopentyl glycol di(meth)acrylate, pentaerythrytol tri(meth)acrylate, pentaerythrytol tetra(meth)acrylate, dipentaerythrytol penta(meth)acrylate, dipentaerythrytol hexa(meth)acrylate, hexanediol(meth)acrylate, trimethylolpropane tri(acryloyloxypropyl)ether, tri(acryloyloxyethyl)isocyanurate, products obtained by adding ethylene oxide or propylene oxide to multifunctional alcohols, such as glycerine or trimethylolethane, and (meth)acrylating the resultant adducts, urethane acrylates disclosed in JP-B Nos. 48-41708 and 50-6034, and JP-A No. 51-37193, polyester acrylates disclosed in JP-A No. 48-64183, and JP-B Nos. 49-43191 and 52-30490, epoxy acrylates including reaction products of epoxy resin and (meth)acrylic acid; and mixtures thereof. Alternatively, the polymerizable monomer may also be photocurable monomer or oligomer described in Journal of The Adhesion Society of Japan, vol. 20, No. 7, pages 300 to 308.

As the above-mentioned curing agent (monomer), the (meth)acrylic ester monomer is preferable, and the quadrifunctional- or higher functional (meth)acrylic ester monomer is particularly preferable.

In respects to the dye-containing curable composition, curability is improved at a high concentration of dye as content of the monomer is increased in respects to the total solid content. Accordingly, in the composition of the invention, the content of the curing agent (monomer) is 20% by mass or more and 55% by mass or less based on the total solid content. If the content of the curing agent is less than 20% by mass, insufficient curing occurs and bleaching of the dye occurs in an exposed portion. Therefore, it is difficult to form a desired pattern. If the content of the curing agent is more than 55% by mass, insufficient color concentration occurs due to the reduced dye concentration and bleaching of the dye occurs in the exposed portion. Thus, it is difficult to form a desired pattern. The content of the curing agent is more preferably more than 25% by mass and 55% by mass or less, and particularly preferably more than 30% by mass and 55% by mass or less.

It is preferable that a weight ratio (C)/(B) of the curing agent (C) to the binder (B) be high in views of high curability.

The weight ratio is more than preferably 2.0, more preferably 2.25, still more preferably 2.5, particularly preferably 3.0, and most preferably 5.0.

(Photosensitive Compound (D))

Next, a photosensitive compound that is used when the composition of the invention is a negative type composition will be described. The photosensitive compound is not limited as long as it is capable of polymerizing the above-mentioned curing agent (monomer having the polymerization property). However, it is preferable that the photosensitive compound be selected in consideration of properties, initiation efficiency, absorption wavelength, availability, and cost. Examples of the photosensitive compound include a photopolymerization initiator or a photoacid generator. Particularly preferable examples thereof include the photopolymerization initiator.

Examples of the photopolymerization initiator include a trihalomethyltriazine compound, a benzyldimethylketal compound, an α-hydroxyketone compound, an α-aminoketone compound, a phosphin oxide compound, a metallocene compound, an oxime compound, a triarylimidazole dimer, a benzothiazole compound, a benzophenone compound, an acetophenone compound and a derivative thereof, a cyclopentadiene-benzene-iron complex and a salt thereof, a halomethyloxadiazole compound, and a 3-aryl-substituted cumarine compound. Preferable examples thereof include at least one compound selected from the group consisting of the α-aminoketone compound, the phosphin oxide compound, the metallocene compound, the oxime compound, and the triarylimidazole dimer. Particularly preferable examples thereof include the oxime compound.

Examples of active halogen compounds such as halomethyl oxadiazole compounds include 2-halomethyl-5-vinyl-1,3,4-oxadiazole compounds disclosed in JP-B No. 57-6096, 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole.

Examples of the photopolymerization initiator of the trihalomethyl-s-triazine compound include a vinyl-halomethyl-s-triazine compound disclosed in JP-B No. 59-1281, and a 2-(naphtho-1-yl)-4,6-bis-halomethyl-s-triazine compound and a 4-(p-aminophenyl)-2,6-di-halomethyl-s-triazine compound disclosed in JP-A No. 53-133428.

Other examples thereof include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-napho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazin, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, and 4-(o-fluoro-p-N-chloroethylaminophenyl)-2,6-di(trichloromethyl)-s-triazine.

The photopolymerization initiator may also be one of TAZ series manufactured by Midori Kagaku Co., Ltd., such as TAZ-107, TAZ-110, TAZ-109, TAZ-140, TAZ-204, TAZ-113, TAZ-123, and TAZ-104, T series manufactured by PANCHIM Ltd., such as T-OMS, T-BMP, T-R, and T-B, IRGACURE series manufactured by Ciba Specialty Chemicals, such as IRGACURE 651, IRGACURE 184, IRGACURE 500, IRGACURE 1000, IRGACURE 149, IRGACURE 819, and IRGACURE 261, DAROCURE series manufactured by Ciba Specialty Chemicals, such as DAROCURE 1173; 4,4'-bis(diethylamino)-benzophenone, 2-(O-benzoyloxime)-1-[4-(phenylthio)phenyl]-1,2-octanedione, 2-benzyl-2-dimethylamino-4-morpholinobutylophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenyl imidazolyl dimer, and benzoin isopropyl ether.

Examples of the α-aminoketone compound include IRGACURE series manufactured by Ciba Specialty Chemicals (IRGACURE 907 or IRGACURE 369), 2-methyl-1-phenyl-2-morpholinopropane-1-on, 2-methyl-1-[4-(hexyl)phenyl]-2-morpholinopropane-1-on, and 2-ethyl-2-dimethylamino-1-(4-morpholinophenyl)-butanone-1.

Examples of the oxime compound include, however are not limited to 2-(O-benzoyloxime)-1-[4-(phenylthio)phenyl]-1,2-octanedione, 1-(4-methylsulfanyl-phenyl)-butane-1,2-butane-2-oxime-O-acetate, 1-(4-methylsulfanyl-phenyl)-butane-1-onoxime-O-acetate, hydroxyimino-(4-methylsulfanyl-phenyl)-acetic acid ethyl ester-O-acetate, hydroxyimino-(4-methylsulfanyl-phenyl)-acetic acid ethyl ester-O-benzoate.

With respect to the other initiators, preferable examples of the benzylmethylketal compound include IRGACURE 651; examples of the α-hydroxyketone compound include IRGACURE 184, IRGACURE 1173, IRGACURE 500, IRGACURE 1000, and IRGACURE 2959; examples of the α-aminoketone compound include IRGACURE 907 and IRGACURE 369; examples of the phosphine oxide compound (blend) include IRGACURE 1700, IRGACURE 149, IRGACURE 1850, IRGACURE 819, and IRGACURE 184; examples of the metallocene compound include IRGACURE 784 and IRGACURE 261 (manufactured by Ciba Specialty Chemicals), from the viewpoints of availability and stability, and the analogs and peripheral compounds for these, and the like are also preferable.

A sensitizer or a light stabilizer may be used in conjunction with the photopolymerization initiator.

Specific examples thereof include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, 2,4-diethylthioxanthone, acridone, 10-butyl-2-chloroacridone, benzil, dibenzalacetone, p-(dimethylamino)phenyl styryl ketone, p-(dimethylamino)phenyl-p-methylstyryl ketone, benzophenone, p-(dimethylamino) benzophenone (or Michler's ketone), p-(diethylamino) benzophenone, benzoanthrone, benzothiazole compounds disclosed in JP-B No. 51-48516, and TINUVIN 1130 and 400.

The composition of the invention may further contain other known photopolymerization initiator(s) as well as the aforementioned photopolymerization initiator(s).

Specific examples thereof include vicinal polyketol aldonyl compounds disclosed in U.S. Pat. No. 2,367,660, α-carbonyl compounds disclosed in U.S. Pat. Nos. 2,367,661 and 2,367,670, acyloin ether disclosed in U.S. Pat. No. 2,448,828, α-hydrocarbon-substituted aromatic acyloin compounds disclosed in U.S. Pat. No. 2,722,512, polynuclear quinone compounds disclosed in U.S. Pat. Nos. 3,046,127 and 2,951,758, a combination of triarylimidazole dimer and p-aminophenyl ketone disclosed in U.S. Pat. No. 3,549,367, and benzothiazole compounds and trihalomethyl-s-triazine compounds disclosed in JP-B No. 51-48516.

In the composition of the invention, it is preferable that the content of the photosensitive compound be determined by using a weight ratio in respects to the curing agent (C). The weight ratio (D)/(C) of the curing agent (C) and the photosensitive compound (D) is preferably 0.1 or more and less than 0.4, more preferably 0.15 or more and less than 0.4, and particularly preferably 0.2 or more and less than 0.4. In a case where the weight ratio is in the range of 0.1 or more and less than 0.4, it is possible to prevent reduction in film strength due to the very low curability.

The composition of the invention may be include at least one thermal polymerization inhibitor. Examples of the thermal polymerization inhibitor include hydroquinone, p-methoxyphenol, di-t-butyl-p-cresol, pyrogallol, t-butylcatechol, benzoquinone, 4,4'-thio bis(3-methyl-6-t-butylphenol), 2,2'-methylenebis(4-methyl-6-t-butylphenol), and 2-mercaptobenzimidazole.

Next, a photoacid generator will be described as an example of the photosensitive compound. A known photoacid generator may be used. Examples thereof include onium salts such as diazonium salts that are disclosed in S. I. Schlesinger, Photogr. Sci. Eng., 18, 387 (1974), and T. S. Bal et al., Polymer, 21, 423 (1980), ammonium salts that are disclosed in U.S. Pat. Nos. 4,069,055 and 4,069,056, and JP-A No. 03-140140, phosphonium salts that are disclosed in D. C. Necker et al., Macromolecules, 17, 2468 (1984), C. S. Wen et al., Teh, Proc. Conf Rad. Curing ASIA, p 478 Tokyo, October (1988), and U.S. Pat. Nos. 4,069,055 and 4,069,056, iodonuim salts that are disclosed in J. V. Crivello et al., Macromolecules, 10(6), 1307 (1977), Chem. & Eng. News, Nov. 28, p 31 (1988), EP No. 104,143, U.S. Pat. Nos. 339,049 and 410,201, and JP-A Nos. 02-150848 and 02-296514, sulfonium salts that are disclosed in J. V, Crivello et al., Polymer J. 17, 73 (1985), J. V. Crivello et al., J. Org, Chem., 43, 3055 (1978), W. R. Watt et al., J. Polymer Sci, Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), EP No. 370,693, U.S. Pat. No. 3,902, 114, EP Nos. 233,567, 297,443, and 297,442, U.S. Pat. Nos. 4,933,377, 410,201, 339,049, 4,760,013, 4,734,444, and 2,833,827, and DE Patent Nos. 2,904,626, 3,604,580, and 3,604,581, selenonium salts that are disclosed in J. V. Crivello et al., Macromolecules, 10(6), 1307 (1977) and J. V. Crivello et al., J. Polymer Sci., Polymer Chem. Ed., 17, 1047 (1979), and arsonium salts that are disclosed in C. S. Wen et al., Teh, Proc. Conf. Rad, Curing ASIA, p 478 Tokyo, October (1988); organic halogen compounds that are disclosed in U.S. Pat. No. 3,905,815, JP-B No. 46-4605, and JP-A Nos. 48-36281, 55-32070, 60-239736, 61-169835, 61-169837, 62-58241, 62-212401, 63-70243, and 63-298339; organic metal/organic halides that are disclosed in K. Meier et al., J. Rad. Curing, 13(4), 26 (1986), T. P. Gill et al., Inorg. Chem., 19, 3007 (1980), D. Astruc, Acc. Chem. Res., 19(12), 377 (1896), and JP-A No. 02-161445; photoacid generators having an o-nitrobenzyl type protection group that are disclosed in S. Hayase et al., J, Polymer Sci., 25, 753 (1987), E. Reichmanis et al., J, Polymer Sci., Polymer Chem. Ed., 23, 1 (1985), Q. Q. Zhu et al., J. Photochem., 36, 85, 39, 317 (1987), B, Amit et al., Tetrahedron Lett., (24), 2205 (1973), D. H. R. Barton et al., J. Chem Soc., 3571 (1965), P. M. Collins et al., J. Chem. SoC., PerkinI, 1695 (1975), M. Rudinstein et al., Tetrahedron Lett., (17), 1445 (1975), J. W Walker et al., J. Am, Chem. Soc., 110, 7170 (1988), S. C, Busman et al., J. Imaging Technol., 11(4), 191 (1985), H. M. Houlihan et al., Macromolecules, 21, 2001 (1988), P. M. Collins et al., J. Chem, Soc., Chem. Commun., 532 (1972), S. Hayase et al., Macromolecules, 18, 1799 (1985), E. Reichmanis et al., J. Electrochem. Soc., Solid State Sci. Technol., 130(6), F. M. Houlihan et al., Macromolecules, 21, 2001 (1988), EP Nos. 0290,750, 046, 083, 156, 535, 271,851, and 0,388,343, U.S. Pat. Nos. 3,901,710 and 4,181,531, and JP-A Nos. 60-198538 and 53-133022;

compounds that are decomposed by light to generate a sulfonic acid and are represented by iminosulfonates and the like disclosed in M. TUNOOKA. et al., Polymer Preprints Japan, 35(8), G. Berner et al., J. Rad. Curing, 13(4), W. J. Mijs et al., Coating Technol., 55(697), 45 (1983), Akzo, H. Adachi et al., Polymer Preprints, Japan, 37(3), EP Nos. 0199,672, 84515, 199,672, 044,115, and 0101,122, U.S. Pat. Nos. 4,618,564, 4,371,605, and 4,431,774, and JP-A Nos. 64-18143, 02-245756, and 04-365048; and disulfone compounds that are disclosed in JP-A No. 61-166544. Compounds that are represented by the following formula (IV) may be preferably used.

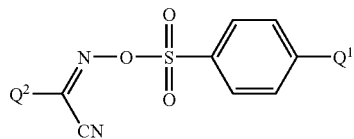

Formula (IV)

wherein $Q^1$ is an alkyl group having 1 to 3 carbon atoms and $Q^2$ is a phenyl group that is substituted with an alkyl group having 1 to 3 carbon atoms or a phenyl group that is substituted with an alkoxyl group having 1 to 3 carbon atoms.

In formula (IV), examples of the alkyl group that is represented by $Q^1$ and has 1 to 3 carbon atoms include a methyl group, an ethyl group, and a propyl group. Examples of the phenyl group that is represented by $Q^2$ and is substituted with the alkyl group having 1 to 3 carbon atoms include an o-isopropyl phenyl group, and examples of the phenyl group that is substituted with the alkoxyl group having 1 to 3 carbon atoms include a p-methoxyphenyl group, a p-ethoxyphenyl group, and a p-propoxyphenyl group.

(Solvent (E))

The composition of the invention generally contains solvent. The type of the solvent that is applied to the composition of the invention is not limited as long as it satisfies the solubility and the application property of the composition. It is preferable to select the type of the solvent in consideration of, especially, the solubility, the application property and safety of each of the dye(s) and the binder(s).

Preferable examples of the solvent that is capable of being used to prepare the composition of the invention include esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, and ethyl ethoxyacetate; methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate; methyl pyruvate, ethyl pyruvate, propyl pyruvate, methyl acetoacetate, ethyl acetoacetate, methyl 2-oxobutanate, and ethyl 2-oxobutanate;

ethers, for example, diethylene glycol dimethyl ether, tetrahydrofuran, ethylene glycol monomethyl ether, ethylene glycol monoethyl ether, methylcellosolve acetate, ethylcellosolve acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, and propylene glycol propyl ether acetate;

ketones, for example, methyl ethyl ketone, cyclohexanone, 2-heptanone, and 3-heptanone; and aromatic hydrocarbons, for example, toluene and xylene.

Among them, more preferable examples of the solvent that is used in the invention include methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, or propylene glycol methyl ether acetate.

The composition of the invention may contain various types of additives, for example, a filler, a polymer compound other than those mentioned above, a surfactant, an adhesion accelerating agent, an antioxidant, a ultraviolet ray absorbent, and an agglomeration preventive agent, if necessary.

Specific examples of the additives include the filler such as glass and alumina; the polymer compound other than binder resins such as polyvinyl alcohol, polyacrylic acid, polyethylene glycol monoalkyl ether, and polyfluoroalkyl acrylate; the surfactant such as nonionic, cationic, or anionic surfactants; the adhesion accelerating agent such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane; the antioxidant such as 2,2-thiobis(4-methyl-6-t-butylphenol) and 2,6-di-t-butylphenol; the ultraviolet ray absorbent such as 2-(3-t-butyl-5-methyl-2-hydroxyphenyl)-5-chlorobenzotriazole and alkoxybenzophenone; and the agglomeration preventing agent such as sodium polyacrylate.

The composition of the invention may further contain an organic carboxylic acid, which preferably has a low molecular weight of 1,000 or less, to accelerate dissolution of non-pattern portions in alkali and further improve the developing property of the composition. Specific examples thereof include aliphatic monocarboxylic acid, such as formic acid, acetic acid, propionic acid, butyric acid, valeric acid, pivalic acid, caproic acid, diethylacetic acid, enanthic acid, and caprylic acid; aliphatic dicarboxylic acid, such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, and citraconic acid; aliphatic tricarboxylic acid, such as tricarballylic acid, aconitic acid, and camphoronic acid; aromatic monocarboxylic acid, such as benzoic acid, toluic acid, cuminic acid, hemellitic acid, and mesitylenic acid; aromatic polycarboxylic acid, such as phthalic acid, isophthalic acid, terephthalic acid, trimellitic acid, trimesic acid, mellophanic acid, and pyromellitic acid; and other carboxylic acid, such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid, and umbellic acid.

<Positive Type Dye-Containing Curable Composition>

Next, the additives such as the binder (B), the curing agent (C), the photosensitive compound (D), and the solvent (E) which are preferably used in a case where the composition of the invention is a positive type dye-containing curable composition will be described in detail. In a case where the composition of the invention is the positive type dye-containing curable composition, the contents of the organic-solvent-soluble dye (A) and the curing agent (C) in respects to the total solid content and the desired weight ratio of the binder (B) or the photosensitive compound (D) in respects to the curing agent (C) are as described above.

(Binder (B))

The binder which are capable of being used in a case where the composition of the invention is the positive type composition will be described. The binder used in the invention is not limited as long as it is soluble in alkali. However, it is preferable to select the binder in consideration of heat resistance, developability, and availability. Examples thereof include a novolak resin and a vinyl phenol resin. In the case of the negative type curable composition, the same binder may be used.

(Curing Agent (C))

The curing agent which is used in the case where the composition of the invention is the positive type composition will be described. In the case where the composition of the invention is the positive type composition, preferable examples of the curing agent include the melamine compound and the compound containing the methylol group which are used as the cross-linking agent in the case of the negative type dye-containing curable composition. In this case, the content of the curing agent in the composition of the invention in respects to the total solid content is 20% by mass or more and 55% by mass or less.

(Photosensitive Compound (D))

The photosensitive compound which is used in the case where the composition of the invention is the positive type composition will be described. Preferable examples of the photosensitive compound include a naphthoquinone diazide compound. Examples of the naphthoquinone diazide compound include o-benzoquinone diazide sulfonic acid ester or o-naphthoquinone diazide sulfonic acid ester. Specific examples thereof include o-naphthoquinone diazide-5-sulfonic acid ester, o-naphthoquinone diazide-5-sulfonic acid amide, o-naphthoquinone diazide-4-sulfonic acid ester, and o-naphthoquinone diazide-4-sulfonic acid amide. The ester or amide compounds may be produced by means of a known method using phenol compounds and the like that are represented by the formula (I) disclosed in, for example, JP-A Nos. 02-84650 and 03-49437.

The photoacid generator may also be used. The photoacid generator is not limited as long as it is a compound that generates acids by using exposure to light. Examples thereof include oxime compounds such as α-(4-toluenesulfonyloxyimino)phenylacetonitrile, various types of iodonium compounds, sulfonium compounds, and trihalomethyltriazine compounds. Furthermore, the photoacid generators that are used in the case of the negative type curable composition may be used.

(Solvent (E))

The solvent that is capable of being used in the case where the composition of the invention is the positive type composition is appropriately selected according to the solubility of the organic-solvent-soluble dye, the binder, the curing agent, the photosensitive compound, and the additive, particularly, the solubility of the organic-solvent-soluble dye. Furthermore, the solvent that is used in the case where the composition of the invention is the negative type curable composition may be used.

(Additive)

Like the case where the composition of the invention is the negative type composition, in the case where the composition of the invention is the positive type composition, the composition may further contain various types of additives, for example, a filler, a polymer compound other than those mentioned above, a surfactant, an adhesion accelerating agent, an antioxidant, a ultraviolet ray absorbent, or an agglomeration preventive agent, if necessary.

<<Color Filter>>

The composition of the invention is applied onto a support by a coating method such as a rotation coating method, a flow coating method, or a roller coating method to form a radiation-sensitive composition layer. The layer is exposed to light through a predetermined mask pattern, and developed with a developing solution to form a colored pattern. Thereby, the color filter of the invention is produced. The method for producing the color filter according to the invention may further include a curing step, in which the resist pattern is heated and/or exposed to light to be cured, if necessary.

Ultraviolet rays such as g-rays, h-rays or i-rays are preferably used as the radiation.

Examples of the material of the support include soda glass, PYREX (Trade Mark) glass, quartz glass, and those having a transparent conductive film attached to these glass layers, which may be used in liquid crystal display devices, photoelectric transfer device substrates used in image pickup devices, such as silicon substrates, and complementary metal oxide film semiconductors (CMOS). In some cases, the supports may have a black stripe that is used to optically separate pixels from each other.

In order to improve the adhesion between the support and a layer adjacent to the support, to prevent diffusion of a substance, or to flatten the substrate surface, an undercoat layer may be formed on the support, if necessary.

The developing solution that is used to produce the color filter of the invention may be the same as that used in the case where a pattern is formed by using a typical curable composition. Specifically, a combination of various types of organic solvents or an alkaline aqueous solution may be used.

The above-mentioned organic solvent may be included the solvent that is used to regulate the composition of the invention.

The alkaline aqueous solution is preferably a solution in which an alkaline compound such as sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, or 1,8-diazabicyclo[5.4.0]-7-undecene is dissolved in water. The concentration of the alkaline compound(s) in the alkaline solution is generally 0.001 to 10% by mass, and preferably 0.01 to 1% by mass. When the developing solution is such an alkaline aqueous solution, the color filter is, in general, washed with water after the development.

The thickness of the color filter of the invention is preferably 1.2 μm or less, more preferably 1.0 μm, and particularly preferably 0.8 μm or less. Since the color filter that is formed by using the composition of the invention has excellent image concentration and curability, desirable effects may be obtained even though the color filter is as thin as 1.2 μm or less.

The color filter of the invention may be used in liquid crystal display devices and solid-state image pickup devices such as CCDs, and is preferably used in CCD elements and CMOS elements which have a high degree of resolution exceeding 1,000,000 pixels. The color filter of the invention may be used as a color filter interposed between the light-receiving unit of each of the pixels of CCDs and a microlens used to condense light.

The invention is described in detail below while referring to examples. However, the invention is not limited thereto. In the examples, the terms "%" and "part" mean "% by mass" and "part by mass", unless otherwise indicated.

EXAMPLE 1

1) Preparation of Resist Solution

A resist solution was prepared by mixing and dissolving the following composition.

| [Composition of resist solution] | |
|---|---|
| propylene glycol monomethyl ether acetate (PGMEA) | 19.20 parts |
| ethyl lactate | 36.67 parts |
| binder | 30.51 parts |
| [41% PGMEA solution of benzyl methacrylate/methacrylic acid/ 2-hydroxyethyl methacrylate copolymer (molar rate = 60:20:20)] | |
| dipentaerythritol hexaacrylate (Curing agent) | 12.20 parts |
| polymerization inhibitor (p-methoxyphenol) | 0.0061 parts |
| fluorinated surfactant (trade name: F-475, manufactured by Dainippon Ink and Chemicals Inc.) | 0.83 parts |
| photopolymerization initiator (trade name: TAZ-107 (trihalomethyltriazine photopolymerization initiator), manufactured by Midori Kagaku Co., Ltd.) | 0.586 parts |

2) Preparation of Glass Substrate Attached to Undercoat Layer

After the glass substrate (trade name: CORNING 1737, manufactured by Corning, Inc.) was washed with the 1% NaOH solution by means of an ultrasonic wave, rinsing using water and dehydration baking (200° C./30 min) were performed.

Subsequently, the resist solution of the above paragraph 1) was applied on the washed glass substrate by using the spin coater to a thickness of 2 μm and heated and dried at 220° C. for 1 hour to form a cured film, thereby producing a glass substrate to which the undercoat layer was attached.

3) Preparation of Dye-Containing Resist Solution

A dye-containing resist solution was prepared by mixing and dissolving the following compositions.

| [Composition of dye-containing resist solution] | |
|---|---|
| organic-solvent-soluble dye a (the above-mentioned compound (7)): (A) | 4.5 parts |

| [Composition of dye-containing resist solution] | |
|---|---|
| organic-solvent-soluble dye b (the above-mentioned compound (32)): (A) | 4.5 parts |
| binder: (B) (benzyl methacrylate/methacrylic acid = 70/30 (molar ratio)) | 3.0 parts |
| curing agent: (C) (dipentaerythritol hexaacrylate) | 6.0 parts |
| photosensitive compound (photopolymerization initiator): (D) (2-(O-benzoyloxime)-1-[4-(phenylthio)phenyl]-1,2-octanedione) | 2.0 parts |
| solvent: (E) (cyclohexanone) | 80 parts |
| p-methoxyphenol: (polymerization inhibitor) | 0.01 parts |

4) Exposure and Development of Dye-Containing Resist (Image Formation)

The dye resist solution obtained in the above paragraph 3) was applied on the undercoating layer of the glass substrate having an undercoating layer obtained in the above paragraph 2) to a thickness of 1.0 μm by using a spin coater, and prebaked at 120° C. for 120 sec.

Next, by using an exposing apparatus, the coated film was irradiated at an amount of exposure of 800 mJ/cm$^2$ with a wavelength of 365 nm through a mask having a thickness of 20 μm. After the exposure, the coated film was developed under the conditions of 26° C. and 60 sec by using a developing solution (trade name: CD-2000; concentration: 60%, manufactured by FUJIFILM Arch Co., Ltd.). Thereinafter, the coated film was rinsed for 20 sec with running water, which was then followed by spray drying to form an image.

In this example, the image formation was verified in the normal way by using an optical microscope and SEM photographic observation.

Additionally, average transmission was measured in the range of 400 to 550 nm by using MCPD-1000 manufactured by Otsuka Electronics Co., Ltd. In respects to the average transmission in the range of 400 to 550 nm, a smaller one had a color concentration that was higher than that of a larger one in a red color filter. In the case where the average transmission in the above-mentioned range was 7% or less, the desired color concentration was considered to be ensured.

Further, the "developability of unexposed parts" and the "percentage of film remaining in exposed parts" were measured with a chromoscope (trade name: MCPD-1000, manufactured by Otsuka Electronics Co., Ltd.).

The term "developability of unexposed parts" refers to the rate of change in absorbance for the film before and after the development, and for a light sensitive negative composition, the greater the value, the better. Further, the term "percentage of film remaining in exposed parts" refers to the ratio of maintained light absorbance for the film before and after development, and the greater the value the better.

The high developability of the unexposed part and the high percentage of film remaining in the exposed part mean excellent rectangular pattern formability. Therefore, the rectangular pattern formability was evaluated based on the following criteria. The results are described in the following Table 1.

○: The pattern was rectangular without thinning the film.
x: The film was made slim or the film had a round top.

EXAMPLES 2 TO 8

The procedure of example 1 was repeated to form an image and the evaluation was performed by using the same procedure as example 1, except that during the preparation of the 3) dye-containing resist solution of example 1, the compounds shown in the following Table 1 were used instead of the organic-solvent-soluble dyes, the contents of the organic-solvent-soluble dye (A), the binder (B), the curing agent (C) (dipentaerithritolhexaacrylate), and the photosensitive compound (D) (2-(O-benzoyloxime)-1-[4-(phenylthio)phenyl]-1,2-octanedione) were changed to be the same as those of Table 1, and the film thickness of the image was changed to be the same as that of Table 1. The results are described in the following Table 1.

In Table 1, the content of the dye in respects to the total solid content of the composition was the sum total of the content of the dye a in respects to the total solid content and the content of the dye b in respects to the total solid content.

COMPARATIVE EXAMPLES 1 TO 4

The procedure of example 1 was repeated to form an image and the evaluation was performed by using the same procedure as example 1, except that during the preparation of the 3) dye-containing resist solution of example 1, the compounds shown in the following Table 1 were used instead of the organic-solvent-soluble dyes, the contents of the organic-solvent-soluble dye (A), the binder (B), the curing agent (C) (dipentaerithritolhexaacrylate), and the photosensitive compound (D) (2-(O-benzoyloxime)-1-[4-(phenylthio)phenyl]-1,2-octanedione) were changed to be the same as those of Table 1, and the film thickness of the image was changed to be the same as that of Table 1. The results are described in the following Table 1.

In Table 1, the content of the dye in respects to the total solid content of the composition was the sum total of the content of the dye a in respects to the total solid content and the content of the dye b in respects to the total solid content.

As shown in Table 1, since the dye-containing curable composition in which the content of the organic-solvent-soluble dye (A) in respects of the total solid content was 45% by mass or more and the content of the curing agent (C) in respects of the total solid content was 20% by mass or more and 55% by mass or less was used in the invention, the color concentration was high, the developability of the unexposed parts and the percentage of film remaining in the exposed parts were improved, and the rectangular pattern formability was excellent.

As apparent from the result shown in Table 1, it was difficult to simultaneously satisfy a plurality of performances of Table 1 in terms of the conditions of comparative example. Specifically, in comparative example 1 where the content of the organic-solvent-soluble dye (A) was low, the color concentration was reduced, causing the reduced percentage of film remaining in the exposed parts. Additionally, in comparative examples 2 to 4 where the content of the curing agent (C) was low, the percentage of film remaining in the exposed parts and the rectangular pattern formability were significantly reduced. Thus, it could be seen that the compositions of the examples were better than those of the comparative examples.

EXAMPLE 9

The procedure of example 1 was repeated to form a green image and evaluation was performed by using the same procedure as example 1, except that during the preparation of the 3) dye-containing resist solution of example 1, the composition of the dye-containing resist solution was changed so that the solution had the composition ratio shown in Table 2. The results are described in the following Table 2.

TABLE 1

| | Organic-solvent-soluble dye (A) | | Curing agent (C) Content | Binder (B) Content | Photo-sensitive compound (D) Content | Thickness (μm) | Average transmission in the range of 400 to 550 nm | Developability of unexposed parts | Percentage of film remaining in exposed parts | Rectangular pattern formability |
|---|---|---|---|---|---|---|---|---|---|---|
| | a | b | Content | | | | | | | |
| Example 1 | Compound (7) | Compound (32) | 45.0% | 30.0% | 15.0% | 10.0% | 1.00 | 5.0% | 100 | 98 | ◯ |
| Example 2 | Compound (2) | Compound (13) | 50.0% | 36.0% | 0.5% | 13.5% | 0.90 | 4.3% | 99 | 100 | ◯ |
| Example 3 | Compound (3) | Compound (47) | 70.0% | 22.0% | 0.0% | 8.0% | 1.00 | 3.8% | 100 | 99 | ◯ |
| Example 4 | Compound (7) | Compound (56) | 60.0% | 25.0% | 2.0% | 13.0% | 0.90 | 4.3% | 100 | 98 | ◯ |
| Example 5 | Compound (2) | Compound (61) | 48.0% | 40.0% | 0.1% | 11.9% | 0.80 | 4.8% | 97 | 100 | ◯ |
| Example 6 | Compound (3) | Compound (47) | 45.0% | 47.0% | 0.0% | 8.0% | 1.00 | 5.2% | 100 | 99 | ◯ |
| Example 7 | Compound (8) | Compound (13) | 75.0% | 22.0% | 0.0% | 3.0% | 0.70 | 4.9% | 100 | 99 | ◯ |
| Example 8 | Compound (2) | Compound (55) | 55.0% | 28.0% | 0.5% | 16.5% | 0.90 | 4.5% | 98 | 100 | ◯ |
| Comparative example 1 | Compound (7) | Compound (32) | 40.0% | 30.0% | 25.0% | 5.0% | 0.70 | 7.3% | 100 | 61 | X |
| Comparative example 2 | Compound (7) | Compound (32) | 60.0% | 15.0% | 7.0% | 18.0% | 0.08 | 4.3% | 99 | 55 | X |
| Comparative example 3 | Compound (3) | Compound (47) | 50.0% | 18.0% | 18.0% | 14.0% | 1.00 | 4.9% | 99 | 76 | X |
| Comparative example 4 | Compound (3) | Compound (47) | 53.0% | 17.0% | 0.0% | 30.0% | 0.70 | 7.2% | 78 | 59 | X |

* Content (% by mass) was based on the total solid content in Table 1

| | |
|---|---|
| organic-solvent-soluble dye a (the above-mentioned compound (13)): (A) | 4.0 parts |
| organic-solvent-soluble dye b (the following compound (75)): (A) | 5.0 parts |
| binder: (B) (benzyl methacrylate/methacrylic acid = 70/30 (molar ratio)) | 3.0 parts |
| curing agent: (C) (dipentaerythritol hexaacrylate) | 6.0 parts |
| photosensitive compound (photopolymerization initiator): (D) (2-(O-benzoyloxime)-1-[4-(phenylthio)phenyl]-1,2-octanedione) | 2.0 parts |
| solvent: (E) (cyclohexanone) | 80 parts |
| p-methoxyphenol: (polymerization inhibitor) | 0.01 parts |

The compound 75 that was used as the organic-solvent-soluble dye will be described.

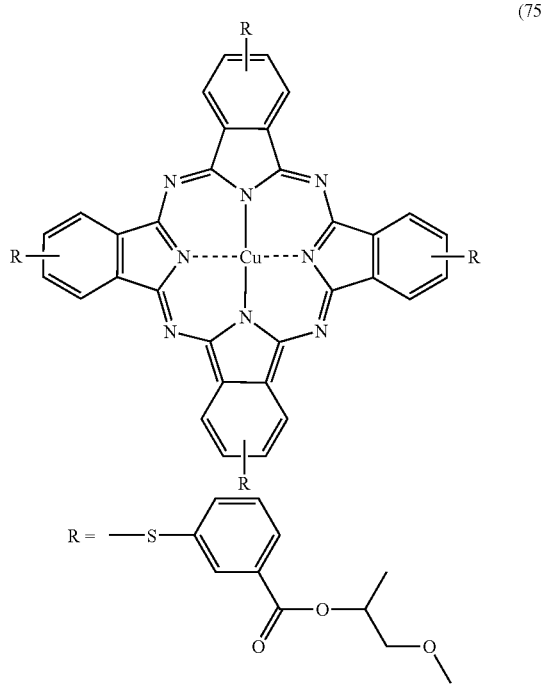

(75)

Additionally, average transmission was measured in the range of 400 to 470 nm and 630 to 700 nm by using MCPD-1000 manufactured by Otsuka Electronics Co., Ltd. In respects to the average transmission in the range of 400 to 470 nm and 630 to 700 nm, a smaller one had a color concentration that was higher than that of a larger one in a green color filter. In the case where the average transmission in the above-mentioned range was 7% or less, the desired color concentration was considered to be ensured.

EXAMPLES 10 TO 12

The procedure of example 9 was repeated to form an image and the evaluation was performed by using the same procedure as example 9, except that the compound shown in the following Table 2 was used instead of the organic-solvent-soluble dye of example 9, the contents of the organic-solvent-soluble dye (A), the binder (B), the curing agent (C) (dipentaerithritolhexaacrylate), and the photosensitive compound (D) (2-(O-benzoyloxime)-1-[4-(phenylthio)phenyl]-1,2-octanedione) were changed to be the same as those of Table 2, and the film thickness of the image was changed to be the same as that of Table 2. The results are described in the following Table 2.

In Table 2, the content of the dye in respects to the total solid content of the composition was the sum total of the content of the dye a in respects to the total solid content and the content of the dye b in respects to the total solid content.

COMPARATIVE EXAMPLES 5 to 8

The procedure of example 9 was repeated to form an image and the evaluation was performed by using the same procedure as example 9, except that the compound shown in the following Table 2 was used instead of the organic-solvent-soluble dye of example 9, the contents of the organic-solvent-soluble dye (A), the binder (B), the curing agent (C) (dipentaerithritolhexaacrylate), and the photosensitive compound (D) (2-(O-benzoyloxime)-1-[4-(phenylthio)phenyl]-1,2-octanedione) were changed to be the same as those of Table 2, and the film thickness of the image was changed to be the same as that of Table 2. The results are described in the following Table 2. In Table 2, the content of the dye in respects to the total solid content of the composition was the sum total of the content of the dye a in respects to the total solid content and the content of the dye b in respects to the total solid content.

TABLE 2

| | Organic-solvent-soluble dye (A) | | Curing agent (C) | Binder (B) | Photo-sensitive compound (D) | Thick-ness | Average transmission in the range of 400 to 470 | Average transmission in the range of 630 to 700 | Develop-ability of unexposed | Percentage of film remaining in exposed | Rect-angular pattern form- |
|---|---|---|---|---|---|---|---|---|---|---|---|
| | a | b | Content | Content | Content | Content | (μm) | nm | nm | parts | parts | ability |
| Example 9 | Compound (13) | Compound (75) | 45.0% | 30.0% | 15.0% | 10.0% | 1.00 | 6.0% | 5.2% | 100 | 98 | ○ |
| Example 10 | Compound (13) | Compound (75) | 60.0% | 25.0% | 2.0% | 13.0% | 0.70 | 5.8% | 4.9% | 100 | 100 | ○ |
| Example 11 | Compound (13) | Compound (75) | 50.0% | 36.0% | 0.5% | 13.5% | 0.90 | 4.3% | 5.3% | 100 | 97 | ○ |
| Example 12 | Compound (13) | Compound (75) | 75.0% | 22.0% | 0.0% | 3.0% | 0.80 | 5.5% | 4.9% | 98 | 100 | ○ |

TABLE 2-continued

|  | Organic-solvent-soluble dye (A) | | Curing agent (C) | Binder (B) | Photo-sensitive compound (D) | Thick-ness | Average transmission in the range of 400 to 470 | Average transmission in the range of 630 to 700 | Develop-ability of unexposed | Percentage of film remaining in exposed | Rect-angular pattern form- |
|---|---|---|---|---|---|---|---|---|---|---|---|
|  | a | b | Content | Content | Content | Content | (μm) | nm | nm | parts | parts | ability |
| Comparative example 5 | Compound (13) | Compound (75) | 37.0% | 40.0% | 0.1% | 22.9% | 0.80 | 7.9% | 8.1% | 52 | 71 | X |
| Comparative example 6 | Compound (13) | Compound (75) | 60.0% | 15.0% | 7.0% | 18.0% | 0.90 | 4.3% | 5.2% | 98 | 49 | X |
| Comparative example 7 | Compound (9) | Compound (75) | 50.0% | 18.0% | 18.0% | 14.0% | 1.00 | 8.3% | 5.0% | 98 | 56 | X |
| Comparative example 8 | Compound (9) | Compound (75) | 53.0% | 17.0% | 0.0% | 30.0% | 0.70 | 7.8% | 7.2% | 98 | 63 | X |

*Content (% by mass) was based on the total solid content in Table 2

As apparent from the result shown in Table 2, it was difficult to simultaneously satisfy a plurality of performances of Table 2 in terms of the conditions of comparative example. However, in examples 9 to 12, the color concentration was high, the developability of the unexposed parts and the percentage of film remaining in the exposed parts were improved, and the rectangular pattern formability was excellent. Thus, it could be seen that examples of the invention were better than comparative examples.

EXAMPLE 13

The procedure of example 1 was repeated to form a blue image and evaluation was performed by using the same procedure as example 1, except that during the preparation of the 3) dye-containing resist solution of example 1, the composition of the dye-containing resist solution was changed so that the solution had the following composition ratio. The results are described in the following Table 3.
[Composition]

| | |
|---|---|
| organic-solvent-soluble dye a (the above-mentioned compound (13)): (A) | 3.0 parts |
| organic-solvent-soluble dye b (the above-mentioned compound (75)): (A) | 6.0 parts |
| binder: (B) (benzyl methacrylate/methacrylic acid = 70/30 (molar ratio)) | 3.0 parts |
| curing agent: (C) (dipentaerithritolhexaacrylate) | 6.0 parts |
| photosensitive compound (photopolymerization initiator): (D) (2-(O-benzoyloxime)-1-[4-(phenylthio)phenyl]-1,2-octanedione) | 2.0 parts |
| solvent: (E) (cyclohexanone) | 80 parts |
| p-methoxyphenol: (polymerization inhibitor) | 0.01 parts |

Additionally, average transmission was measured in the range of 550 to 700 nm by using MCPD-1000 manufactured by Otsuka Electronics Co., Ltd. In respects to the average transmission in the range of 550 to 700 nm, a smaller one had a color concentration that was higher than that of a larger one in a blue color filter. In the case where the average transmission in the above-mentioned range was 7% or less, the desired color concentration was considered to be ensured.

EXAMPLES 14 TO 16

The procedure of example 13 was repeated to form an image and the evaluation was performed by using the same procedure as example 13, except that the compound shown in the following Table 3 was used instead of the organic-solvent-soluble dye of example 13, the contents of the organic-solvent-soluble dye (A), the binder (B), the curing agent (C) (dipentaerithritolhexaacrylate), and the photosensitive compound (D) (2-(O-benzoyloxime)-1-[4-(phenylthio)phenyl]-1,2-octanedione) were changed to be the same as those of Table 3, and the film thickness was changed to be the same as that of Table 3. The results are described in the following Table 3. In Table 3, the content of the dye in respects to the total solid content of the composition was the sum total of the content of the dye a in respects to the total solid content and the content of the dye b in respects to the total solid content.

COMPARATIVE EXAMPLES 9 TO 12

The procedure of example 13 was repeated to form an image and the evaluation was performed by using the same procedure as example 13, except that during the preparation of the resist solution containing the organic-solvent-soluble dye of example 13, the compounds shown in the following Table 3 were used instead of the organic-solvent-soluble dyes, the contents of the organic-solvent-soluble dye (A), the binder (B), the curing agent (C) (dipentaerithritolhexaacrylate), and the photosensitive compound (D) (2-(O-benzoyloxime)-1-[4-(phenylthio)phenyl]-1,2-octanedione) were changed to be the same as those of Table 3, and the film thickness was changed to be the same as that of Table 3. The results are described in the following Table 3. In Table 3, the content of the dye in respects to the total solid content of the composition was the sum total of the content of the dye a in respects to the total solid content and the content of the dye b in respects to the total solid content.

TABLE 3

| | Organic-solvent-soluble dye (A) | | | Curing agent (C) | Binder (B) | Photo-sensitive compound (D) | Thickness | Average transmission in the range of 550 to | Developability of unexposed | Percentage of film remaining in | Rectangular pattern |
|---|---|---|---|---|---|---|---|---|---|---|---|
| | a | b | Content | Content | Content | Content | (μm) | 700 nm | parts | exposed parts | formability |
| Example 13 | Compound (66) | Compound (75) | 45.0% | 30.0% | 15.0% | 10.0% | 1.00 | 5.0% | 100 | 100 | ○ |
| Example 14 | Compound (66) | Compound (75) | 60.0% | 25.0% | 2.0% | 13.0% | 0.70 | 4.5% | 99 | 100 | ○ |
| Example 15 | Compound (69) | Compound (75) | 50.0% | 36.0% | 0.5% | 13.5% | 0.90 | 4.0% | 100 | 98 | ○ |
| Example 16 | Compound (69) | Compound (75) | 75.0% | 22.0% | 0.0% | 3.0% | 0.80 | 3.7% | 98 | 100 | ○ |
| Comparative example 9 | Compound (66) | Compound (75) | 37.0% | 40.0% | 0.1% | 22.9% | 0.80 | 7.8% | 68 | 82 | X |
| Comparative example 10 | Compound (66) | Compound (75) | 60.0% | 15.0% | 7.0% | 18.0% | 0.90 | 5.2% | 98 | 65 | X |
| Comparative example 11 | Compound (70) | Compound (75) | 50.0% | 18.0% | 18.0% | 14.0% | 1.00 | 5.1% | 98 | 59 | X |
| Comparative example 12 | Compound (70) | Compound (75) | 53.0% | 17.0% | 0.0% | 30.0% | 0.70 | 7.2% | 98 | 48 | X |

*Content (% by mass) was based on the total solid content in Table 3

As apparent from the result shown in Table 3, it was difficult to simultaneously satisfy a plurality of performances of Table 3 in terms of the conditions of the comparative example. However, in comparative examples 13 to 16, the color concentration was high, the developability of the unexposed parts and the percentage of film remaining in the exposed parts were also improved, and the rectangular pattern formability was excellent. Thus, it could be seen that examples of the invention were better than the comparative examples.

EXAMPLE 17

The procedure of example 1 was repeated to form an image and evaluation was performed by using the same procedure as example 1, except that during the preparation of the 3) dye-containing resist solution of example 1, the positive type colored photosensitive resin composition A prepared by using the following method was used instead of the dye-containing resist solution, the film thickness was controlled to 0.9 μm during the controlling of the film thickness in paragraph 4) of example 1, and heating (postbaking) was performed at 120° C. for 90 sec after exposure. The results are described in Table 4.

| [Preparation of positive type curable composition A] | |
|---|---|
| organic-solvent-soluble dye a (the above-mentioned compound (7)): (A) | 22.5 parts |
| organic-solvent-soluble dye b (the above-mentioned compound (32)): (A) | 22.5 parts |
| binder: (B) (novolak resin obtained by condensing P-cresol and formaldehyde: converted molecular weight of polystyrene of 5500) | 0.1 parts |
| curing agent: (C) (hexamethoxy methylol melamine) | 25.5 parts |
| photosensitive compound a: (D) (ester compounds of 2,3,4-trihydroxybenzophenone and o-naphthoquinone diazide-5-sulfonyl chloride; esterification ratio: 80 mol %; quinone diazide compound) | 14.4 parts |
| photosensitive compound b : (D) (esters of [4-(7,8-dihydroxy-2,4,4-trimethyl-2-chromanyl)pyrogallol] and o-naphthoquinone diazide-5-sulfonic acid) | 15.0 parts |
| solvent a: (E) (ethyl lactate) | 100.0 parts |
| solvent b: (E) (cyclohexanone) | 110.0 parts |

EXAMPLE 18

The procedure of example 17 was repeated to form an image and the evaluation was performed by using the same procedure as example 17, except that the compound shown in the following Table 2 was used instead of the organic-solvent-soluble dye of example 17, the contents of the organic-solvent-soluble dye (A), the binder (B), the curing agent (C), and the photosensitive compound (D) were changed to be the same as those of Table 4, and the film thickness was changed to be the same as that of Table 4. The results are described in the following Table 4. In Table 4, the contents of the dye and the photosensitive compound in respects to the total solid content were the sum total of the content of the dye a or the photosensitive compound a in respects to the total solid content and the content of the dye b or the photosensitive compound b in respects to the total solid content.

TABLE 4

| | Organic-solvent-soluble dye (A) | | | Curing agent (C) | Binder (B) | Photo-sensitive compound (D) | Thick-ness | Average transmission in the range of 400 to 550 nm | Develop-ability of exposed parts | Percentage of film remaining in unexposed parts | Rectangular pattern formability |
|---|---|---|---|---|---|---|---|---|---|---|---|
| | a | b | Content | Content | Content | Content | (μm) | | | | |
| Example 17 | Compound (7) | Compound (32) | 45.0% | 25.5% | 0.1% | 29.4% | 0.90 | 5.0% | 100 | 98 | ○ |
| Example 18 | Compound (2) | Compound (55) | 55.0% | 26.0% | 0.0% | 19.0% | 1.00 | 4.5% | 98 | 100 | ○ |

*Content (% by mass) was based on the total solid content in Table 4

Since the positive type photosensitive composition was used in examples 17 and 18, it is preferable that the developability of unexposed parts and the percentage of film remaining in exposed parts be low. From Table 4, it could be seen that the pattern having the excellent color concentration was formed in examples 17 and 18. Furthermore, the developability of the exposed parts and the percentage of film remaining in the unexposed parts were improved, and the rectangular pattern formability was excellent.

According to the dye-containing curable composition of the invention, it is possible to provide a curable composition that has high sensitivity and resolution and excellent pattern formability even though film thinning is performed at a high dye concentration. Particularly, since the content of the organic-solvent-soluble dye is significantly increased in respects to the total solid content and the content of the curing agent is limited within the predetermined range, curability is excellent, it is possible to provide the coloring agent-containing curable composition in which the developability of the portion other than the pattern portion and the percentage of film remaining in the pattern portion are improved and the pattern formability is excellent.

Furthermore, during the production process, since the above-mentioned performances do not deteriorate, it is possible to provide a coloring agent-containing curable composition having high productivity and a thin film color filter having excellent solvent resistance using the same. Additionally, it is possible to provide a simple production method having high cost performance using the dye-containing curable composition according to the invention.

What is claimed is:

1. A dye-containing curable composition comprising an organic-solvent-soluble dye (A), a binder (B), a curing agent (C), and a photosensitive compound (D), wherein the content of the organic-solvent-soluble dye (A) is 45% by mass or more based on the total solids content; the content of the curing agent (C) is 20% by mass or more and 55% by mass or less based on the total solids content; the weight ratio (C)/(B) of the binder (B) and the curing agent (C) is greater than 2.0; and the photosensitive compound (D) is an oxime compound.

2. The dye-containing curable composition of claim 1, wherein the weight ratio (D)/(C) of the curing agent (C) and the photosensitive compound (D) is 0.1 or more and less than 0.4.

3. The dye-containing curable composition of claim 2, wherein a curing process is a negative type.

4. A color filter comprising the dye-containing curable composition of claim 2.

5. A method for producing a color filter, comprising:
applying the negative type dye-containing curable composition of claim 2 on a support; exposing the composition by using a mask; and performing development to form a pattern.

6. The dye-containing curable composition of claim 1, wherein the organic-solvent-soluble dye (A) has a color value of more than 55.

7. The dye-containing curable composition of claim 6, wherein a curing process is a negative type.

8. The dye-containing curable composition of claim 1, wherein a curing process is a negative type.

9. A color filter comprising the dye-containing curable composition of claim 1.

10. A method for producing a color filter, comprising:
applying the dye-containing curable composition of claim 1 on a support;
exposing the composition by using a mask; and performing development to form a pattern.

* * * * *